(12) United States Patent
Tsuji

(10) Patent No.: US 8,796,129 B2
(45) Date of Patent: Aug. 5, 2014

(54) NONVOLATILE STORAGE DEVICE AND METHOD FOR MANUFACTURING THE SAME IN WHICH INSULATING FILM IS LOCATED BETWEEN FIRST AND SECOND IMPURITY DIFFUSION REGIONS BUT ABSENT ON FIRST IMPURITY DIFFUSION REGION

(71) Applicant: Nec Corporation, Tokyo (JP)

(72) Inventor: Yukihide Tsuji, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/688,903

(22) Filed: Nov. 29, 2012

(65) Prior Publication Data

US 2013/0084698 A1 Apr. 4, 2013

Related U.S. Application Data

(62) Division of application No. 12/518,351, filed as application No. PCT/JP2007/074024 on Dec. 13, 2007, now Pat. No. 8,344,446.

(30) Foreign Application Priority Data

Dec. 15, 2006 (JP) .................. 2006-338196

(51) Int. Cl.
| | |
|---|---|
| *H01L 21/3205* | (2006.01) |
| *H01L 21/4763* | (2006.01) |
| *H01L 29/40* | (2006.01) |
| *H01L 21/28* | (2006.01) |
| *H01L 27/115* | (2006.01) |
| *H01L 29/423* | (2006.01) |
| *H01L 29/66* | (2006.01) |
| *H01L 29/792* | (2006.01) |

(52) U.S. Cl.
CPC ........ *H01L 29/401* (2013.01); *H01L 21/28282* (2013.01); *H01L 27/11568* (2013.01); *H01L 29/4234* (2013.01); *H01L 29/66833* (2013.01); *H01L 29/792* (2013.01)
USPC 438/591; 257/326; 257/E21.21; 257/E29.309

(58) Field of Classification Search
CPC ............ H01L 21/28282; H01L 29/401; H01L 27/11568; H01L 29/4234; H01L 29/66833; H01L 29/792
USPC .............. 438/591; 257/326, E21.21, E29.309
See application file for complete search history.

(56) References Cited

U.S. PATENT DOCUMENTS 6,861,699 B2 * 3/2005 Kim .............................. 257/316

FOREIGN PATENT DOCUMENTS

| JP | S53-70682 A | 6/1978 |
|---|---|---|
| JP | S60-59779 A | 4/1985 |

(Continued)

OTHER PUBLICATIONS

Japanese Office Action for JP Application No. 2013-025458 mailed on Feb. 25, 2014 with English Translation.

*Primary Examiner* — Stephen W Smoot
*Assistant Examiner* — Vicki B Booker
(74) *Attorney, Agent, or Firm* — Sughrue Mion, PLLC

(57) ABSTRACT

Provided is an excellent nonvolatile storage device having advantageous in miniaturization and less variation in initial threshold value, and exhibiting a high writing efficiency, without an erasing failure and a retention failure. The nonvolatile storage device is characterized by including a film stack extending from between a semiconductor substrate and a gate electrode onto at least a surface of the gate electrode lying on a first impurity diffusion region side, the film stack including a charge accumulating layer and a tunnel insulating film sequentially from a gate electrode side.

3 Claims, 37 Drawing Sheets

(56) References Cited

FOREIGN PATENT DOCUMENTS

| JP | 2002-184874 A | 6/2002 |
|----|---------------|--------|
| JP | 2002-222876 A | 8/2002 |
| JP | 2003-7861 A | 1/2003 |
| JP | 2004-531084 A | 10/2004 |
| JP | 2005-517301 A | 6/2005 |
| JP | 2005-525695 A | 8/2005 |
| JP | 2007-12922 A | 1/2007 |

* cited by examiner (a)

(b)

(c)

(d)

(a)

(b)

(c)

(a)

(b)

(c)

(d)

(a)

(b)

(a)

$I_{sub} = I_{source} + I_{drain}$ (b)

NONVOLATILE STORAGE DEVICE AND METHOD FOR MANUFACTURING THE SAME IN WHICH INSULATING FILM IS LOCATED BETWEEN FIRST AND SECOND IMPURITY DIFFUSION REGIONS BUT ABSENT ON FIRST IMPURITY DIFFUSION REGION

RELATED APPLICATIONS

This is a divisional application of Ser. No. 12/518,351, filed on Jun. 9, 2009, and based upon and claims the benefit of priority from Japanese Patent Application No. 2006-338196, filed on Dec. 15, 2006, the disclosure of which is incorporated herein in its entirety by reference.

TECHNICAL FIELD

The present invention relates to a nonvolatile storage device and a method for manufacturing the same.

BACKGROUND ART

In recent years, development has been actively made of a nonvolatile storage device which does not allow data stored therein to disappear even when an external power source is turned OFF. Reduction in cell area using Floating Gate (FG) type memory and thinning of an insulating film have been the main stream of FLASH memory miniaturization up to the 0.13-μm generation. With respect to the 90-nm generation and later, however, the thinning of an insulating film has become difficult from the viewpoint of data retention properties securing and, hence, attention has been paid to trap type memory utilizing traps in an insulating film serving as a charge accumulating layer.

The trap type memory has advantages over the FG type memory in that the trap type memory allows a reduction to be made in equivalent oxide film thickness including thinning of a tunnel oxide film and has a simpler device structure than the FG type memory. The trap type memory enables writing of two bits or more per cell to be realized by utilizing charge localization properties and hence is advantageous in reducing the cell area per bit.

FIGS. 25 and 26 are top views of related trap type memory. FIG. 26 includes sectional views of the related trap type memory taken on line I-I' and line II-II' of FIG. 25.

As shown in FIG. 25, in the trap type memory, isolation regions 8 are located in predetermined regions of a semiconductor substrate to define active regions including source/drain regions 5 and 6. A plurality of gate electrodes 1 extend across active regions 5,6, while charge accumulating layer 3 is formed between each gate electrode 1 and each active region 5, 6. Gate sidewall 16 and sidewall 17 are provided on each of opposite sides of gate electrode 1.

First insulating film 2, charge accumulating layer 3, second insulating film 4 and gate electrode 1 are sequentially provided on silicon substrate 7 shown, and gate sidewall 16 and sidewall 17 are provided on each of opposite sides of these layers. Source region 5 and drain region 6 are formed in the semiconductor substrate on opposite sides across gate electrode 1. At that time, first insulating film 2, charge accumulating layer 3 and second insulating film 4 have been removed in a manner self-aligned with gate electrode 1 and, hence, the charge accumulating layer is not formed outside gate electrode 1.

FIG. 27 illustrates a method for manufacturing trap type memory having the conventional structure shown as taken along line I-I' of FIG. 26.

Initially, as shown in FIG. 27(a), a first insulating film 2 material, a charge accumulating layer 3 material, a second insulating film 4 material and gate electrode material 1 are sequentially stacked over an active region of silicon substrate 7. Thereafter, as shown in FIG. 27(b), gate electrode material 1 is patterned into a gate electrode shape by using a photolithography technique and a dry etching process. Further, exposed portions of the first insulating film 2 material, charge accumulating layer 3 material and second insulating film 4 material are removed by etching using gate electrode 1 thus patterned as a mask. Subsequently, as shown in FIG. 27(c), gate sidewall portion 16 is formed by conducting deposition of an insulating film and dry etch back. Subsequently, source region 5 and drain region 6 are formed and, finally, sidewall 17 is formed as shown in FIG. 27(d) by conducting deposition of an insulating film and dry etch back.

In the manner described above, the trap type memory having the conventional structure can be manufactured.

Since the amount of charge in charge accumulating layer 3 can be controlled by a low gate voltage, a method including injecting hot carriers generated in substrate 7 and drain electrode 6 into charge accumulating layer 3 is used as writing and erasing operations of the trap type memory controlling the amount of charge in charge accumulating layer 3. FIG. 28 includes enlarged views illustrating a region around a drain edge. As shown in FIG. 28(a), the writing operation includes injecting hot electrons generated by application of positive voltage to gate conductive layer 1 and drain electrode 6 into charge accumulating layer 3. As shown in FIG. 28(b), the erasing operation includes causing interband tunneling to occur in a drain region overlapping the gate electrode by application of negative voltage to gate conductive layer 1 and positive voltage to drain electrode 6 and then injecting holes generated at that time into charge accumulating layer 3 by the negative voltage applied to gate conductive layer 1 while accelerating (making hot) the holes by the electric fields of drain electrode 6 and substrate 7, thereby neutralizing the holes with electrons in charge accumulating layer 3.

FIG. 28(c) shows a charge amount distribution of electrons injected into the charge accumulating layer by hot electron injection. Distribution 11 has a horizontal scale matching the horizontal scale of the charge accumulating layer. A problem with the conventional structure resides in that some of the injected electrons go out of a charge accumulating region comprising insulating film 3 and hence escape into gate sidewall portion 16, sidewall 17 and the substrate as depicted by the broken line in distribution 11 without being accumulated in charge accumulating layer 3.

For this reason, the writing efficiency of injected charge lowers, so that the writing time increases. In this case, the whole of distribution 11 can be made to fall within the charge accumulating layer by expanding drain region 6 up to a central portion of a channel (toward the side immediately below the gate electrode), thereby making it possible to enhance the writing efficiency. With drain region 6 thus configured, however, an increase in floating capacitance is caused to occur by expansion of the portion of drain region 6 overlapping gate electrode 1, thereby lowering the operation speed.

With the manufacturing method for the conventional structure, in the etching process of second insulating film 4, charge accumulating layer 3 and first insulating film 2 as shown in FIG. 27(b), defects occur at edge portions of these insulating films after etching. Since such detects remain at the edge portions of the insulating films even after the formation of gate sidewall 16, an increase in leakage current and leakage of accumulated charge occur through the defects, thus causing the yield to lower.

In this case, if the gate sidewall portion is formed by thermal oxidation, the edge portions of insulating films 2, 3 and 4 are oxidized at the same time therewith, so that restoration from some of the defects are made. However, since bird's beaks are formed at the edge portions of the insulating films by the thermal oxidation, the defect density grows in the edge portions of the first insulating film, thus lowering the yield on the contrary.

To obviate the problems associated with the above-described conventional structure, Japanese Patent Laid-Open No. 2003-60096 discloses a structure in which charge accumulating layer 3 protrudes from gate electrode 1. FIG. 29 is a top view of trap type memory having the second conventional structure described in Japanese Patent Laid-Open No. 2003-60096, and FIG. 30 includes sectional views of the trap type memory having the second conventional structure taken along line I-I' and line II-II' of FIG. 29. In the case of this trap type memory, first insulating film 2, charge accumulating layer 3 and second insulating film 4 protrude to extend under sidewall 17, as shown in FIG. 29 and in the I-I' sectional view of FIG. 30.

A method for manufacturing the trap type memory having the second conventional structure will be described with reference to FIG. 31 including sectional views taken along line I-I' of FIG. 30.

Initially, as shown in FIG. 31(a), a first insulating film 2 material, a charge accumulating layer 3 material, a second insulating film 4 material and a gate electrode 1 material are sequentially stacked over an active region of silicon substrate 7. Subsequently, as shown in FIG. 31(b), the gate electrode 1 material is patterned into a gate electrode shape by using a photolithography technique and a dry etching process, and etching in the patterning is stopped at second insulating film 4. Thereafter, as shown in FIG. 31(c), gate sidewall 16 is formed by conducting deposition of an insulating film and dry etch back. Further, ion implantation through insulating films 2, 3 and 4 is conducted using the gate electrode as a mask to form source region 5 and drain region 6. Subsequently, as shown in FIG. 31(d), sidewall 17 is formed by conducting deposition of an insulating film and dry etch back. Finally, exposed portions of the second insulating film 4 material, charge accumulating layer 3 material and first insulating film 2 material are removed by etching using the gate electrode and the sidewall as a mask, thus giving the second trap type memory.

DISCLOSURE OF THE INVENTION

FIG. 32 is an enlarged view showing a region around drain region 6 of the second conventional structure. The second conventional structure has a charge accumulating region expanding even outwardly of gate sidewall portion 16 and, for this reason, the writing efficiency of accumulated charge is improved as compared with the first conventional structure. Further, since edge portions of the insulating films are not damaged by dry etching, an improvement can be made in lessening leakage of accumulated charge toward the substrate and the electrode.

However, even when the second conventional structure thus improved and its manufacturing method are used, the following problems arise.

(1) Expanding the charge accumulating layer up to the outside of gate sidewall 16 is disadvantageous in miniaturization.

(2) Since ions are implanted through insulating films 2, 3 and 4 to form source/drain regions 5 and 6 as shown in FIG. 31(c), implantation defects occur at the portions of the insulating films protruding from gate electrode 1 toward the opposite sides, thus deteriorating the charge retention properties.

(3) Because electrons for neutralizing charge-up caused by ion implantation flow into charge accumulating layer 3 through an exposed portion of charge accumulating layer 3, an increase in initial $V_T$ and deterioration in initial $V_T$ uniformity occur.

The present invention has been made in view of the foregoing problems associated with the conventional structures and the manufacturing methods thereof. Accordingly, an object of the present invention is to provide a nonvolatile storage device which has a structure advantageous in progressing miniaturization of trap type memory and is excellent in initial $V_T$ uniformity and in writing-erasing-retention properties, as well as a method of manufacturing the same.

In order to solve the foregoing problems, an exemplary aspect of the present invention relates to a nonvolatile storage device, comprising:

a semiconductor substrate;

a gate electrode provided on the semiconductor substrate;

a first impurity diffusion region and a second impurity diffusion region which are provided in the semiconductor substrate on opposite sides sandwiching the gate electrode; and a film stack extending from between the semiconductor substrate and the gate electrode onto at least a surface of the gate electrode lying on a first impurity diffusion region side and being in contact with the first impurity diffusion region, the film stack including a charge accumulating layer and a tunnel insulating film sequentially from the gate electrode side.

The exemplary aspect of the present invention also relates to a nonvolatile storage device, comprising:

a semiconductor substrate;

a plurality of line electrodes extending in a predetermined direction on the semiconductor substrate so as to be parallel with each other;

a plurality of pairs of first and second impurity diffusion regions provided in the semiconductor substrate so as to sandwich each of the line electrodes therebetween in a direction perpendicular to the predetermined direction;

a gate electrode comprising a portion of the line electrode sandwiched between the first impurity diffusion region and the second impurity diffusion region; and a film stack extending from between the semiconductor substrate and the gate electrode onto at least a surface of the gate electrode lying on a first impurity diffusion region side and being in contact with the first impurity diffusion region, the film stack including a charge accumulating layer and a tunnel insulating film sequentially from the gate electrode side.

The exemplary aspect of the present invention also relates to a nonvolatile storage device, comprising:

a semiconductor substrate;

a first gate electrode and a second gate electrode provided on the semiconductor substrate;

an impurity diffusion region A provided in the semiconductor substrate so as to be sandwiched between the first gate electrode and the second gate electrode;

an impurity diffusion region B provided in the semiconductor substrate so as to be opposed to the impurity diffusion region A and sandwich the first gate electrode;

an impurity diffusion region C provided in the semiconductor substrate so as to be opposed to the impurity diffusion region A and sandwich the second gate electrode; and a film stack (I) or (II), wherein the film stack (I) comprises:

a film stack extending from between the semiconductor substrate and the first gate electrode onto a surface of the first gate electrode lying on an impurity diffusion region A side, being in contact with the impurity diffusion region A, and including a charge accumulating layer and a tunnel insulating film sequentially from a first gate electrode side; and a film stack extending from between the semiconductor substrate and the second gate electrode onto a surface of the second gate electrode lying on an impurity diffusion region A side, being in contact with the impurity diffusion region A, and including a charge accumulating layer and a tunnel insulating film sequentially from a second gate electrode side, and the film stack (II) comprises:

a film stack extending from between the semiconductor substrate and the first gate electrode onto a surface of the first gate electrode lying on an impurity diffusion region B side, being in contact with the impurity diffusion region B, and including a charge accumulating layer and a tunnel insulating film sequentially from the first gate electrode side; and a film stack extending from between the semiconductor substrate and the second gate electrode onto a surface of the second gate electrode lying on an impurity diffusion region C side, being in contact with the impurity diffusion region C, and including a charge accumulating layer and a tunnel insulating film sequentially from the second gate electrode side.

The exemplary aspect of the present invention further relates to a method for manufacturing a nonvolatile storage device including:

a gate electrode provided on a semiconductor substrate; and a film stack extending from between the semiconductor substrate and the gate electrode onto at least a surface of the gate electrode lying on a first impurity diffusion region side and being in contact with a first impurity diffusion region, the film stack including a charge accumulating layer and a tunnel insulating film, the method comprising:

(1) preparing the semiconductor substrate;

(2) forming a sacrificed oxidation film and a dummy film on the semiconductor substrate;

(3) partially removing the sacrificed oxidation film and the dummy film to form an opening portion reaching the semiconductor substrate and then to expose the semiconductor substrate in a lower portion of the opening portion;

(4) depositing a tunnel insulating film material and a charge accumulating layer material sequentially over an entire surface;

(5) depositing a gate electrode material over an entire surface;

(6) etching back the tunnel insulating film material, the charge accumulating layer material and the gate electrode material, to leave the tunnel insulating film material, the charge accumulating layer material and the gate electrode material on each of side surfaces of the opening portion opposed to each other, thereby forming a gate electrode, and a film stack extending from between the gate electrode and the semiconductor substrate into between a side surface of the gate electrode and the side surface of the opening portion and including the tunnel insulating film and the charge accumulating layer;

(7) removing the sacrificed oxidation film and the dummy film; and (8) forming the first impurity diffusion region in the semiconductor substrate on a side of the side surface of the gate electrode formed with the film stack thereon in such manner that the first impurity diffusion region comes into contact with a portion of the film stack, and forming a second impurity diffusion region in the semiconductor substrate on a side opposed to the first impurity diffusion region and sandwiching the gate electrode.

By using the nonvolatile storage device and the manufacturing method thereof according to the present invention, it is possible to form excellent trap type memory which is advantageous in miniaturization and subject to less variation in initial threshold value, exhibits a high writing efficiency and is free from an erasing failure and a retention failure.

Figure 1:
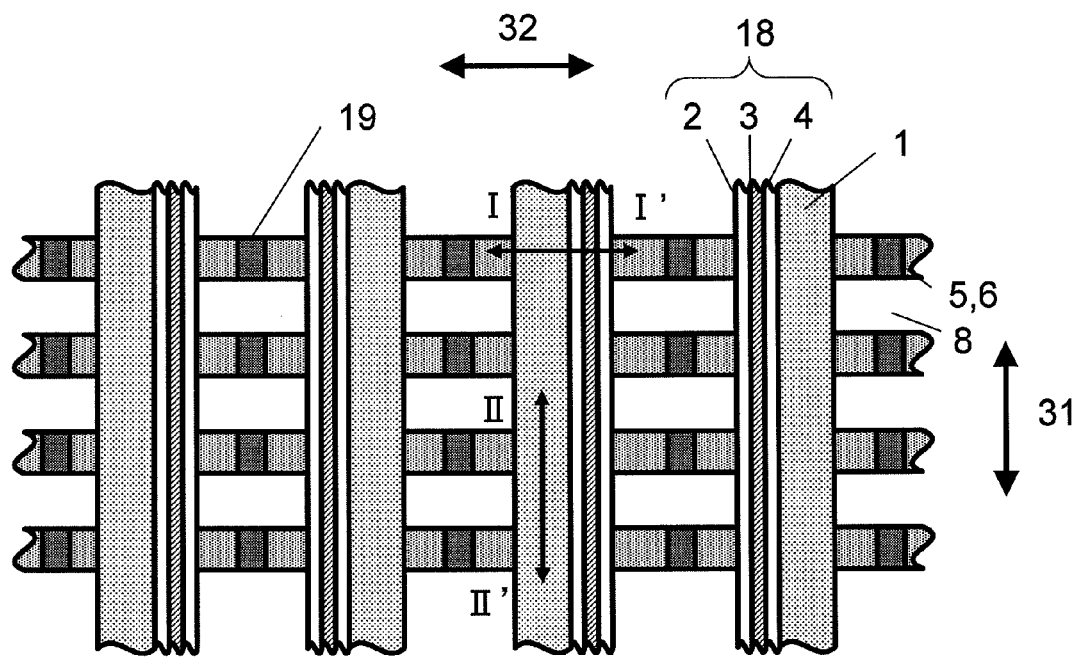
FIG. 1 is a top view illustrating one exemplary nonvolatile storage device according to the present invention.

DESCRIPTION OF SYMBOLS 1 gate electrode
2 first insulating film
3 charge accumulating layer
4 second insulating film
5 source
6 drain
7 silicon substrate
8 isolation region
9 oxide film
10 dummy film
11 writing electron distribution resulting from hot electron injection
12 defects at boundary portions of first insulating film 2, charge accumulating layer 3 and second insulating film 4
13 diffusion layer
14 insulating film including a low trap surface density or containing absolutely no trap
15 word gate
16 gate sidewall
17 sidewall
18 film stack
19 source/drain contact

BEST MODE FOR CARRYING OUT THE INVENTION

1. Nonvolatile Storage Device

FIG. 1 is a top view illustrating one exemplary nonvolatile storage device according to the present invention. As shown in FIG. 1, trap type memory (i.e., nonvolatile storage device) according to the present invention includes linear isolation regions 8 located in respective of a plurality of predetermined regions of a semiconductor substrate to isolate active regions (including a first impurity diffusion region, a second impurity diffusion region, a channel region and the like) from each other by insulation.

A plurality of line electrodes 1 are provided on the semiconductor substrate so as extend in predetermined direction 31, and each of line electrodes 1 includes side surfaces extending vertically to the semiconductor substrate. The semiconductor substrate may comprise an N-type semiconductor (i.e., N-well) or a P-type semiconductor (i.e., P-well). Film stack 18 comprising first insulating film (i.e., tunnel insulating film) 2, charge accumulating layer 3 and second insulating film (i.e., insulating film B) 4 is provided between each line electrode 1 and the semiconductor substrate. Film stack 18 is formed as extended from between line electrode 1 and the semiconductor substrate onto a side surface (i.e., the surface lying on a first impurity diffusion region side) of line electrode 1 extending vertically to the semiconductor substrate.

A pair of source/drain regions (i.e., first impurity diffusion region and second impurity diffusion region) 5 and 6 are provided in the semiconductor substrate so that each source/drain regions oppose to each other, on opposite sides sandwiching across a plurality of portions of each line electrode in direction 32 perpendicular to direction 31 in which the line electrodes extend. Either an N-type impurity or a P-type impurity may be implanted in the source/drain regions and is selected appropriately according to whether a portion of the semiconductor substrate which forms the device of the present invention is an N-well or a P-well. Each of the portions of the line electrode sandwiched between the pair of source/drain regions 5 and 6 forms gate electrode 1.

As the material of the gate electrode, a conductive material having desired electric conductivity and work function can be used. Examples of such conductive materials include: impurity-doped semiconductors such as impurity-doped polycrystalline silicon, impurity-doped polycrystalline SiGe, impurity-doped polycrystalline Ge, and impurity-doped polycrystalline SiC; metals such as Mo, W, Ta, Ti, Hf, Re, and Ru; metal nitrides such as TiN, TaN, HfN, and WN; and silicide compounds such as cobalt silicide, nickel silicide, platinum silicide, and erbium silicide. The structure of the gate electrode may comprise a single crystal film structure or a film stack structure such as a film stack of a semiconductor and a metal film, a film stack of metal films, and a film stack of a semiconductor and a silicide film.

Pairs of source/drain regions each sandwiching a respective one of the line electrodes are arranged in a line extending in direction 32 perpendicular to direction 31 in which the line electrodes extend, and a plurality of lines which such pairs of source/drain regions are arranged are provided so as to extend parallel with each other.

Source/drain contacts 19 are disposed on the source/drain regions on opposite sides of each gate electrode 1, so as to allow voltage to be applied thereto, and contacts 19 are electrically connected to a wiring layer.

Figure 2:
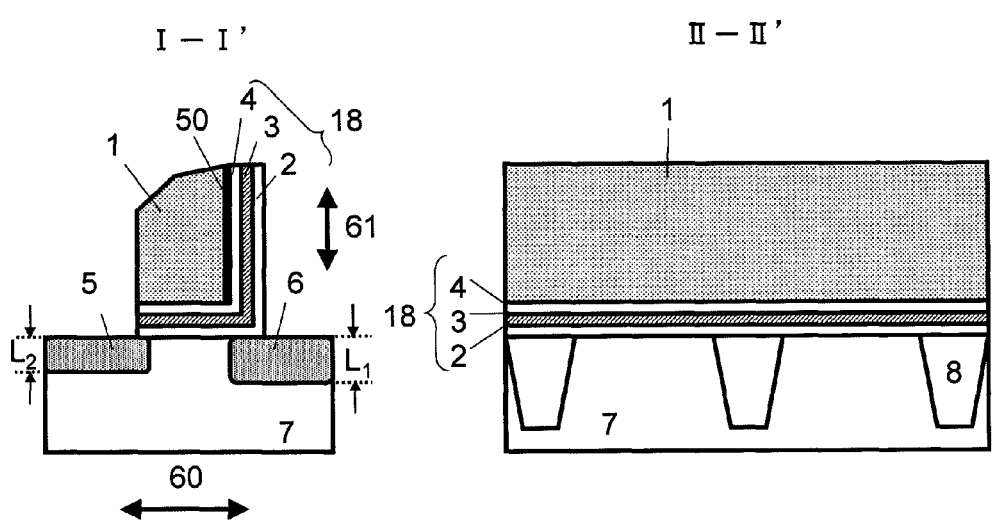
FIG. 2 is an illustration including a I-I' sectional view and a II-II' sectional view of the nonvolatile storage device illustrated in FIG. 1.

FIG. 2 includes sectional views of the trap type memory according to the present invention taken along a I-I' section and a II-II' section of the trap type memory illustrated in FIG. 1. As illustrated in FIG. 2, first insulating film 2, charge accumulating layer 3, second insulating film 4 and gate electrode 1 are sequentially formed over semiconductor substrate 7 provided with isolation regions 8, and first insulating film 2, charge accumulating layer 3 and second insulating film 4 are extended onto a side surface of gate electrode 1 extending vertically to the semiconductor substrate. Specifically, second insulating film 4, charge accumulating layer 3 and first insulating film 2 are formed sequentially from a gate electrode side (i.e., from the side closer to the gate electrode).

In the nonvolatile storage device, source region 5 and drain region 6 are formed in semiconductor substrate 7 so as to partially overlap gate electrode 1 (i.e., such that the gate electrode lies immediately above portions of source region 5 and drain region 6).

The nonvolatile storage device according to the present invention is characterized in that film stack 18 is provided between the semiconductor substrate and gate electrode 1 and extends onto at least a surface (i.e., the surface depicted by wide line 50 of FIG. 2) of the gate electrode lying on the first impurity diffusion region side while being partially in contact with (i.e., overlapping) the first impurity diffusion region. That is, film stack 18 is characterized by being extended (extending) from between the gate electrode and the semiconductor substrate along the surface of the gate electrode lying on the first impurity diffusion region side and terminated at a location spaced apart from the semiconductor substrate (i.e., at a contactless location with the semiconductor substrate). The film stack is also characterized by being partially in contact with (overlapping) the first impurity diffusion region.

The "first impurity diffusion region", as used herein, means either of the source region and the drain region. In a configuration such as to allow positive voltage to be applied across the gate electrode and the source region in writing data and allow positive voltage to be applied across the gate electrode and the drain electrode in reading data, the source region is the first impurity diffusion region. In a configuration such as to allow positive voltage to be applied across the gate electrode and the drain region in writing data and allow positive voltage to be applied across the gate electrode and the source region in reading data, the drain region is the first impurity diffusion region.

The "second impurity diffusion region", as used herein, means either of the source region and the drain region. Of the source region and the drain region, the region other than the region selected as the first impurity diffusion region as described above is the second impurity diffusion region. (That is, when the source region is selected as the first impurity diffusion region, the second impurity diffusion region forms the drain region. On the other hand, when the drain region is selected as the first impurity diffusion region, the second impurity diffusion region forms the source region.)

When the nonvolatile storage device according to the present invention is configured to allow data writing from either of the first and second impurity diffusion regions, either of the source region and the drain region may be used as the first impurity diffusion region or the second impurity diffusion region.

Figure 33:
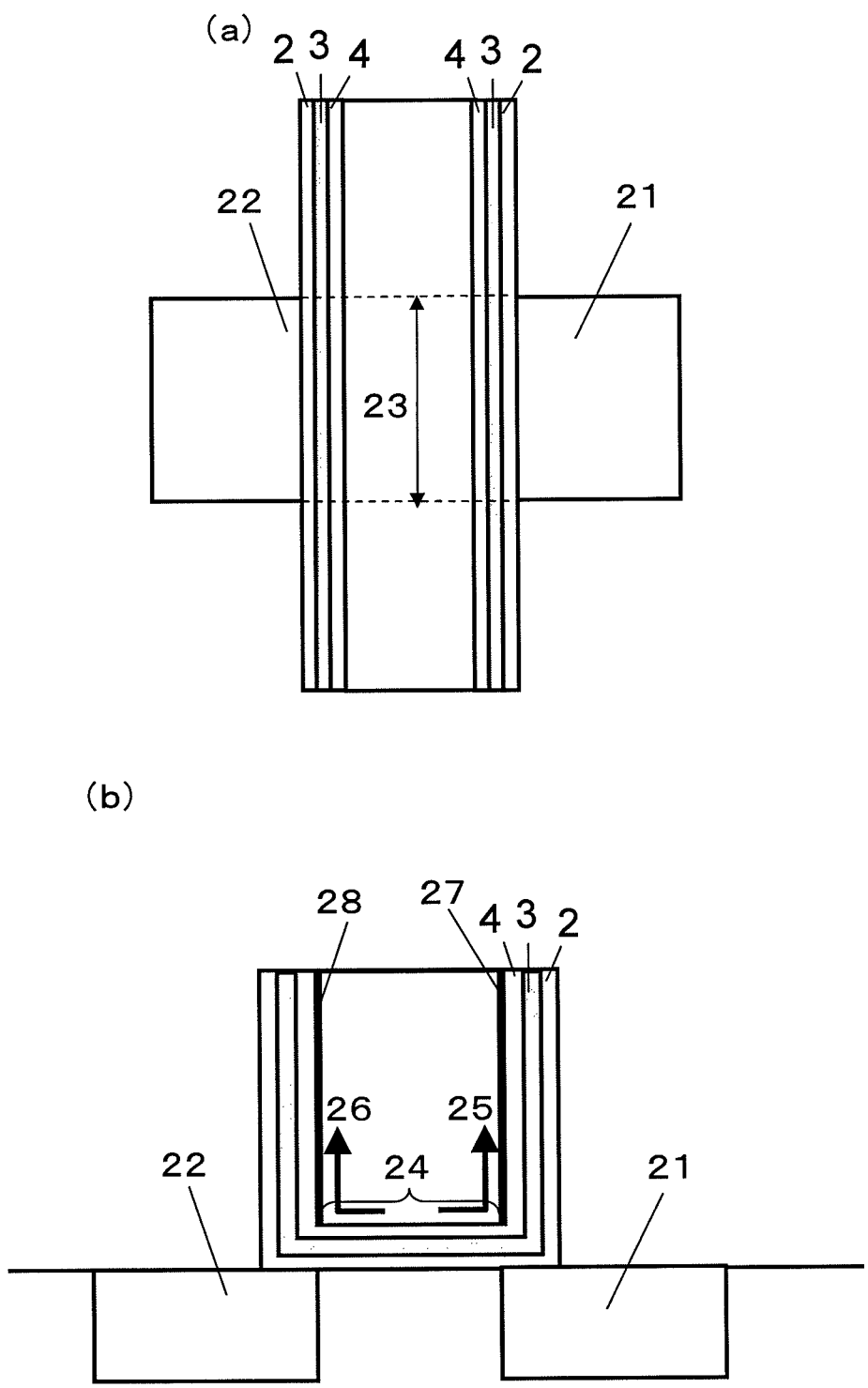
FIG. 33 is an illustration of a surface of a gate electrode lying on a first impurity diffusion region side and a surface of the gate electrode lying on a second impurity diffusion region side according to the present invention.

Referring to FIG. 33, explanation will be made of the "surface of the gate electrode lying on the first impurity diffusion region side" and the "surface of the gate electrode lying on the second impurity diffusion region side". FIG. 33 illustrates one exemplary nonvolatile storage device according to the present invention. FIG. 33(a) is a top view of the nonvolatile storage device, and FIG. 33(b) is a sectional view of the nonvolatile storage device. In these Figures, reference numeral 21 designates the first impurity diffusion region and reference numeral 22 designates the second impurity diffusion region.

First, consideration is given to the surface of a gate electrode having the same width as the first and second impurity diffusion regions (width 23 in FIG. 33(a)), as shown in FIG. 33(a). When the observing point is moved on the surface of the gate electrode from its bottom surface 24 (forming the lowermost surface of the gate electrode and facing the semiconductor substrate) toward the first impurity diffusion region side (toward the direction indicated by arrow 25 of FIG. 33(b)), the surface which appears as the surface of the gate electrode other than the bottom surface is defined as the "surface of the gate electrode lying on the first impurity diffusion region side". (In FIG. 33(b), for example, surface 27 depicted by a wide line is included in the surface of the gate electrode lying on the first impurity diffusion region side.)

Similarly, when the observing point is moved on the surface of the gate electrode from its bottom surface toward the second impurity diffusion region side (toward the direction indicated by arrow 26 of FIG. 33(b)), the surface which appears as the surface of the gate electrode other than the bottom surface is defined as the "surface of the gate electrode lying on the second impurity diffusion region side". (In FIG. 33(b), for example, surface 28 depicted by a wide line is included in the surface of the gate electrode lying on the second impurity diffusion region side.)

When the nonvolatile storage device according to the present invention includes film stacks on respective of the surfaces of the gate electrode lying on the first impurity diffusion region side and on the second impurity diffusion region side, the film stack on the surface lying on the first impurity diffusion region side and the film stack on the surface lying on the second impurity diffusion region side may have their respective uppermost ends joined to each other either partially or wholly, or not joined to each other.

In the case where the film stack on the surface lying on the first impurity diffusion region side and the film stack on the surface lying on the second impurity diffusion region side have their respective uppermost ends joined to each other either partially or wholly, the film stacks are formed to cover the surfaces of the gate electrode by making a round by way of their junction. In this case, the boundary between the film stack on the surface lying on the first impurity diffusion region side and the film stack on the surface lying on the second impurity diffusion region side cannot be definite. The nonvolatile storage device having such a structure is distinct from Floating Gate (FG) type memory in that the charge accumulating layer of the film stack has a low electric conductivity and, hence, when charge is injected into the charge accumulating layer, charge is maldistributed so as to become present only in portions of the charge accumulating layer lying on the first and second impurity diffusion regions and therearound (i.e., the charge unevenly distributes in the charge accumulating layer covering the gate electrode around).

Alternatively, the film stack on the surface lying on the first impurity diffusion region side and the film stack on the surface lying on the second impurity diffusion region side may have their respective uppermost ends not joined to each other. In this case, the film stack according to the present invention fails to cover the surfaces of the gate electrode around in the section shown in FIG. 33(b).

Figure 34:
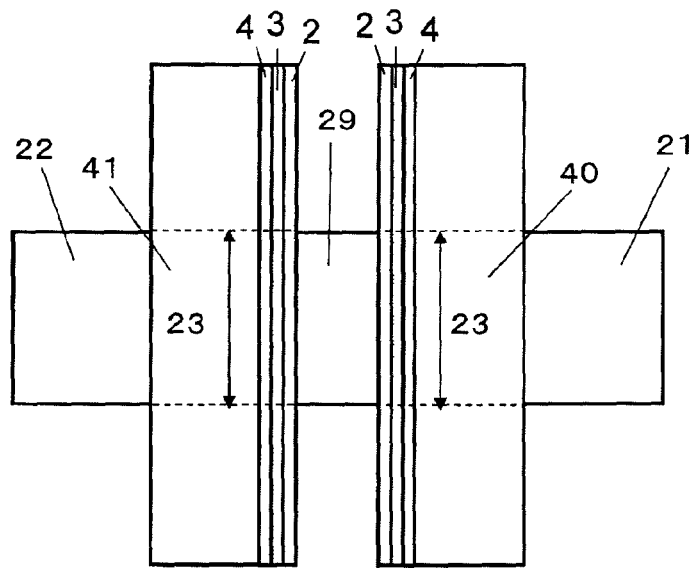
FIG. 34 is an illustration of a surface of a first gate electrode lying on an impurity diffusion region A side and a surface of a second gate electrode lying on the impurity diffusion region A side according to the present invention.
Figure 34:
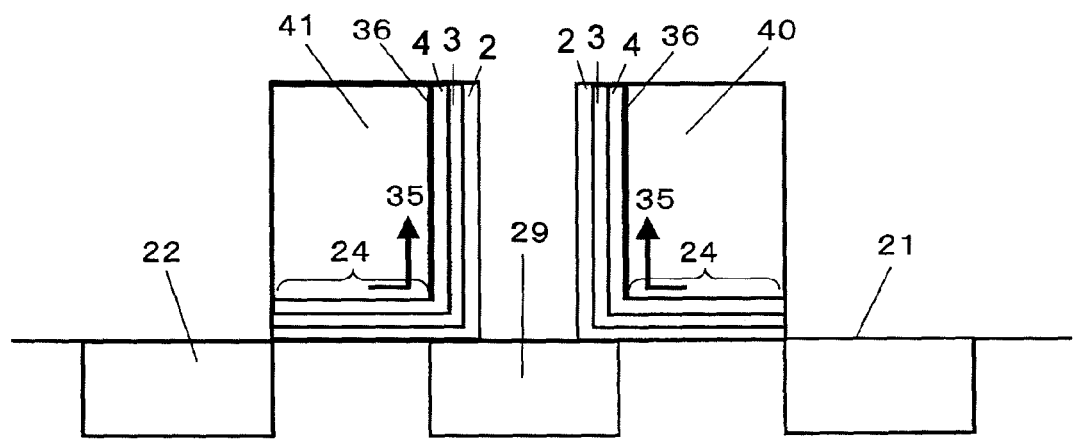

In the same manner as described above, description can be made of the "surface of a first gate electrode lying on an impurity diffusion region A side" and the "surface of a second gate electrode lying on the impurity diffusion region A side". FIG. 34 illustrates one exemplary nonvolatile storage device including two gate electrodes according to the present invention wherein film stacks are each provided on a respective one of the surface of the first gate electrode lying on the impurity diffusion region A side and the surface of the second gate electrode lying on the impurity diffusion region A side. FIG. 34(a) is a top view of this nonvolatile storage device, and FIG. 34(b) is a sectional view of the nonvolatile storage device. In these Figures, reference numeral 40 designates the first gate electrode and reference numeral 41 designates the second gate electrode. Reference numeral 29 designates an impurity diffusion region A, reference numeral 21 designates an impurity diffusion region B, and reference numeral 22 designates an impurity diffusion region C.

First, consideration is given to the surfaces of the first and second gate electrodes each having the same width as the impurity diffusion regions A, B and C (i.e., width 23 in FIG. 34(a)), as shown in FIG. 34(a). When the observing point is moved on the surfaces of the first and second gate electrodes from their bottom surfaces 24 (forming the lowermost surfaces of the gate electrodes and facing the semiconductor substrate) toward the impurity diffusion region A side (toward the directions indicated by arrows 35 of FIG. 34(b)), those surfaces which appear as the surfaces of the gate electrodes other than the bottom surfaces are defined as the "surface of the first gate electrode lying on the impurity diffusion region A side" and the "surface of the second gate electrode lying on the impurity diffusion region A side", respectively. (In FIG. 34(b), for example, surfaces 36 depicted by the wide lines are each included in a respective one of the surfaces of the first and second gate electrodes lying on the impurity diffusion region A side.)

Figure 35:
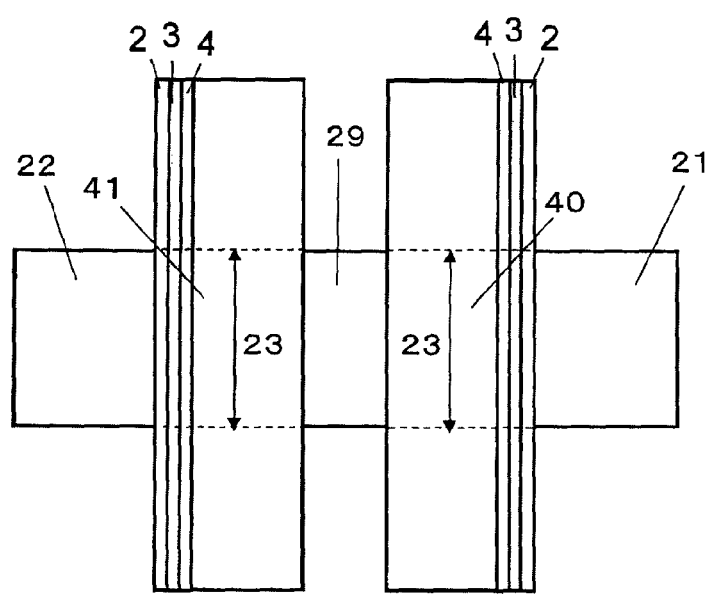
FIG. 35 is an illustration of a surface of a first gate electrode lying on an impurity diffusion region B side and a surface of a second gate electrode lying on an impurity diffusion region C side according to the present invention.
Figure 35:
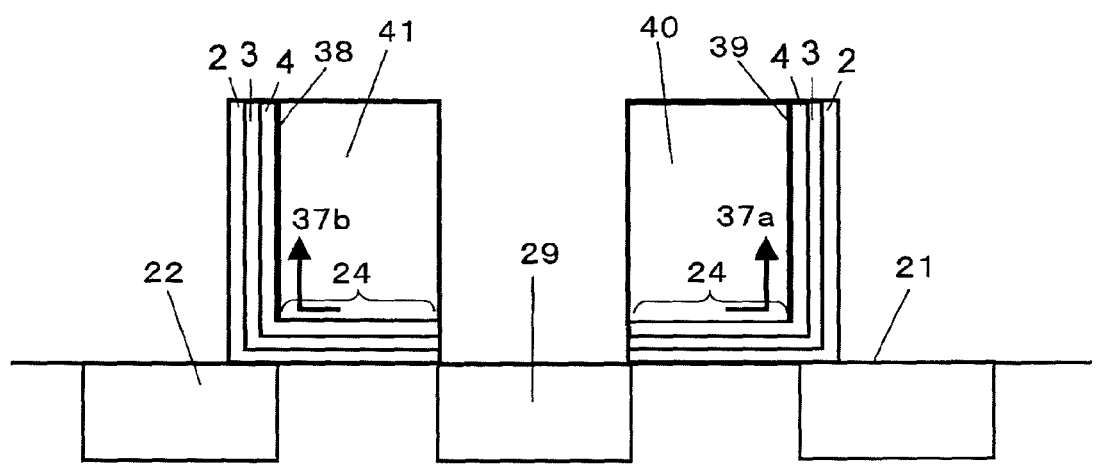

Similarly, description can be made of the "surface of a first gate electrode lying on an impurity diffusion region B side" and the "surface of a second gate electrode lying on an impurity diffusion region C side". FIG. 35 illustrates one exemplary nonvolatile storage device including two gate electrodes according to the present invention wherein film stacks are each provided on the surface of the first gate electrode lying on the impurity diffusion region B side and the surface of the second gate electrode lying on the impurity diffusion region C side. FIG. 35(a) is a top view of this nonvolatile storage device, and FIG. 35(b) is a sectional view of the nonvolatile storage device. In these Figures, reference numeral 40 designates the first gate electrode and reference numeral 41 designates the second gate electrode. Reference numeral 29 designates an impurity diffusion region A, reference numeral 21 designates an impurity diffusion region B, and reference numeral 22 designates an impurity diffusion region C.

First, consideration is given to the surfaces of the first and second gate electrodes each having the same width as the impurity diffusion regions A, B and C (i.e., width 23 in FIG. 35(a)), as shown in FIG. 35(a). When the observing point is moved on the surface of the first gate electrode 40 from its bottom surface toward the impurity diffusion region B side (toward the direction indicated by arrow 37a of FIG. 35(b)), the surface which appears as the surface of the gate electrode other than the bottom surface is defined as the "surface of the first gate electrode lying on the impurity diffusion region B side". (In FIG. 35(b), for example, surface 39 depicted by a wide line is included in the surface of the gate electrode lying on the impurity diffusion region B side.) Likewise, when the observing point is moved on the surface of the second gate electrode 41 from its bottom surface toward the impurity diffusion region C side (toward the direction indicated by arrow 37b of FIG. 35(b)), the surface which appears as the surface of the gate electrode other than the bottom surface is defined as the "surface of the second gate electrode lying on the impurity diffusion region C side". (In FIG. 35(b), for example, surface 38 depicted by a wide line is included in the surface of the gate electrode lying on the impurity diffusion region C side.)

In one exemplary nonvolatile storage device according to the present invention having either of a structure (I) wherein film stacks are each provided on a respective one of the surface of the first gate electrode lying on the impurity diffusion region A side and the surface of the second gate electrode lying on the impurity diffusion region A side and a structure (II) wherein film stacks are each provided on a respective one of the surface of the first gate electrode lying on the impurity diffusion region B side and the surface of the second gate electrode lying on the impurity diffusion region C side, the uppermost ends of the film stacks are not joined to each other in either of the structures (I) and (II). Therefore, in the case of the structure (I), the film stack provided on the surface of the first gate electrode lying on the impurity diffusion region A side and the film stack provided on the surface of the second gate electrode lying on the impurity diffusion region A side can be distinguished from each other. In the case of the structure (II), the film stack provided on the surface of the first gate electrode lying on the impurity diffusion region B side and the film stack provided on the surface of the second gate electrode lying on the impurity diffusion region C side can be distinguished from each other.

There is no particular limitation on the shapes of the surfaces of the gate electrode lying on the first impurity diffusion region side and on the second impurity diffusion region side, the shapes of the surfaces of respective of the first and second gate electrodes lying on the impurity diffusion region A side, the shape of the surface of the first gate electrode lying on the impurity diffusion region B side, or the shape of the surface of the second gate electrode lying on the impurity diffusion region C side. These surfaces may have various shapes including a plane shape, a curved shape, a tapered shape, an inverted tapered shape, and combinations thereof. There is no particular limitation on the height of the uppermost end of any one of these surfaces from the semiconductor substrate or the width of any one of the surfaces. Such height and width can be set as desired appropriately to meet the device characteristics and the process characteristics.

In one exemplary nonvolatile storage device according to the present invention, when writing data, hot electrons are generated by application of positive voltage to gate electrode 1 and drain region 6 to accumulate charge in a portion of the charge accumulating layer located adjacent drain region 6. When reading data, positive voltage is applied to source region 5 and gate electrode 1, while the value of a source current is monitored. In a condition in which electrons are accumulated in the portion of the charge accumulating layer located adjacent drain region 6, a flat-band of the charge accumulating layer shifts toward the positive side, which makes it difficult for current to pass as compared with a condition in which electrons are not accumulated in the portion of the charge accumulating layer located adjacent drain region 6. Storage of information becomes possible by binarizing the condition in which passage of current is difficult and the condition in which passage of current is easy. In order to erase stored information, either process (a) including applying negative voltage to the gate electrode to remove electrons from the charge accumulating layer by utilizing a Fowler-Nordheim (FN) type tunnel current or process (b) including applying negative current to the gate electrode and positive current to the drain and source regions to inject holes generated by interband tunneling in the substrate into the charge accumulating layer, thereby neutralizing electrons present in the charge accumulating layer, is simply carried out.

Figure 3:
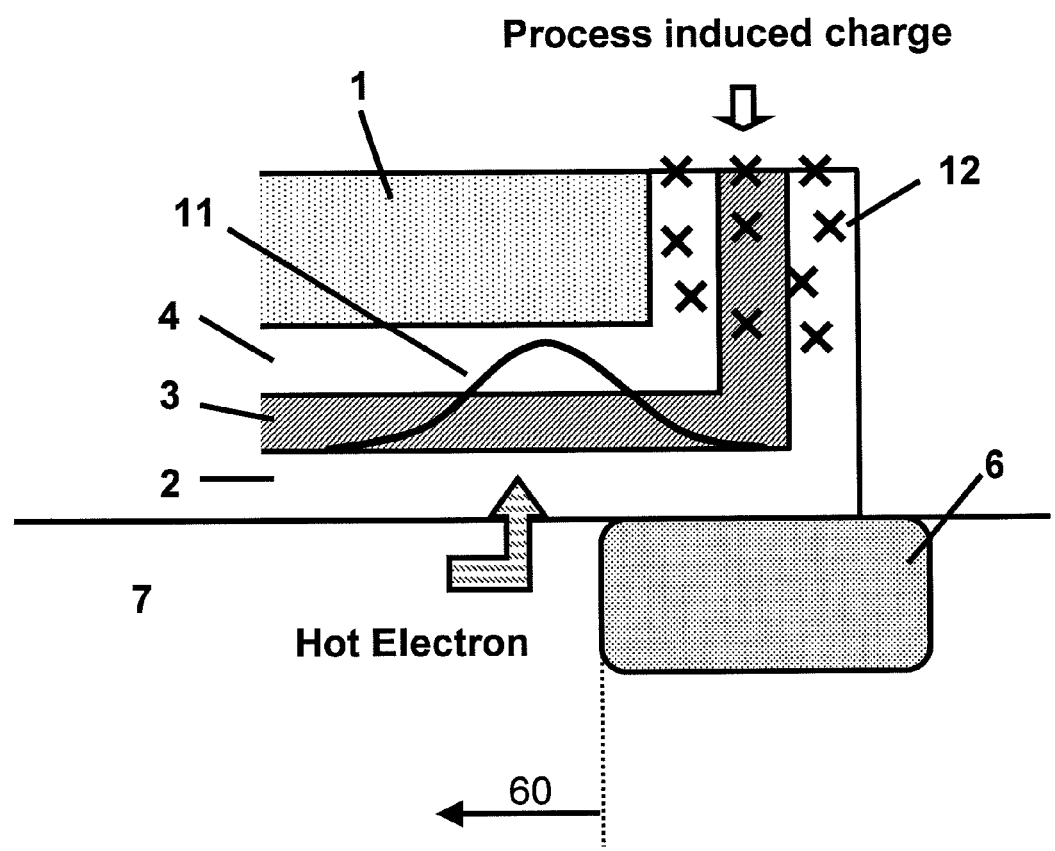
FIG. 3 is an illustration of a charge distribution in a charge accumulating layer of a nonvolatile storage device according to the present invention.

FIG. 3 is an illustration of a charge distribution in the portion of the charge accumulating layer located adjacent the drain region (i.e., first impurity diffusion region) in a nonvolatile storage device according to the present invention in a state after data writing. When high positive voltage is applied to gate electrode 1 and drain region 6, hot electrons are generated around drain region 6 and injected into charge accumulating layer 3 to show a distribution like distribution 11. In FIG. 3, distribution 11 has a horizontal scale matching the horizontal scale of the charge accumulating layer. Charge thus injected is distributed in the portion of the charge accumulating layer located adjacent the drain region, as shown in FIG. 3.

This nonvolatile storage device has the following effect.
(1) Since the charge accumulating layer expands onto the surface of the gate electrode lying on the first impurity diffusion region side, the ratio of injected charge escaping into the electrode or the substrate without being accumulated is reduced, which enhances the writing efficiency.
(2) Since the surface of the gate electrode lying on the first impurity diffusion region side extends vertically to the semiconductor substrate, the area occupied by this structure on the substrate is smaller than that occupied by the conventional structure 2 in which the charge accumulating layer having charge traps is extended to under the sidewall, which is advantageous in miniaturization.
(3) Since the end portion (i.e., the uppermost end of film stack 18 provided on a side surface of the gate electrode) of the film stack, which is easily damaged by a dry etching process, is away from a portion at which hot electrons are injected, charge is not accumulated in that portion, thereby leakage current and leakage of retained charge caused by defects can be suppressed.
(4) Since the end portion of the film stack including charge traps, which allows charge to be injected therein easily during manufacturing processes including dry etching, sidewall formation and ion implantation, is away from the portion of the charge accumulating layer sandwiched between the gate electrode and the semiconductor substrate, the increase in initial $V_T$ due to influent charge can be suppressed.
(5) Since the portion of the charge accumulating layer including charge traps which is extended onto the surface of the gate electrode lying on the first impurity diffusion region side, is positioned vertically to the semiconductor substrate, defects can be prevented from being introduced into the portion of the charge accumulating layer located adjacent the first impurity diffusion region during the ion implantation process for forming a junction region of a second conductivity type.
(6) Since the portion of the charge accumulating layer including charge traps which is present on the surface of the gate electrode lying on the first impurity diffusion region side, functions also as a spacer during ion implantation, the process can be simplified.

The nonvolatile storage device according to the present invention may be provided with a plurality of gate electrodes in a plurality of line electrodes as described above or a single gate electrode.

It is sufficient that the film stack includes at least two layers: the charge accumulating layer and the tunnel insulating film sequentially from the gate electrode side. Examples of such film stacks include a double-layered film stack including the charge accumulating layer and the tunnel insulating film, and a triple-layered film stack including the insulating film B, the charge accumulating layer, and the tunnel insulating film. In this case, the charge accumulating layer preferably comprises a silicon nitride film, a silicon oxinitride film, an alumina film, a hafnium silicate film, a hafnium oxide silicate film, or an aluminum silicate film. The tunnel insulating film is preferably a silicon oxide film or a silicon oxinitride film. By using such charge accumulating layer and tunnel insulating layer, high charge retention properties can be realized. In the case where the insulating film B is used, the same material as the tunnel insulating film can be used for the insulating film B for the same reason as stated above.

From the viewpoint of charge retention, the thickness of the tunnel insulating film is preferably 25 nm or more at which a tunneling mechanism for transmission of electrons fails to become a direct tunneling mechanism, more preferably 35 nm or more, further preferably 45 nm or more.

From the viewpoint of charge retention, the thickness of the insulating film B is preferably 25 nm or more at which a tunneling mechanism for transmission of electrons fails to become a direct tunneling mechanism, more preferably 35 nm or more, further preferably 45 nm or more.

In order to prevent electrons injected into the charge accumulating layer from moving easily, the electric conductivity of a dielectric material (i.e., insulating material) used as the material of the charge accumulating layer at room temperature is preferably not more than $10E-6(S \cdot m^{-1})$, more preferably not more than $10E-8(S \cdot m^{-1})$, further preferably not more than $10E-10(S \cdot m^{-1})$.

Such a double- or triple-layered structure need not necessarily be present throughout the entire film stack, but is simply present in at least the portion of the film stack located adjacent the first impurity diffusion region and the portion of the film stack on the surface of the gate electrode lying on the first impurity diffusion region side. For all the charge distributed in the charge accumulating layer to be retained effectively, the charge accumulating layer is preferably present in the film stack within a range of, for example, not less than 30 nm from an edge of the drain region in direction 60 in FIG. 2, more preferably not less than 35 nm, further preferably not less than 40 nm. From the view point of device miniaturization, the film stack is preferably present within a range of, for example, not more than 60 nm from the edge of the drain region in direction 60 in FIG. 2, more preferably not more than 55 nm, further preferably not more than 50 nm.

It is sufficient that the film stack according to the present invention extends at least from between the semiconductor substrate and the gate electrode onto at least the surface of the gate electrode lying on the first impurity diffusion region side while being partially in contact with the first impurity diffusion region. For example, the film stack may extend from between the semiconductor substrate and the gate electrode onto the surfaces of the gate electrode lying on the first impurity diffusion region side and on the second impurity diffusion region side while being partially in contact with the first and second impurity diffusion regions.

In the case where the film stack is not provided on the surface of the gate electrode lying on the second impurity diffusion region side, the first impurity diffusion region preferably has a larger depth than the second impurity diffusion region in the thickness direction of the semiconductor substrate. (In FIG. 2 for example, depth $L_1$ of drain region 6 in direction 61 is preferably larger than depth $L_2$ of source region 5 in direction 61.) With regard to voltages to be applied to the nonvolatile storage device, the source voltage for reading is lower than the drain voltage for writing. For this reason, by making the first impurity diffusion region deeper than the second impurity diffusion region, it is possible to suppress occurrence of punchthrough while maintaining the charge strength in a region around the drain region in writing. As a result, the gate electrode length can be miniaturized without decreasing the writing speed.

2. Method for Manufacturing a Nonvolatile Storage Device

The method for manufacturing a nonvolatile storage device according to the present invention comprises the following steps:
(1) a step of preparing the semiconductor substrate;
(2) a step of forming a sacrificed oxidation film and a dummy film on the semiconductor substrate;
(3) a step of partially removing the sacrificed oxidation film and the dummy film to form an opening portion reaching the semiconductor substrate and then to expose the semiconductor substrate in a lower portion of the opening portion;
(4) a step of depositing a tunnel insulating film material and a charge accumulating layer material sequentially over an entire surface;
(5) a step of depositing a gate electrode material over an entire surface;
(6) a step of etching back the tunnel insulating film material, the charge accumulating layer material and the gate electrode material, to leave the tunnel insulating film material, the charge accumulating layer material and the gate electrode material on each of side surfaces of the opening portion opposed to each other, thereby forming a gate electrode, and a film stack extending from between the gate electrode and the semiconductor substrate into between a side surface of the gate electrode and the side surface of the opening portion and including the tunnel insulating film and the charge accumulating layer;
(7) a step of removing the sacrificed oxidation film and the dummy film; and
(8) a step of forming a first impurity diffusion region in the semiconductor substrate on a side of the side surface of the gate electrode formed with the film stack thereon in such manner that the first impurity diffusion region comes into contact with a portion of the film stack, and forming a second impurity diffusion region in the semiconductor substrate on a side opposed to the first impurity diffusion region and sandwiching the gate electrode.

Figure 4:
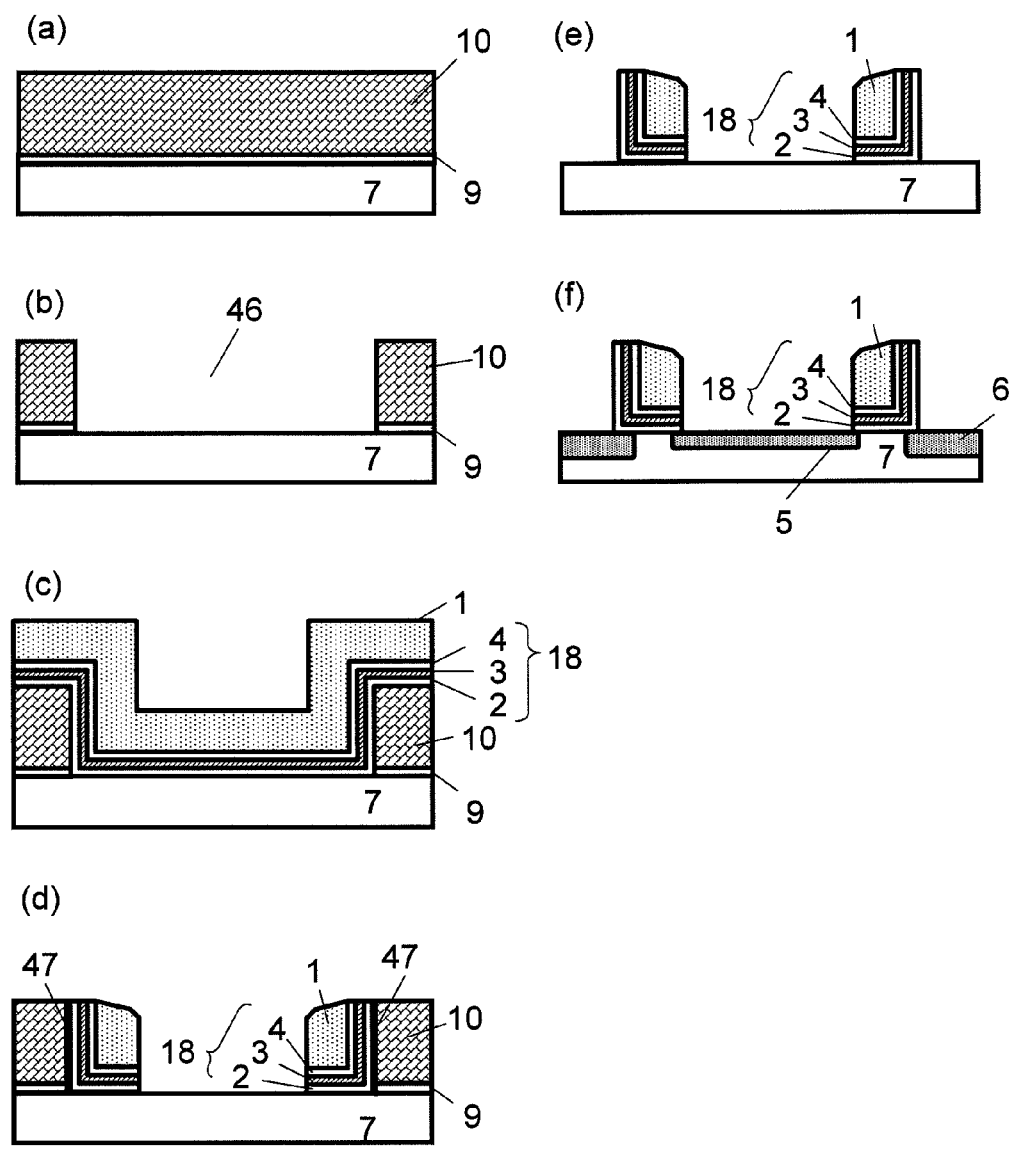
FIG. 4 is an illustration of one exemplary method for manufacturing a nonvolatile storage device according to the present invention.

Brief description will be made of one exemplary method for manufacturing trap type memory (i.e., nonvolatile storage device) according to the present exemplary embodiment. FIG. 4 is an illustration of the trap type memory manufacturing method according to an exemplary embodiment, in sectional views corresponding to the sectional view taken along line I-I' of FIG. 1.

Initially, as shown in FIG. 4(a), pad oxide film (i.e., sacrificed oxidation film) 9 is formed by oxidizing the surface of p-type semiconductor substrate 7 in an oxygen atmosphere diluted with nitrogen, followed by formation of dummy film 10 over pad oxide film 9 (steps (1) and (2)). Here, a low-density CVD (Chemical Vapor Deposition) nitride film is used as the dummy film. Provided that in a later ion implantation step for forming source/drain regions, an ion implantation profile conforms to a normal distribution described by central depth Rp and variance σ, it is desirable that the height of film stack 18 on a side surface of gate electrode 1 is at least (Rp+3σ) in order to avoid damage to a region around the charge accumulating layer. The height of film stack 18 on the surface of gate electrode 1 lying on the first impurity diffusion region side is determined by the sum total of the thicknesses of pad oxide film 9 and dummy film 10 and the amount of retrogradation of the upper end portion of film stack 18 formed on the side surface of gate electrode 1 caused by an etching process. Therefore, the total thickness of pad oxide film 9 and dummy film 10 is preset to a value of not less than (Rp+3σ).

Subsequently, as shown in FIG. 4(b), a reflection preventive film and a resist film (not shown either) are deposited over dummy film 10 and, after patterning by exposure and development, dummy film 10 and pad oxide film 9 are subjected to etching using a dry etcher to form opening portion 46 (step (3)). After the semiconductor substrate has been exposed in the bottom of the opening portion at that time, the reflection preventive film and the resist film are removed by a wet process.

Subsequently, as shown in FIG. 4(c), oxide film (i.e., tunnel insulating film material) 2 and nitride film (i.e., charge accumulating layer material) 3 are sequentially deposited over the entire wafer surface by using a CVD process and, further, oxide film (i.e., insulating film B material) 4 is formed by oxidizing an upper portion of nitride film 7 by ISSG (In Situ Steam Generation) (step (4)). Thereafter, phosphorus-doped silicon film (i.e., gate electrode material) 1 is deposited over oxide film 4 by using a CVD process (step (5)).

Subsequently, as shown in FIG. 4(d), phosphorus-doped silicon film 1, oxide film 4, nitride film 3 and oxide film 2 are etched back by dry etching to form a structure comprising gate electrode 1, oxide film 4, nitride film 3 and oxide film 2 on each of opposite sidewalls (i.e., side surfaces 47 of opening portion 46 opposed to each other) of dummy film 10 (step (6)). Thus, a film stack is formed on each of opposite side surfaces 47 of the opening portion 46 which extends from between the gate electrode and the semiconductor substrate into between a side surface of the gate electrode and side surface 47 of the opening portion and includes insulating film B, a charge accumulating layer and a tunnel insulating film.

Subsequently, as shown in FIG. 4(e), dummy film 10 and pad oxide film 9 are selectively removed by using a high selective ratio etching condition (step (7)). Subsequently, as shown in FIG. 4(f), n-type impurity ions are vertically implanted into an exposed portion of the substrate in a manner self-aligned with the gate electrode (step (8)). By so doing, first impurity diffusion region 6 is formed in the semiconductor substrate on a side of the surface side of the gate electrode formed with the film stack thereon, while second impurity diffusion region 5 is formed in the semiconductor substrate on a side opposed to the first impurity diffusion region 6 and sandwiching the gate electrode. At that time, film stack 18 partially comes into contact with (i.e., overlaps) first impurity diffusion region 6 and second impurity diffusion region 5.

Since film stack 18 on the side surface of the gate electrode functions also as a spacer during ion implantation, it is possible to simplify the process. Since the step of oxidizing a sidewall for spacer, which has been conventionally required, can be eliminated, it is possible to avoid the bird's beak phenomenon which occurs at a gate electrode edge, thereby to prevent the yield from lowering due to an increase in defect density in a region around the gate edge. Further, since ion implantation damage occurs only to an upper portion of film stack 18 on the side surface of the gate electrode and does not occur to the portion of the charge accumulating layer located adjacent drain region 6 and therearound, it is possible to effectively obviate the effect of detects in the film stack caused by the ion implantation step for forming the source region and the drain region. Thereafter, an activation process is carried out to activate source region 5 and drain region 6 which partially overlap gate electrode 1.

In the manner described above, the nonvolatile storage device according to the present exemplary embodiment can be manufactured.

The present invention will be described more specifically by way of exemplary embodiments. These exemplary embodiments are specific examples demonstrated for deeper understanding of the present invention. The present invention is not limited to these exemplary embodiments.

First Exemplary Embodiment

Nonvolatile Storage Device

Figure 5:
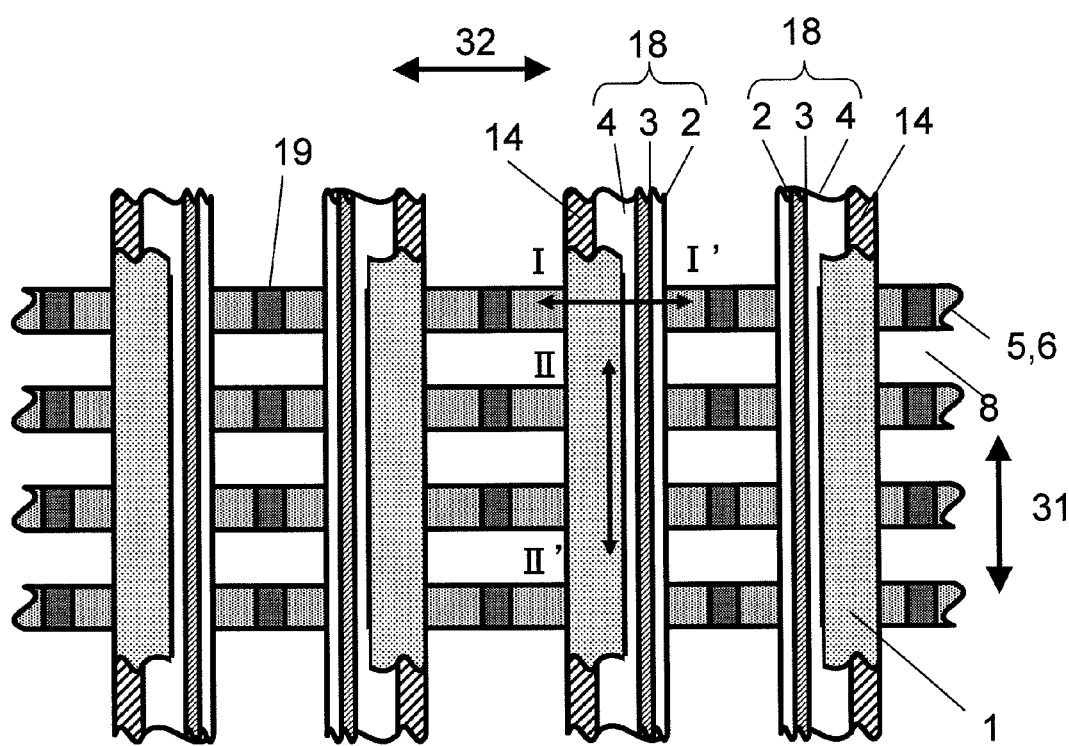
FIG. 5 is a top view illustrating one exemplary nonvolatile storage device according to the present invention.
Figure 6:
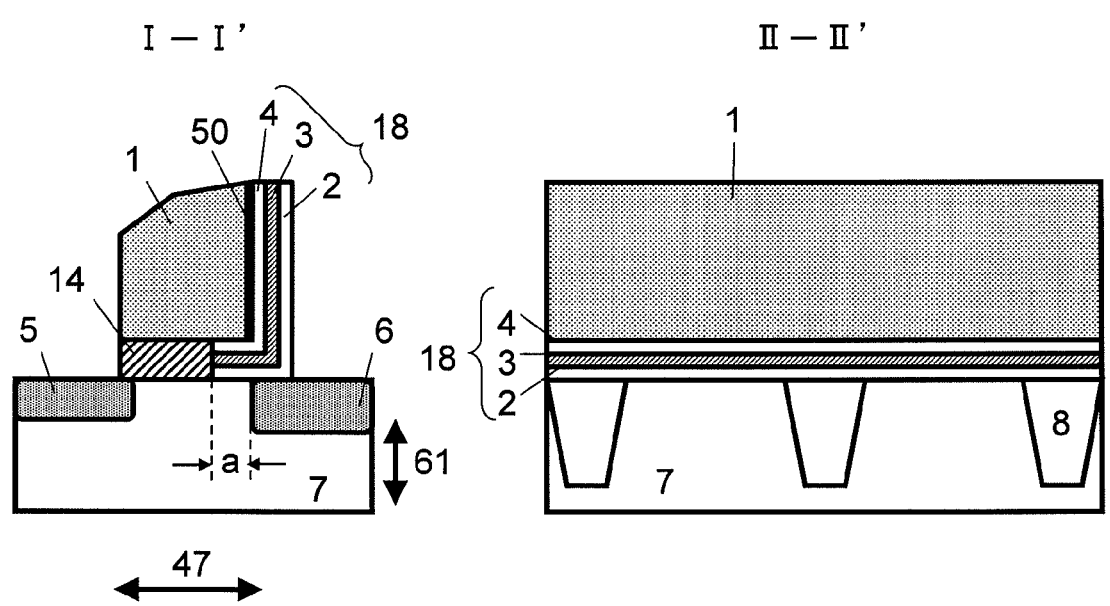
FIG. 6 is an illustration including a I-I' sectional view and a II-II' sectional view of the nonvolatile storage device illustrated in FIG. 5.

FIGS. 5 and 6 illustrate trap type memory (i.e., nonvolatile storage device) according to a first exemplary embodiment. FIG. 5 is a top view of the nonvolatile storage device, and FIG. 6 includes sectional views taken along line I-I' and line II-II' of FIG. 5.

As shown in FIGS. 5 and 6, a plurality of line electrodes extending in predetermined direction 31 are provided on silicon substrate 7 provided with isolation regions 8. Drain region 6 and source region 5 which is present in a shallower region than drain region 6 are provided in silicon substrate 7 so as to be opposed to each other in direction 32 perpendicular to direction 31 in which the line electrodes extend. Drain region 6 and source region 5 are formed so as to partially overlap film stack 18 (i.e., such that drain region 6 and source region 5 is partially in contact with film stack 18). In this exemplary embodiment, drain region 6 and source region 5 are defined as the first impurity diffusion region and the second impurity diffusion region, respectively.

A portion of each line electrode sandwiched between drain region 6 and source region 5 forms a gate electrode having side surfaces extending vertically to the plane direction of semiconductor substrate 7. Film stack 18 is formed so as to extend from between the line electrode and semiconductor substrate onto a side surface (i.e., the surface lying on the first impurity diffusion region side; the surface depicted by wide line 50 of FIG. 6) of the line electrode extending vertically to the plane direction of the semiconductor substrate. That is, film stack 18 is extended along the side surface of gate electrode 1 at a location adjacent drain region 6 formed in the silicon substrate and is terminated at a location vertically spaced apart from silicon substrate 7.

A portion of film stack 18 which is present at a location immediately above drain region 6 and therearound includes second insulating film (i.e., insulating film B) 4, charge accumulating layer 3 and first insulating film (i.e., tunnel insulating film) 2 sequentially from the gate electrode side. In a portion of (i.e., the portion of film stack 18 which is present between the gate electrode and the semiconductor substrate throughout the entire thickness of the film stack in direction 61 and is absent above the first impurity diffusion region) film stack 18 which is present at a location immediately above source region 5 and therearound, there is formed insulating film (i.e., insulating film A) 14 having a lower charge trap surface density than a portion of charge accumulating layer 3 located immediately above drain region 6 or containing absolutely no charge trap. That is, insulating film 14 either has fewer charge traps per unit volume than the portion of the charge accumulating layer located adjacent drain region 6 or fails to function as a charge accumulating layer. Insulating film 14 contacts with the three layers: second insulating film 4, charge accumulating layer 3 and first insulating film 3, at a location above a channel region of the semiconductor substrate.

Preferably, insulating film 14 is absent in a region lying at a location immediately above drain region 6 and therearound in which charge is accumulated by hot electron injection. Specifically, the spacing (i.e., the spacing indicated by symbol a in FIG. 6) between an edge portion of the drain region and insulating film 14 in the direction (i.e., the direction indicated by arrow 47 of FIG. 6) in which the source/drain regions are opposed to each other, is preferably not less than 30 nm, more preferably not less than 35 nm, further preferably not less than 40 nm. From the viewpoint of device miniaturization, the spacing (i.e., the spacing indicated by symbol a in FIG. 6) between the drain region and insulating film 14 is preferably not more than 60 nm, more preferably not more than 55 nm, further preferably not more than 50 nm.

The charge trap surface density can be measured in the following manner.

Figure 36:
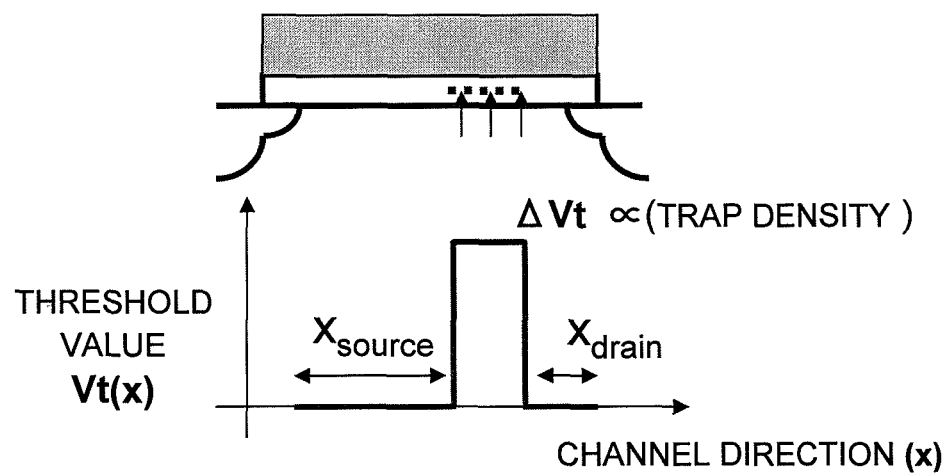
FIG. 36 is an illustration of a method for measuring a charge trap surface density.

Initially, preparations are made to provide a condition which allows electrons to pass through the portion between the gate electrode and the semiconductor substrate by a Fowler-Nordheim (FN) type charge injection method illustrated in FIG. 36, a hot electron injection method, or the like. Thus, electrons are captured in some regions including charge traps, so that threshold value $V_t$ increases locally. By continuing transmission of electrons until the change in threshold value $V_t$ reaches saturation, the charge trap surface density can be determined from the magnitude of threshold value $V_t$ assumed after saturation and trap positions (separately measured by TEM) in the direction vertical to the plane of the substrate (i.e., the thickness direction).

Here, a method as an application of CP measurement is employed to measure the amount of the aforementioned local change in threshold value $V_t$. The CP measurement method is a method having been widely employed so far for measuring the interface state density between a substrate and a gate insulating film. The interface state density can be measured in the following manner.

Figure 37:
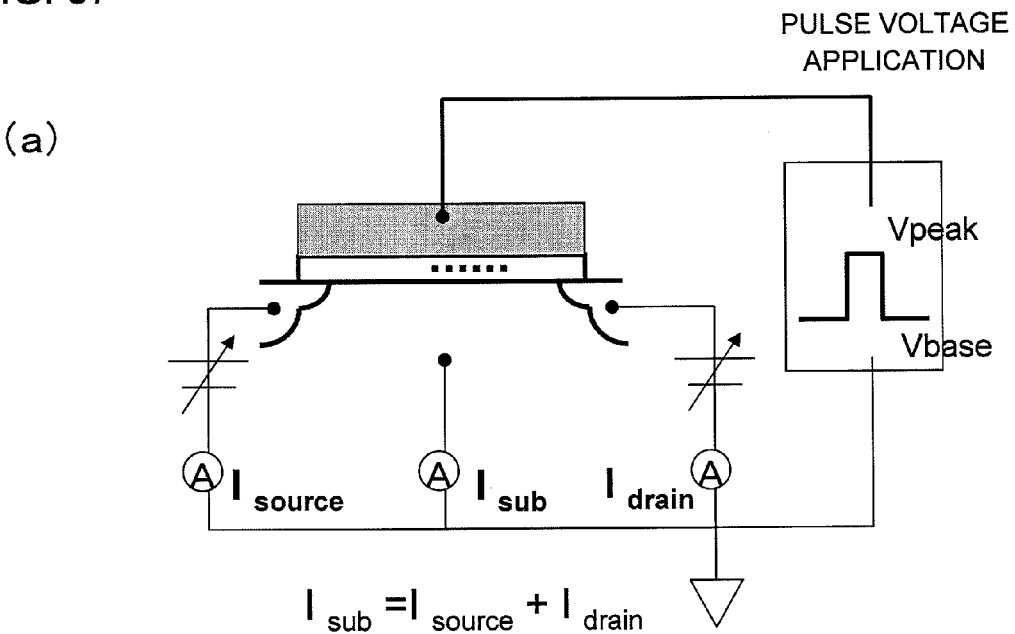
FIG. 37 is an illustration of a method for measuring a charge trap surface density.
Figure 37:
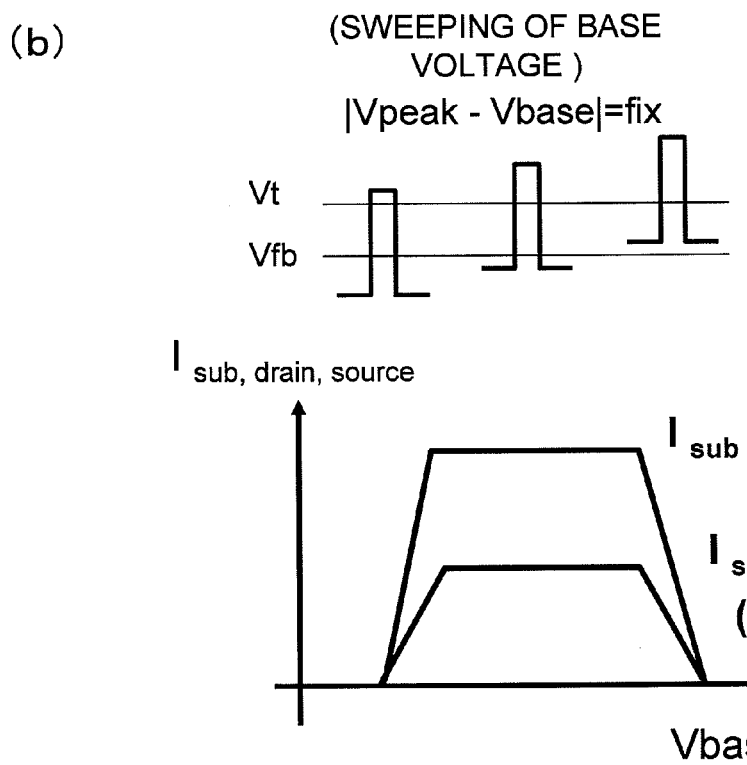

As shown in FIG. 37(a), when $V_{peak}$ is higher than threshold value $V_t$ of the substrate upon application the c of pulse voltage to gate electrode, electrons are fed from the drain region and source region toward the interface state on the channel region (observed as $I_{source}, I_{drain}$). When $V_{base}$ after lapse of a half cycle is lower than threshold value V and lower than the interface state on the channel region, holes are fed from the substrate toward the interface state on the channel region capturing electrons (observed as $I_{sub}$). Therefore, $I_{cp}$ ($I_{sub}, I_{drain}, I_{source}$) current is expressed as $I_{cp} = f \cdot A \cdot q \cdot Dit$ using elementary charge quantity (q), interface state density (Dit), surface area (A) of the channel region, and pulse frequency (f). By utilizing this expression of relation, the interface state density can be measured. FIG. 37(b) shows the result of $I_{cp}$ measurement obtained by fixing the difference between $V_{peak}$ and $V_{base}$ while sweeping $V_{base}$.

Figure 38:
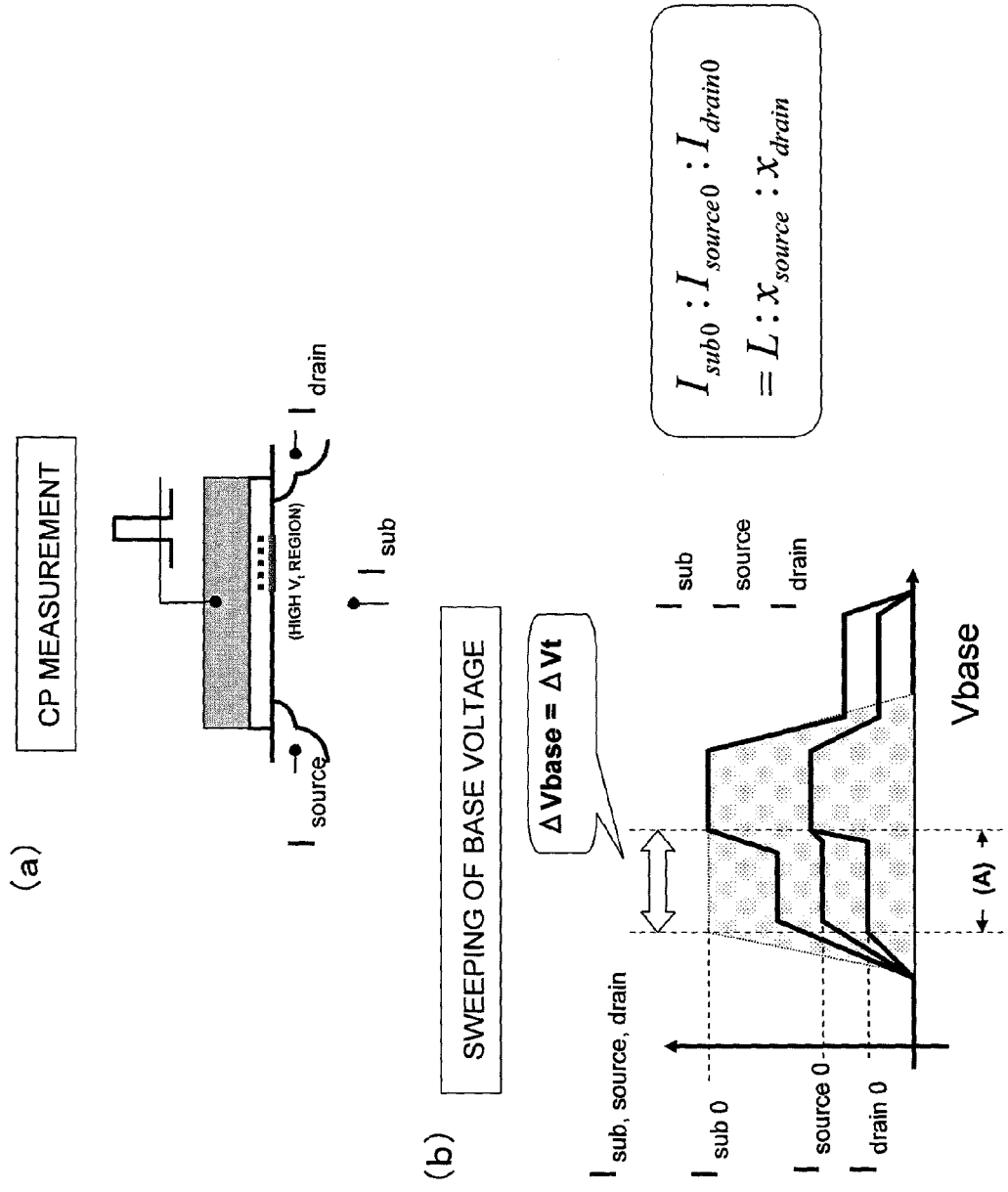
FIG. 38 is an illustration of a method for measuring a charge trap surface density.

The present invention applies the above-described CP measurement method to charge trap surface density measurement. This method is illustrated in FIG. 38(a). Within range (A) of $V_{base}$ in FIG. 38(b), $V_{peak}$ is lower than $V_t$ of a high $V_t$ region. For this reason, electrons are fed from only an interface on the source region side on the left-hand side of the high $V_t$ region and are not fed to the drain region side. The current generated at that time is represented by $I_{source0}$. Likewise, electrons are fed from only an interface on the drain region side on the right-hand side of the high $V_t$ region and are not fed to the source region side. The current generated at that time is represented by $I_{drain0}$.

In a sample in a state prior to repeated writing/erasing operations, the interface state density in the plane of the channel is constant and, therefore, $I_{source0}$ current and $I_{drain0}$ current are each proportional to the area fed with electrons and have the following relationship with $I_{sub0}$ at which $I_{cp}$ is maximized. That is, $I_{sub0}:I_{source0}:I_{drain0}$=(the entire area of the channel region):(the area on the side closer to the source region than the high $V_t$ region):(the area on the side closer to the drain region than the high $V_t$ region)=L:$x_{source}$:$x_{drain}$. This is because a channel width is common to each other. From this relationship, the position of the high $V_t$ region can be determined. The magnitude ($\Delta V_t$) of $V_t$ of the high $V_t$ region shifted up by charge injection can also be determined because the magnitude ($\Delta V_t$) is equal to the width $\Delta V_{base}$ of region (A). In this way, the surface density and the positions of charge trap regions localized in the channel region can be measured at the same time by the above-described CP measurement method.

In the same manner as described above, the charge trap surface density can be measured in any other exemplary embodiment.

Method of Operation

In the present exemplary embodiment, when writing by charge, hot electrons are generated by application of positive voltage to gate electrode 1 and drain region 6 to accumulate charge in the portion of the charge accumulating layer located adjacent drain region 6. When reading, positive voltage is applied to source region 5 and gate electrode 1, while the value of a source current is monitored. The voltage to be applied to source region 5 is set lower than the drain voltage for writing.

In a condition in which electrons are accumulated in the portion of the charge accumulating layer located adjacent drain region 6, a flat-band of a charge accumulating region shifts toward the positive side, which makes it difficult for current to pass as compared with a condition in which electrons are not accumulated in the portion of the charge accumulating layer located adjacent drain region 6. Storage of information becomes possible by binarizing the condition in which passage of current is difficult and the condition in which passage of current is easy. In order to erase stored information, either process (a) including applying negative voltage to the gate electrode to remove electrons from the charge accumulating layer by utilizing a Fowler-Nordheim (FN) type tunnel current or process (b) including applying negative current to the gate electrode and positive current to the drain and source regions to inject holes generated by interband tunneling in the substrate into the charge accumulating layer, thereby neutralizing electrons present in the charge accumulating layer, is simply carried out.

Effect of the Invention

The nonvolatile storage device according to the first exemplary embodiment has the following effect.
(1) Since the charge accumulating layer expands from between gate electrode 1 and the semiconductor substrate onto the side surface (i.e., the surface lying on the first impurity diffusion region side) of the gate electrode, the writing efficiency of accumulated charge is high.
(2) Since the end portion (i.e., the uppermost end of film stack 18 provided on the surface of the gate electrode lying on the first impurity diffusion region side) of film stack 18, which is easily damaged by an etching process, is away from a portion at which hot electrons are injected, charge is not accumulated in that portion. For this reason, leakage current and leakage of retained charge caused by defects can be suppressed.
(3) Since insulating film 14 having a low charge trap surface density or containing absolutely no charge trap blocks diffusion of charge accumulated in the portion of the charge accumulating layer located adjacent drain region 6 toward the source side, the charge retention properties can be improved.
(4) By making the diffusion layer of source region 5 shallower than the diffusion layer of drain region 6, it is possible to suppress occurrence of punchthrough while maintaining the charge strength in a region around the drain region in writing. As a result, the gate electrode length can be miniaturized without decreasing the writing speed.

Method for Manufacturing a Nonvolatile Storage Device

Figure 7:
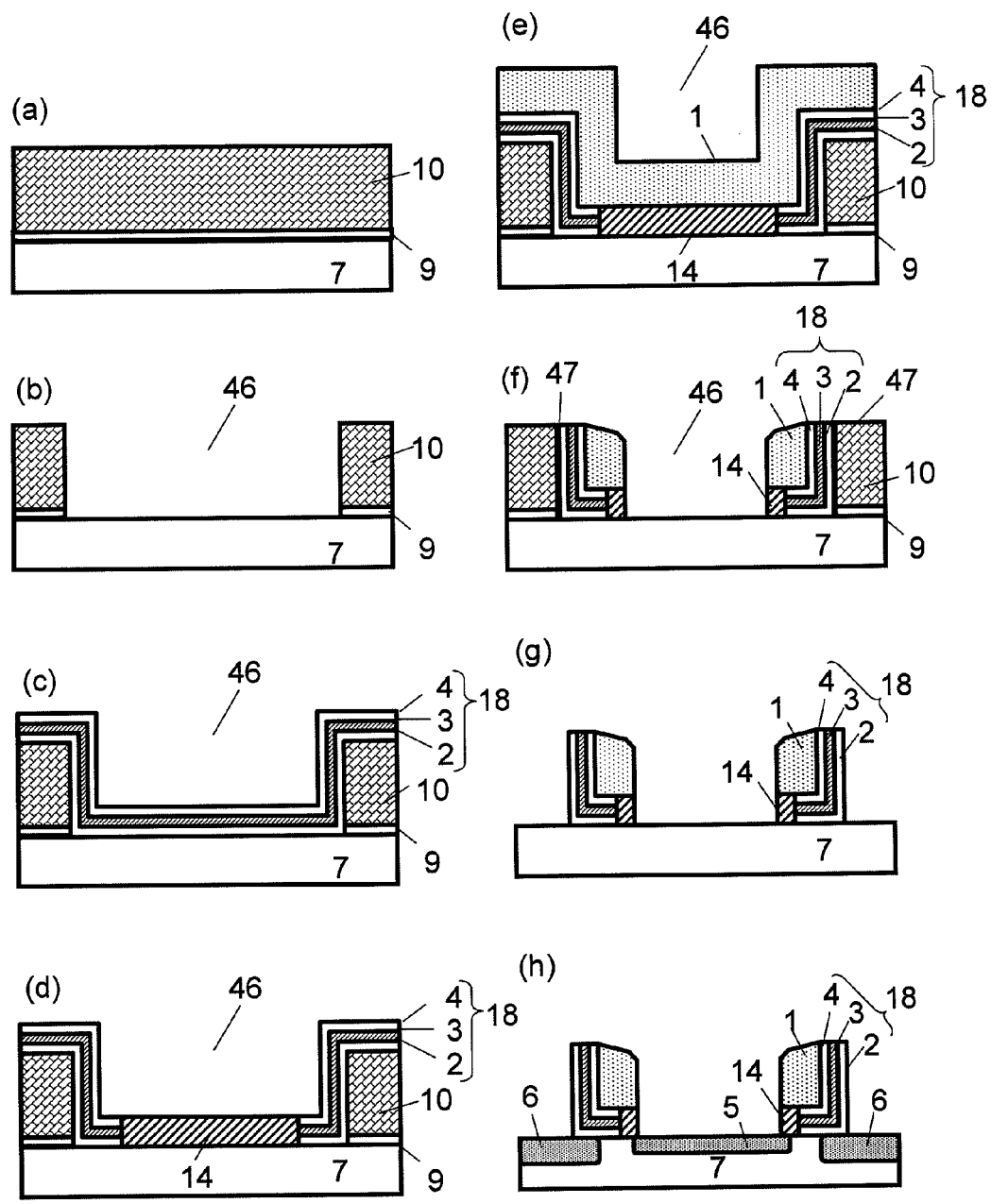
FIG. 7 includes top views illustrating one exemplary method for manufacturing the nonvolatile storage device illustrated in FIGS. 5 and 6.

Brief description will be made of a method for manufacturing the trap type memory (i.e., nonvolatile storage device) according to the present exemplary embodiment. FIG. 7 is an illustration of the trap type memory manufacturing method according to the first exemplary embodiment, in sectional views corresponding to the sectional view taken along line I-I' of FIG. 6.

Initially, as shown in FIG. 7(a), pad oxide film (i.e., sacrificed oxidation film) 9 was formed by oxidizing the surface of p-type silicon substrate 7 in an oxygen atmosphere diluted with nitrogen, followed by formation of dummy film 10 over pad oxide film 9. Here, a low-density CVD (Chemical Vapor Deposition) nitride film was used as the dummy film.

Provided that an ion implantation profile to be obtained by a later ion implantation step for forming source/drain regions conforms to a normal distribution described by central depth Rp and variance σ, it is desirable that the height of film stack 18 on the side surface (i.e., the surface lying on the first impurity diffusion region side) of gate electrode 1 be at least (Rp+3σ) in order to avoid damage to a region around the charge accumulating layer. The height of film stack 18 on the side surface of gate electrode 1 is determined by the sum total of the thicknesses of pad oxide film 9 and dummy film 10 and the amount of retrogradation of the upper end portion of film stack 18 formed on the side surface of gate electrode 1 caused by an etching process. Therefore, the total thickness of pad oxide film 9 and dummy film 10 is preferably preset to a value of not less than (Rp+3σ).

Thereafter, as shown in FIG. 7(b), a reflection preventive film and a resist film (not shown either) were deposited over dummy film 10 and then patterned by exposure and development. Thereafter, dummy film 10 and pad oxide film 9 were subjected to etching using a dry etcher to form opening portion 46 exposing a predetermined portion of the substrate. Thereafter, the reflection preventive film and the resist film were removed by a wet process.

Subsequently, as shown in FIG. 7(c), oxide film (i.e., tunnel insulating film material) 2 and nitride film (i.e., charge accumulating layer material) 3 were sequentially deposited over the entire wafer surface by using a CVD process and, further, oxide film (i.e., insulating film B material) 4 was formed by oxidizing an upper portion of nitride film 3 by ISSG (In Situ Steam Generation). Subsequently, as shown in FIG. 7(d), annealing in an atmosphere containing $O_2$, $H_2O$, NO, $N_2O$ or an oxidizing radical was performed by masking with a patterned nitride film (not shown) except a central portion of film stack 18, thereby lowering the charge trap surface density of a portion of film stack 18 around the center of film stack 18.

After the annealing, the patterned mask nitride film was removed by high selectivity etching. Subsequently, as shown in FIG. 7(e), phosphorus-doped silicon film (i.e., gate electrode material) 1 was formed over oxide film 4 by using a CVD process. Thereafter, as shown in FIG. 7(f), phosphorus-doped silicon film 1, oxide film 4, nitride film 3 and oxide film 2 were etched back by dry etching. By so doing, a stacked structure of gate electrode 1 and film stack 18 partially including a layer having a low charge trap surface density were formed on each of sidewalls (i.e., opposite side surfaces of opening portion 46 depicted by wide lines 47) of dummy film 10 in the window.

Subsequently, as shown in FIG. 7(g), dummy film 10 and pad oxide film 9 were selectively removed by using a high selective ratio etching condition. Subsequently, as shown in FIG. 7(h), n-type impurities were vertically ion-implanted into an exposed portion of the semiconductor substrate in a manner self-aligned with gate electrode 1. Thereafter, an activation process was carried out to activate source and drain regions 5 and 6 partially overlapping (i.e., in contact with) gate electrode 1.

The manufacturing method according to the present exemplary embodiment has the following effect.
(1) Since film stack 18 on the side surface of gate electrode 1 functions also as a spacer during ion implantation, it is possible to simplify the process.
(2) Since the step of oxidizing a sidewall for spacer, which has been conventionally required, can be eliminated, it is possible to avoid the bird's beak phenomenon which occurs at a gate electrode edge, thereby to prevent the yield from lowering due to an increase in defect density in a region around the gate electrode edge.
(3) Ion implantation damage occurs only to an upper end of film stack 18 exposed on the side surface (i.e., the surface lying on the first impurity diffusion region side) of gate electrode 1 and does not occur to the portion of the charge accumulating layer located adjacent drain region 6 and therearound. For this reason, it is possible to effectively obviate the effect of detects in the film stack caused by the ion implantation step for forming the source region and the drain region.

In the manner described above, the nonvolatile storage device according to the first exemplary embodiment can be manufactured.

Second Exemplary Embodiment

Nonvolatile Storage Device

Figure 8:
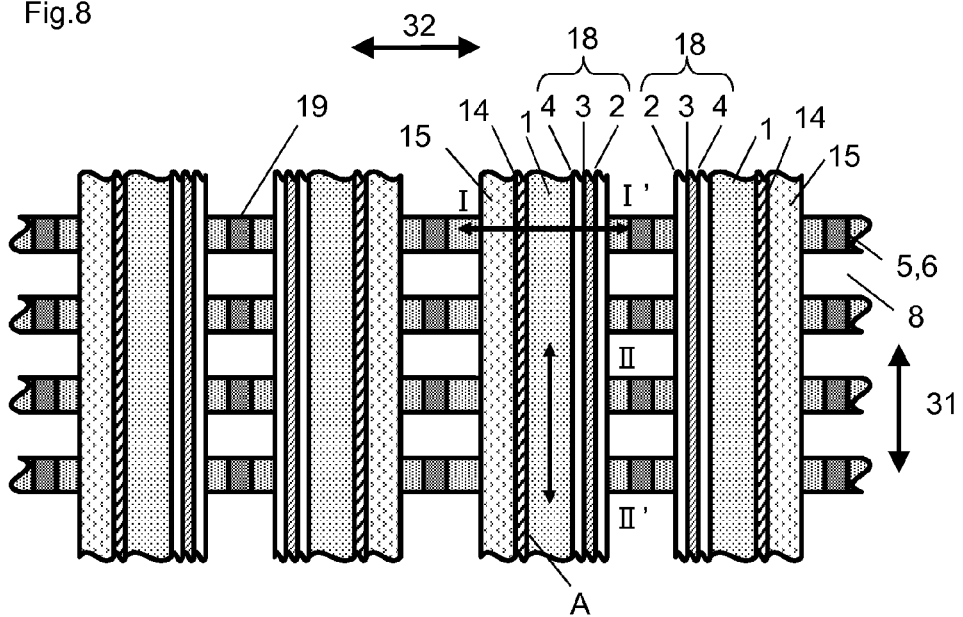
FIG. 8 is a top view illustrating one exemplary nonvolatile storage device according to the present invention.
Figure 9:
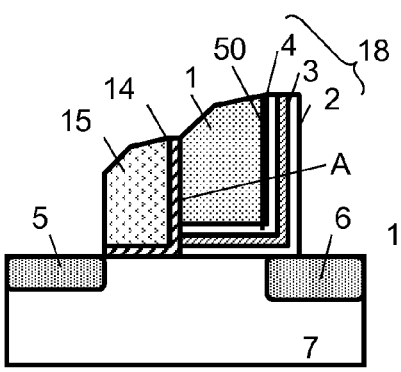
FIG. 9 is an illustration including a I-I' sectional view and a II-II' sectional view of the nonvolatile storage device illustrated in FIG. 8.
Figure 9:
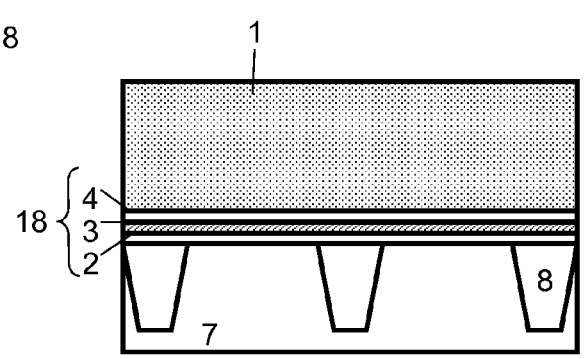

FIGS. 8 and 9 illustrate trap type memory (i.e., nonvolatile storage device) according to a second exemplary embodiment. FIG. 8 is a top view of the trap type memory according to the second exemplary embodiment, and FIG. 9 illustrates sectional views of the trap type memory according to the present exemplary embodiment taken along line I-I' and line II-II' of FIG. 8.

As shown in FIGS. 8 and 9, a plurality of line electrodes extending in predetermined direction 31 are provided on silicon substrate 7 provided with isolation regions 8. Each of the line electrodes includes two side surfaces extending vertically to the plane direction of semiconductor substrate 7. Film stack (i.e., stacked films) 18 is provided which extends from between the line electrode and the semiconductor substrate onto one side surface (i.e., the surface lying on the first impurity diffusion region side) of the line electrode extending vertically to the plane direction of the semiconductor substrate. Word gate 15 is provided on side surface A of the gate electrode which is not formed with film stack 18 and is opposite away from the surface lying on the first impurity diffusion region side, while insulating film 14 having a lower charge trap surface density than the charge accumulating layer or containing absolutely no trap is provided between a side surface of word gate 15 and side surface A of the gate electrode and between a bottom surface of word gate 15 and semiconductor substrate 7. In obtaining advantages of the present exemplary embodiment, the insulating films each formed on a respective one of the bottom surface and the side surface of word gate 15 need not necessarily be the same, but different insulating films may be formed on a respective one of the bottom surface and the side surface of word gate 15.

Drain region 6 and source region 5 which is present in a shallower region than drain region 6 are provided in silicon substrate 7 so as to be opposed to each other in direction 32 perpendicular to direction 31 in which the line electrodes extend. Drain region 6 and source region 5 are located in the semiconductor substrate so as to sandwich gate electrode 1 and word gate 15 therebetween.

Drain region 6 is formed so as to partially overlap film stack 18 (i.e., such that drain region 6 is partially in contact with film stack 18). Source region 5 is formed so as to partially overlap insulating film 14 (i.e., such that source region 5 is partially in contact with insulating film 14). In the present exemplary embodiment, drain region 6 and source region 5 are defined as the first impurity diffusion region and the second impurity diffusion region, respectively. A portion of the line electrode sandwiched between drain region 6 and source region 5 forms a gate electrode.

Film stack 18 includes first insulating film (i.e., insulating film B) 2, charge accumulating layer 3 and second insulating film (i.e., tunnel insulating film) 4 sequentially from the gate electrode side. Film stack (i.e., stacked films) 18 is formed so as to extend from between the line electrode and the semiconductor substrate onto a side surface (i.e., the surface lying on the first impurity diffusion region side; the surface depicted by wide line 50 of FIG. 9) of the line electrode extending vertically to the plane of the semiconductor substrate. That is, film stack 18 is extended along the side surface of gate electrode 1 at a location adjacent drain region 6 formed in the silicon substrate and is terminated at a location vertically spaced apart from silicon substrate 7.

Method of Operation

In the present exemplary embodiment, when writing by charge, hot electrons are generated by application of positive voltage to gate electrode 1, word gate 15 and drain region 6 to accumulate charge in the portion of the charge accumulating layer located adjacent drain region 6. When reading, positive voltage is applied to source region 5, gate electrode 1 and word gate 15, while the value of a source current is monitored. At this time, the voltage to be applied to source region 5 is set lower than the drain voltage 6 for writing. In a condition in which electrons are accumulated in a portion of the charge accumulating layer located adjacent drain region 6, a flatband of a charge accumulating region shifts toward the positive side, which makes it difficult for current to pass as compared with a condition in which electrons are not accumulated in the portion of the charge accumulating layer located adjacent drain region 6. Storage of information becomes possible by binarizing the condition in which passage of current is difficult and the condition in which passage of current is easy. In order to erase stored information, either process (a) including applying negative voltage to the gate electrode to remove electrons from the charge accumulating layer by utilizing a Fowler-Nordheim (FN) type tunnel current or process (b) including applying negative voltage to the gate electrode and positive voltage to the drain and source regions to inject holes generated by interband tunneling in the substrate into the charge accumulating layer, thereby neutralizing electrons present in the charge accumulating layer, is simply carried out.

Effect of the Invention

The nonvolatile storage device according to the second exemplary embodiment has the following effect.
(1) Since the charge accumulating layer extends from between gate electrode 1 and the semiconductor substrate onto the side surface (i.e., the surface lying on the first impurity diffusion region side) of gate electrode, the writing efficiency of accumulated charge is high.
(2) Since the end portion (i.e., the uppermost end of film stack 18 provided on the surface of the gate electrode lying on the first impurity diffusion region side) of film stack 18, which is easily damaged by an etching process, is away from a portion at which hot electrons are injected, charge is not accumulated in that portion. For this reason, leakage current and leakage of retained charge caused by defects can be suppressed.
(3) Insulating film 14 having a low charge trap surface density or containing absolutely no charge trap blocks diffusion of charge accumulated in the portion of the charge accumulating layer located adjacent drain region 6 toward the source region side. For this reason, the charge retention properties can be improved.
(4) By applying voltage to the word gate in the reading operation, it is possible to lower the channel resistance of a channel portion under the word gate, thereby to increase the reading current.
(5) The charge strength in a region around the source/drain region in writing can be maintained by making the first impurity diffusion region (i.e., drain region) on the charge accumulating side relatively deep, while occurrence of the punch-through phenomenon can be suppressed by making the second impurity diffusion region (i.e., source region) on no charge accumulation side relatively shallow. As a result, the gate electrode length can be miniaturized without decreasing the writing speed.

Method for Manufacturing a Nonvolatile Storage Device

Figure 10:
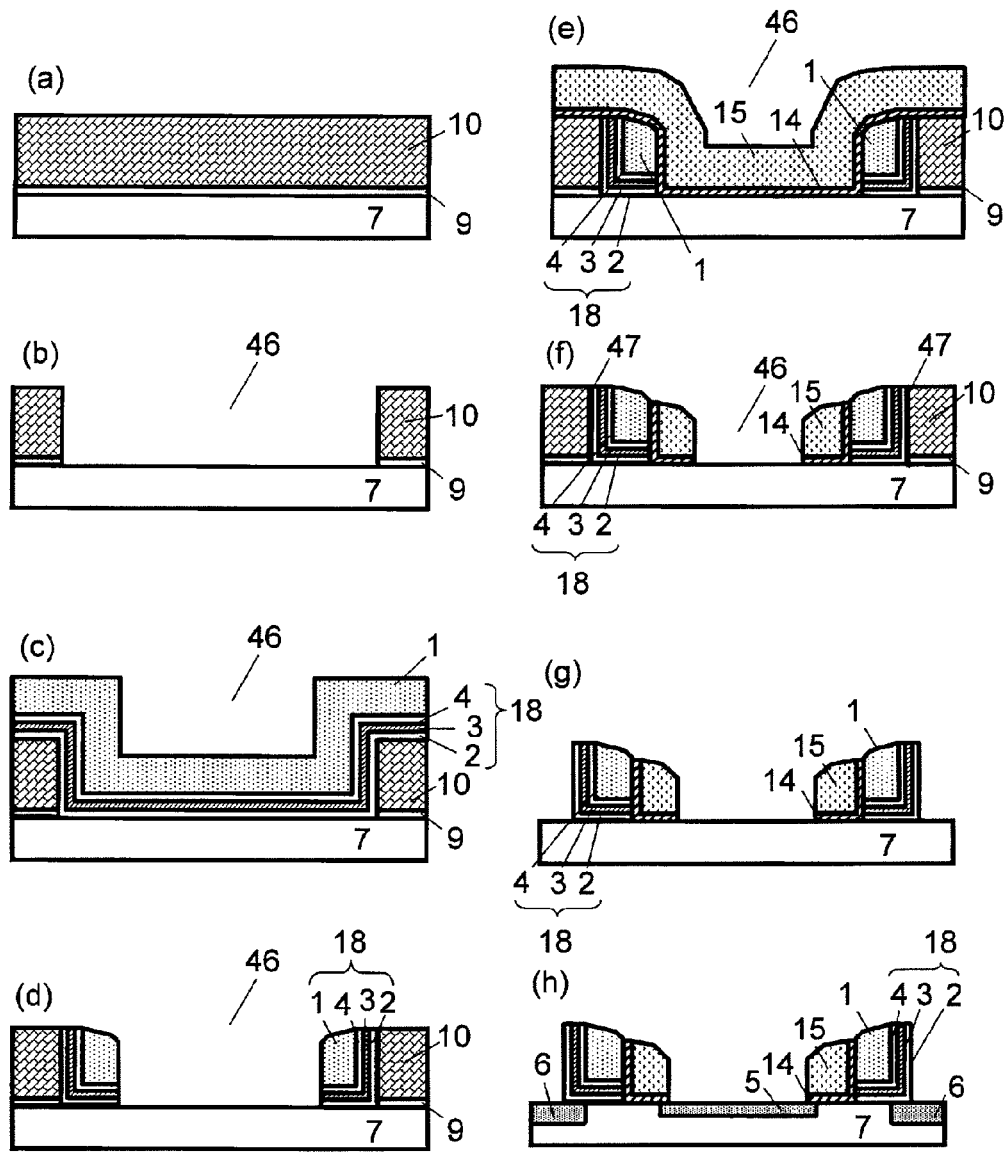
FIG. 10 includes top views illustrating one exemplary method for manufacturing the nonvolatile storage device illustrated in FIGS. 8 and 9.

Brief description will be made of a method for manufacturing the trap type memory according to the present exemplary embodiment. FIG. 10 is an illustration of the trap type memory manufacturing method according to the second exemplary embodiment of the present invention, in sectional views corresponding to the sectional view taken along line I-I' of FIG. 9.

Initially, as shown in FIG. 10(*a*), pad oxide film (i.e., sacrificed oxidation film) 9 was formed by oxidizing the surface of p-type silicon substrate 7 in an oxygen atmosphere diluted with nitrogen. Thereafter, dummy film 10 was formed over pad oxide film 9. Here, a low-density CVD (Chemical Vapor Deposition) nitride film was used as the dummy film.

Provided that an ion implantation profile to be obtained by a later ion implantation step for forming source/drain regions conforms to a normal distribution described by central depth Rp and variance σ, it is desirable that the height of film stack 18 on the side surface of gate electrode 1 be at least (Rp+3σ) in order to avoid damage to a region around the charge accumulating layer. The height of film stack 18 on the side surface of gate electrode 1 is determined by the sum total of the thicknesses of pad oxide film 9 and dummy film 10 and the amount of retrogradation of the upper end portion of film stack 18 formed on the side surface of gate electrode 1 caused by an etching process. Therefore, the total thickness of pad oxide film 9 and dummy film 10 is preferably preset to a value of not less than (Rp+3σ).

Thereafter, as shown in FIG. 10(*b*), a reflection preventive film and a resist film (not shown either) were deposited over dummy film 10 and then patterned by exposure and development. Thereafter, dummy film 10 and pad oxide film 9 were subjected to etching using a dry etcher to form opening portion 46 exposing a predetermined portion of the substrate. Thereafter, the reflection preventive film and the resist film were removed by a wet process.

Subsequently, as shown in FIG. 10(*c*), oxide film (i.e., tunnel insulating film material) 2 and nitride film (i.e., charge accumulating layer material) 3 were sequentially deposited over the entire wafer surface by using a CVD process. Further, oxide film (i.e., insulating film B material) 4 was formed by oxidizing an upper portion of nitride film 3 by ISSG (In Situ Steam Generation). Subsequently, phosphorus-doped silicon film (i.e., gate electrode material) 1 was deposited over oxide film 4 by using a CVD process. Thereafter, as shown in FIG. 10(*d*), phosphorus-doped silicon film 1, oxide film 4, nitride film 3 and oxide film 2 were etched back by dry etching. By so doing, gate electrode 1 and a structure including oxide film 4, nitride film 3 and oxide film 2 were formed on each of sidewalls (i.e., side surfaces 47 of opening portion 46 opposed to each other) of dummy film 10.

Subsequently, in the same manner as the steps illustrated in FIGS. 10(*c*) to 10(*d*), oxide film (i.e., insulating film material) 14 and phosphorus-doped silicon film (i.e., word gate material) 15 were sequentially deposited over the entire wafer surface by using a CVD process, as shown in FIG. 10(*e*) (step (9)). Thereafter, as shown in FIG. 10(*f*), phosphorus-doped silicon film 15 and oxide film 14 were etched back by dry etching to form insulating film 14 and word gate 15 which were adjacent to each other on a sidewall (i.e., side surface A of the gate electrode which was not formed with the film stack and was opposite away from the surface of the gate electrode lying on the first impurity diffusion region side on which the film stack was formed) of gate electrode 1 (step (10)).

Subsequently, as shown in FIG. 10(*g*), dummy film 10 and pad oxide film 9 were selectively removed by using a high selective ratio etching condition. Subsequently, as shown in FIG. 10(*h*), n-type impurities were vertically ion-implanted into an exposed portion of the semiconductor substrate in a manner self-aligned with gate electrode 1. Thereafter, an activation process was carried out to activate source and drain regions 5 and 6 partially overlapping (i.e., in contact with) gate electrode 1.

The manufacturing method according to the present exemplary embodiment has the following effect.
(1) Since film stack 18 on the side surface of gate electrode 1 functions also as a spacer during ion implantation, it is possible to simplify the process.
(2) Since the step of oxidizing a sidewall for spacer, which has been conventionally required, can be eliminated, it is possible to avoid the bird's beak phenomenon which occurs at a gate electrode edge, thereby to prevent the yield from lowering due to an increase in defect density in a region around the gate electrode edge.
(3) Ion implantation damage occurs only to an upper end of film stack 18 exposed on the side surface (i.e., the surface lying on the first impurity diffusion region side) of gate electrode 1 and does not occur to the portion of the charge accumulating layer located adjacent drain region 6 and therearound, it is possible to effectively obviate the effect of detects in the film stack caused by the ion implantation step for forming the source region and the drain region.

In the manner described above, the nonvolatile storage device according to the second exemplary embodiment can be manufactured.

Third Exemplary Embodiment

Nonvolatile Storage Device

Figure 11:
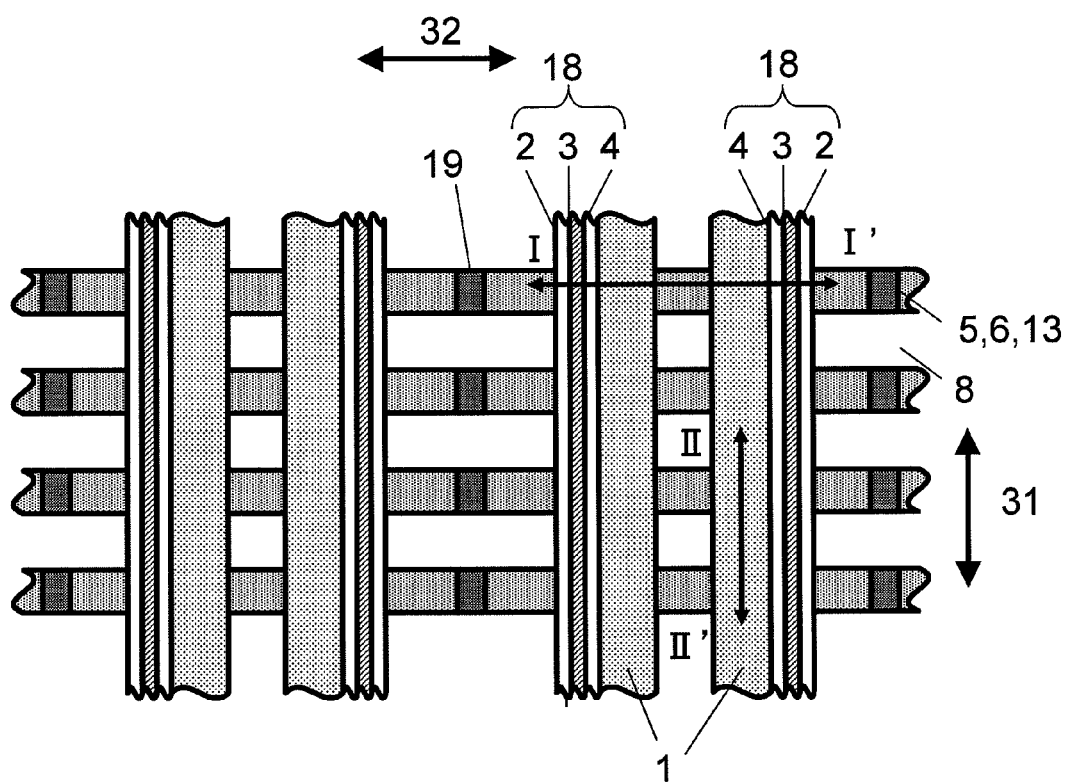
FIG. 11 is a top view illustrating one exemplary nonvolatile storage device according to the present invention.
Figure 12:
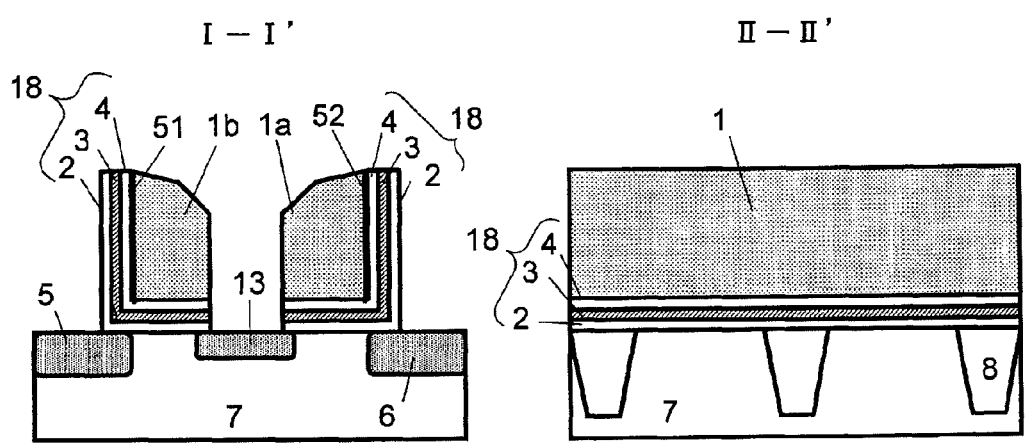
FIG. 12 is an illustration including a I-I' sectional view and a II-II' sectional view of the nonvolatile storage device illustrated in FIG. 11.

FIGS. 11 and 12 illustrate trap type memory (i.e., nonvolatile storage device) according to a third exemplary embodiment. FIG. 11 is a top view of the trap type memory according to the third exemplary embodiment, and FIG. 12 illustrates sectional views of the trap type memory according to the present invention taken along line I-I' and line II-II' of FIG. 12.

As shown in FIGS. 11 and 12, a pair of two line electrodes extending in predetermined direction 31 are provided on silicon substrate 7 provided with isolation regions 8. Such a plurality of pairs of line electrodes are provided on the semiconductor substrate. Drain region (i.e., impurity diffusion region B) 6, diffusion layer (i.e., impurity diffusion region A) 13 and source region (i.e., impurity diffusion region C) 5 are provided in silicon substrate 7 in a line and arranged as opposed to each other in direction 32 perpendicular to direction 31 in which the line electrodes extend. Diffusion layer 13 is a shallower region than source/drain regions 5 and 6. Drain region 6 and diffusion layer 13 are provided in the semiconductor substrate so as to be opposed to each other sandwiching one line electrode in direction 32 perpendicular to direction 31 in which the line electrode extends, while source region 5 and diffusion layer 13 are provided in the semiconductor substrate so as to be opposed to each other sandwiching another line electrode in direction 32 perpendicular to direction 31 in which the line electrode extends.

Drain region 6, diffusion layer 13 and source region 5 are formed so as to partially overlap film stack 18 (i.e., such that drain region 6, diffusion layer 13 and source region 5 are partially in contact with film stack 18). Source/drain regions 5 and 6 are provided thereon with respective contacts so as to allow voltage to be applied thereto, and the contacts are electrically connected to a wiring layer.

In each of these pairs of line electrodes, a portion sandwiched between drain region 6 and diffusion layer 13 and a portion sandwiched between source region 5 and diffusion layer 13 form first gate electrode 1*a* and second gate electrode 1*b*, respectively. These gate electrodes 1*a* and 1*b* include side surfaces extending vertically to the plane direction of semiconductor substrate 7. Each of first gate electrode 1*a* and second gate electrode 1*b* is provided with film stack (i.e., stacked films) 18 extending from between the gate electrode and the semiconductor substrate onto a side surface of the gate electrode extending vertically to the plane direction of the semiconductor substrate. That is, film stack 18 provided on first gate electrode 1*a* is extended along a side surface (i.e., the surface lying on impurity diffusion region B side; the surface depicted by wide line 52 of FIG. 12) of gate electrode 1 at a gate electrode 1 edge located adjacent drain region 6 formed in the silicon substrate and is terminated at a location vertically spaced apart from silicon substrate 7.

Film stack 18 provided on second gate electrode 1*b* is extended along a side surface (i.e., the surface lying on impurity diffusion region C side; the surface depicted by wide line 51 of FIG. 12) of gate electrode 1 at a gate electrode 1 edge located adjacent source region 5 formed in the silicon substrate and is terminated at a location vertically spaced apart from silicon substrate 7. Film stacks 18 each include second insulating film (i.e., insulating film B) 4, charge accumulating layer 3 and first insulating film (i.e., tunnel insulating film) 2 sequentially from the gate electrode side (i.e., the side closer to the gate electrode).

Method of Operation

In the present exemplary embodiment, hot electrons are generated by application of positive voltage to gate electrode 1 and drain region 6 in accumulating charge in a portion of the charge accumulating layer located adjacent drain region 6. On the other hand, in accumulating charge in a portion of the charge accumulating layer located adjacent source region 5, positive voltage is applied to gate electrode 1 and source region 5. In reading whether or not charge is accumulated in the portion of the charge accumulating layer located adjacent drain region 6, the value of a source current obtained when positive voltage is applied to source region 5 and gate electrode 1 is monitored. In reading whether or not charge is accumulated in the portion of the charge accumulating layer located adjacent source region 5, the value of a drain current obtained when positive voltage is applied to drain region 6 and gate electrode 1 is monitored.

In a condition in which electrons are accumulated in the portions of the charge accumulating layer each located adjacent a respective one of drain region 6 and source region 5, a flat-band of a charge accumulating region shifts toward the positive side, which makes it difficult for current to pass as compared with a condition in which electrons are not accumulated in the portions of the charge accumulating layer each located adjacent a respective one of drain region 6 and source region 5. Storage of information becomes possible by binarizing the condition in which passage of current is difficult and the condition in which passage of current is easy. In order to erase stored information, either process (a) including applying negative voltage to the gate electrode to remove electrons from the charge accumulating layer by utilizing a Fowler-Nordheim (FN) type tunnel current or process (b) including applying negative voltage to the gate electrode and positive voltage to the drain and source regions to inject holes generated by interband tunneling in the substrate into the charge accumulating layer, thereby neutralizing electrons present in the charge accumulating layer, is simply carried out.

Figure 13:
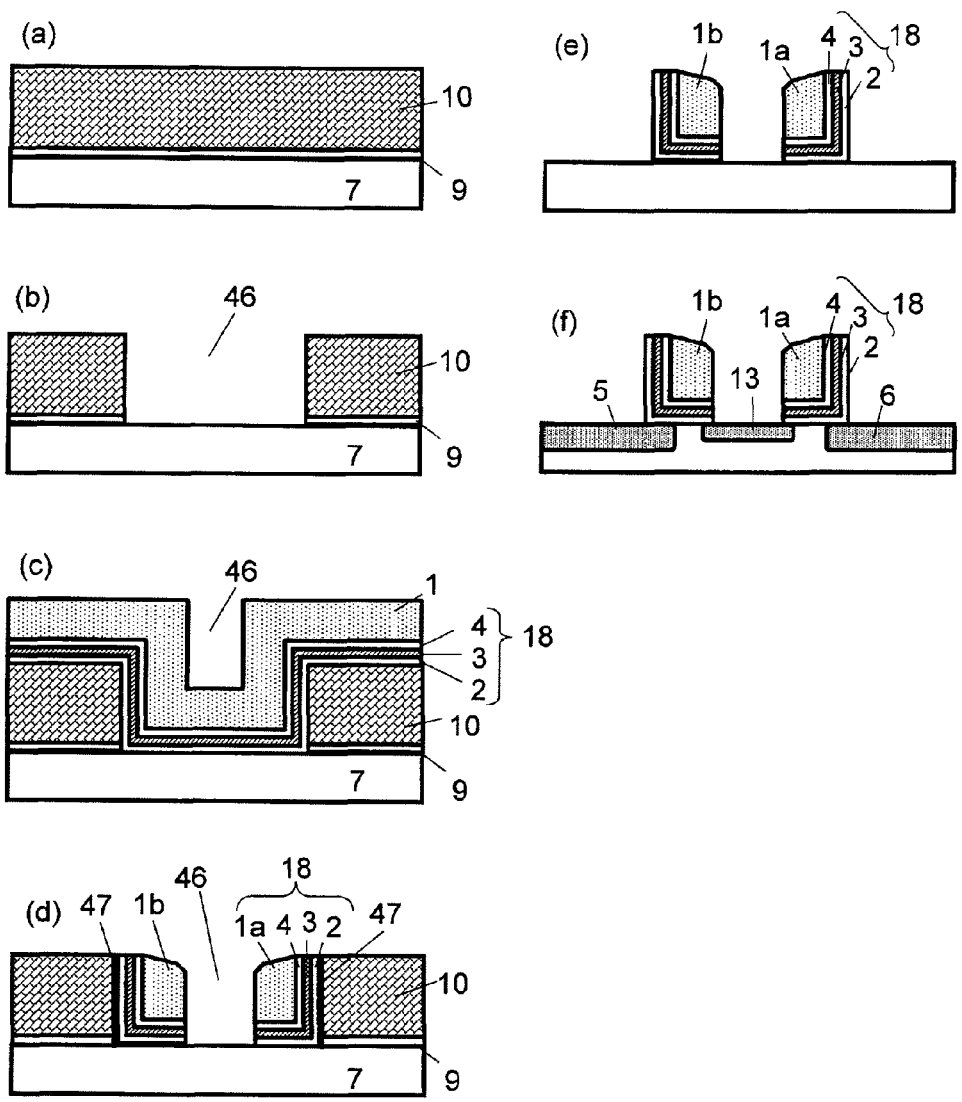
FIG. 13 includes top views illustrating one exemplary method for manufacturing the nonvolatile storage device illustrated in FIGS. 11 and 12.
Figure 14:
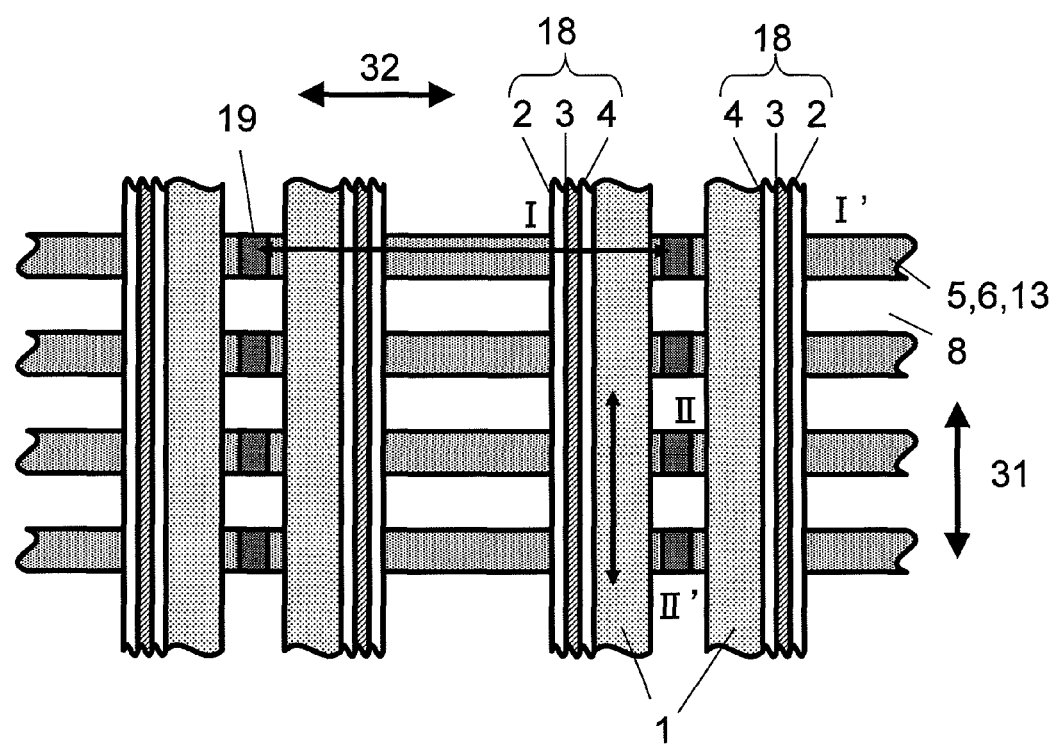
FIG. 14 is a top view illustrating one exemplary nonvolatile storage device according to the present invention.

In the nonvolatile storage device according to the present exemplary embodiment, even when the positions of source/drain contacts 19 shown in FIG. 11 are changed as shown in FIG. 14, the same effect can be obtained as the exemplary embodiment illustrated in FIGS. 11, 12 and 13 by modifying the method of charge writing and reading operations.

Figure 15:
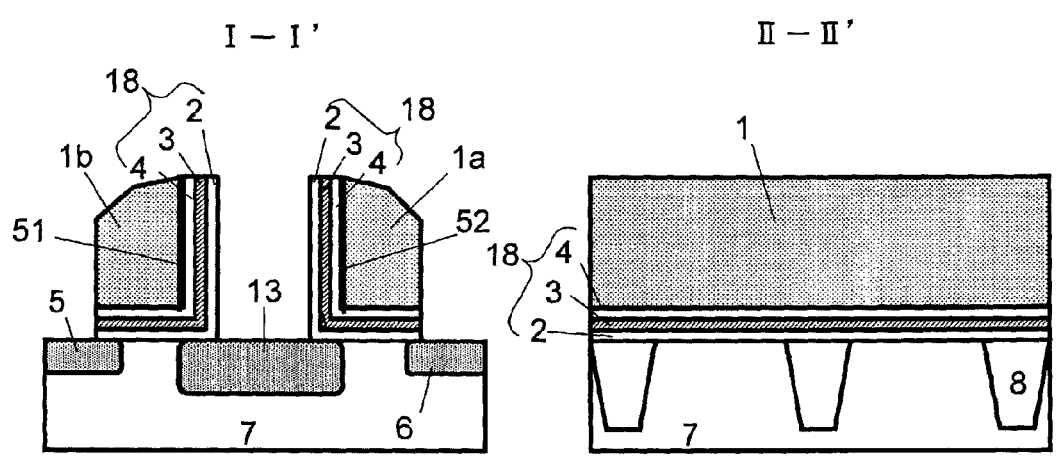
FIG. 15 is an illustration including a I-I' sectional view and a II-II' sectional view of the nonvolatile storage device illustrated in FIG. 14.

FIGS. 14 and 15 illustrate a variation of the present exemplary embodiment. This variation differs from the above-described exemplary embodiment in that there are provided a film stack extending from between the semiconductor substrate and the first electrode onto a surface of the first gate electrode lying on the impurity diffusion region A side and extending from between the semiconductor substrate and the second electrode onto a surface of the second gate electrode lying on the impurity diffusion region A side. FIG. 15 illustrates sectional views of the trap type memory taken along line I-I' and line II-II' of FIG. 14.

In the nonvolatile storage device illustrated in FIGS. 14 and 15, hot electrons can be generated in a portion of second gate electrode 1*b* located adjacent diffusion layer 13 by, for example, applying positive voltage between second gate electrode 1*b* on the source region 5 side and drain region 6 while applying larger positive voltage to gate electrode 1*a* on the drain region 6 side than the positive voltage applied between second gate electrode 1*b* and drain region 6. Thus, charge can be accumulated in a portion of the charge accumulating layer located adjacent a portion of the diffusion layer (second gate electrode 1b) on the source region 5 side. Reading whether or not charge is accumulated in the portion of the charge accumulating layer located adjacent the portion of diffusion layer 13 on the source region 5 side can be achieved by applying positive voltage between drain region 5 and gate electrodes 1a and 1b and monitoring the value of a drain current.

Effect of the Invention

The nonvolatile storage device according to the third exemplary embodiment has the following effect.
(1) The nonvolatile storage device includes two gate electrodes per memory cell and is capable of accumulating charge in the portions of the charge accumulating layer each located adjacent a respective one of source/drain regions 5 and 6 or in the portions of the charge accumulating layer located adjacent diffusion layer 13. As a result, the nonvolatile storage device enables the number of contacts to be reduced as compared with a 1 gate/cell device and hence allows the area per bit to be reduced.
(2) The charge accumulating layers extend from between the gate electrodes and the semiconductor substrate onto the side surfaces (i.e., (I) the surfaces of the first and second gate electrodes lying on the impurity diffusion region A side, or (II) the surface of the first gate electrode lying on the impurity diffusion region B side and the surface of the second gate electrode lying on the impurity diffusion region C side) of the gate electrodes. For this reason, the writing efficiency of accumulated charge is high.
(3) Since the end portion (i.e., the uppermost end of film stack 18 provided on the side surface of each gate electrode) of film stack 18, which is easily damaged by an etching process, is away from a portion at which hot electrons are injected, charge is not accumulated in that portion. For this reason, leakage current and leakage of retained charge caused by defects can be suppressed.
(4) Since the portion of film stack 18 extended onto the side surface of each gate electrode is positioned vertically to the semiconductor substrate, the area occupied by the device on the semiconductor substrate can be limited to a small area.
(5) The charge strength in each region around a source/drain region in writing can be maintained by making the impurity diffusion region which is intended for accumulation of charge relatively deep, while occurrence of the punchthrough phenomenon can be suppressed by making the impurity diffusion region which is not intended for accumulation of charge relatively shallow. As a result, the gate electrode length can be miniaturized without decreasing the writing speed.

Method for Manufacturing a Nonvolatile Storage Device

Brief description will be made of a method for manufacturing the trap type memory according to the present exemplary embodiment. FIG. 13 is an illustration of the trap type memory manufacturing method according to the third exemplary embodiment, in sectional views corresponding to the sectional view taken along line I-I' of FIG. 12.

Initially, as shown in FIG. 13(a), pad oxide film (i.e., sacrificed oxidation film) 9 was formed by oxidizing the surface of p-type silicon substrate 7 in an oxygen atmosphere diluted with nitrogen. Thereafter, dummy film 10 was formed over pad oxide film 9. Here, a low-density CVD (Chemical Vapor Deposition) nitride film was used as the dummy film.

Provided that an ion implantation profile to be obtained by a later ion implantation step for forming source/drain regions conforms to a normal distribution described by central depth Rp and variance σ, it is desirable that the height of film stack 18 on the side surface of each of gate electrodes 1a and 1b be at least (Rp+3σ) in order to avoid damage to a region around the charge accumulating layer. The height of film stack 18 on the side surface of each of gate electrodes 1a and 1b is determined by the sum total of the thicknesses of pad oxide film 9 and dummy film 10 and the amount of retrogradation of the upper end portion of film stack 18 formed on the side surface of each gate electrode caused by an etching process. Therefore, the total thickness of pad oxide film 9 and dummy film 10 is preferably preset to a value of not less than (Rp+3σ).

Thereafter, as shown in FIG. 13(b), a reflection preventive film and a resist film (not shown either) were deposited over dummy film 10 and then patterned by exposure and development. Thereafter, dummy film 10 and pad oxide film 9 were subjected to etching using a dry etcher to form opening portion 46 exposing a predetermined portion of the substrate. Thereafter, the reflection preventive film and the resist film were removed by a wet process.

Subsequently, as shown in FIG. 13(c), oxide film (i.e., tunnel insulating film material) 2 and nitride film (i.e., charge accumulating layer material) 3 were sequentially deposited over the entire wafer surface by using a CVD process. Further, oxide film (i.e., insulating film B material) 4 was formed by oxidizing an upper portion of nitride film 3 by ISSG (In Situ Steam Generation). Subsequently, phosphorus-doped silicon film (i.e., gate electrode material) 1 was deposited over oxide film 4 by using a CVD process.

Thereafter, as shown in FIG. 13(d), phosphorus-doped silicon film 1, oxide film 4, nitride film 3 and oxide film 2 were etched back by dry etching to form a structure comprising gate electrode 1a or 1b, oxide film 4, nitride film 3 and oxide film 2 on each of sidewalls (i.e., opposite side surfaces 47 of opening portion 46 depicted by the wide lines) of dummy film 10. Subsequently, as shown in FIG. 13(e), dummy film 10 and pad oxide film 9 were selectively removed by using a high selective ratio etching condition. Subsequently, as shown in FIG. 13(f), n-type impurities were vertically ion-implanted into an exposed portion of the semiconductor substrate in a manner self-aligned with gate electrodes 1a and 1b. Thereafter, an activation process was carried out to activate source region 5, drain region 6 and diffusion layer 13 which partially overlapped (i.e., which were partially in contact with) gate electrodes 1a and 1b.

The manufacturing method according to the present exemplary embodiment has the following effect.
(1) Film stack 18 on the side surface of each of gate electrodes 1a and 1b functions as a spacer during ion implantation. For this reason, it is possible to simplify the process.
(2) Since the step of oxidizing a sidewall for spacer, which has been conventionally required, can be eliminated, it is possible to avoid the bird's beak phenomenon which occurs at a gate electrode edge, thereby to prevent the yield from lowering due to an increase in defect density in a region around the gate electrode edge.
(3) Since ion implantation damage occurs only to upper portions of film stacks 18 exposed on the side surfaces (i.e., the surfaces lying on the impurity diffusion region A side or the surfaces lying on the impurity diffusion region B side and on the impurity diffusion region C side) of the gate electrodes and does not occur to the portions of the charge accumulating layer each located adjacent a respective one of drain region 6, source region 5 and diffusion layer 13 and therearound. For this reason, it is possible to effectively obviate the effect of detects in the film stacks caused by the ion implantation step for forming the source region and the drain region.

In the manner described above, the nonvolatile storage device according to the third exemplary embodiment can be manufactured.

Fourth Exemplary Embodiment

Figure 16:
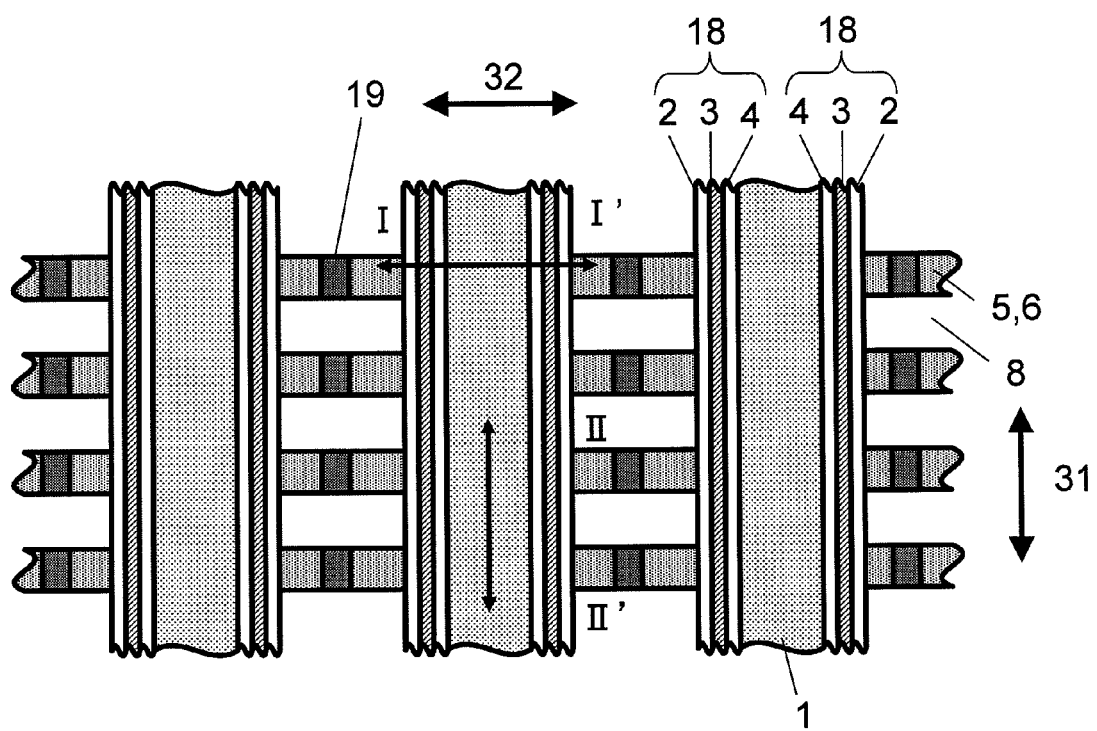
FIG. 16 is a top view illustrating one exemplary nonvolatile storage device according to the present invention.
Figure 17:
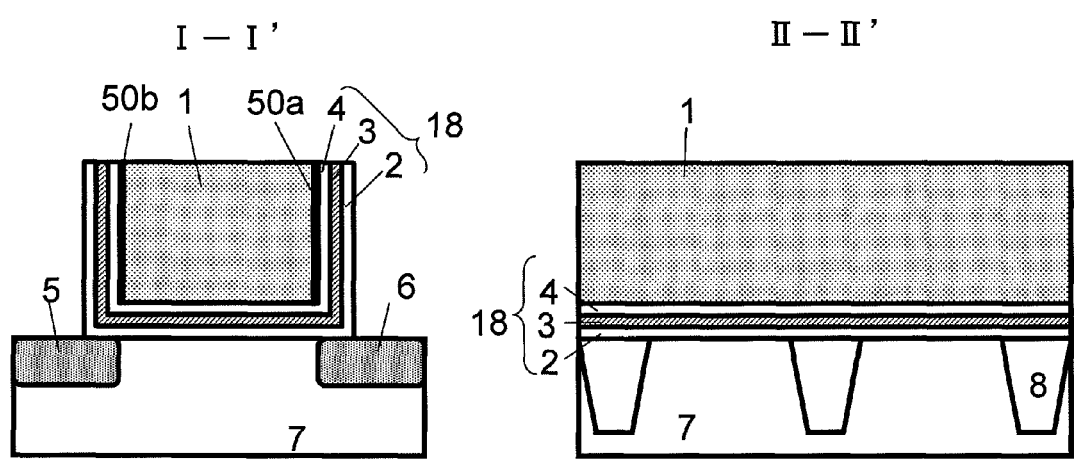
FIG. 17 is an illustration including a I-I' sectional view and a II-II' sectional view of the nonvolatile storage device illustrated in FIG. 16.

FIGS. 16 and 17 illustrate trap type memory (i.e., nonvolatile storage device) according to a fourth exemplary embodiment. FIG. 16 is a top view of the trap type memory according to the fourth exemplary embodiment, and FIG. 17 includes sectional views of the trap type memory according to the present exemplary embodiment taken along line I-I' and line II-II' of FIG. 16.

As shown in FIG. 16, a plurality of line electrodes extending in predetermined direction 31 are provided on silicon substrate 7 provided with isolation regions 8. Each of the line electrodes includes two side surfaces extending vertically to the plane direction of semiconductor substrate 7. Film stack 18 is provided which extends from one side surface (i.e., the surface lying on the first impurity diffusion region side; the surface depicted by wide line 50a of FIG. 17) of each line electrode, through region between the line electrode and the semiconductor substrate, to the other side surface (i.e., the surface lying on the second impurity diffusion region side; the surface depicted by wide line 50b of FIG. 17) of the line electrode.

Drain region 6 and source region 5 are provided in silicon substrate 7 so as to be opposed to each other in direction 32 perpendicular to direction 31 in which the line electrodes extend. Drain region 6 and source region 5 are formed so as to partially overlap film stack 18 (i.e., such that drain region 6 and source region 5 is partially in contact with film stack 18).

In the present exemplary embodiment, for convenience's sake, drain region 6 and source region 5 form the first impurity diffusion region and the second impurity diffusion region, respectively. (The present exemplary embodiment is configured to allow charge to be injected into either of the portions of the charge accumulating layer each located adjacent a respective one of the drain region or the source region by application of positive voltage between the gate electrode and the drain region or between the gate electrode and a source electrode. For this reason, drain region 6 and source region 5 may form the second impurity diffusion region and the first impurity diffusion region, respectively.) The source/drain regions 5 and 6 are provided thereon with respective contacts so as to allow voltage to be applied thereto, and the contacts are electrically connected to a wiring layer.

A portion of the line electrode which is sandwiched between drain region 6 and source region 5 forms a gate electrode including two side surfaces extending vertically to the plane direction of semiconductor substrate 7. Film stack (i.e., stacked films) 18 is formed so as to extend from one side surface (i.e., the surface lying on the first impurity diffusion region side) of the line electrode, through region between the line electrode and the semiconductor substrate, to the other side surface (i.e., the surface lying on the second impurity diffusion region side) of the line electrode. That is, film stack 18 is extended along the side surfaces of gate electrode 1 at gate electrode 1 edges each located adjacent a respective one of drain region 6 and source region 5 formed in the silicon substrate and is terminated at locations vertically spaced apart from silicon substrate 7. Film stack 18 includes second insulating film (i.e., insulating film B) 4, charge accumulating layer 3 and first insulating film (i.e., tunnel insulating film) 2 sequentially from the gate electrode side.

Method of Operation

In the present exemplary embodiment, when accumulating charge in the portion of the charge accumulating layer located adjacent drain region 6, hot electrons are generated by application of positive voltage to gate electrode 1 and drain region 6 to accumulate charge in the portion of the charge accumulating layer located adjacent drain region 6. Likewise, when accumulating charge in the portion of the charge accumulating layer located adjacent source region 5, positive voltage is applied to gate electrode 1 and source region 5 to accumulate charge in the portion of charge accumulating layer located adjacent source region 5.

In a condition in which electrons are accumulated in the portions of the charge accumulating layer each located adjacent a respective one of drain region 6 and source region 5, a flat-band of a charge accumulating region shifts toward the positive side, which makes it difficult for current to pass as compared with a condition in which electrons are not accumulated in the portions of the charge accumulating layer each located adjacent a respective one of drain region 6 and source region 5. Storage of information becomes possible by binarizing the condition in which passage of current is difficult and the condition in which passage of current is easy. In order to erase stored information, either process (a) including applying negative voltage to the gate electrode to remove electrons from the charge accumulating layer by utilizing a Fowler-Nordheim (FN) type tunnel current or process (b) including applying negative voltage to the gate electrode and positive voltage to the drain and source regions to inject holes generated by interband tunneling in the substrate into the charge accumulating layer, thereby neutralizing electrons present in the charge accumulating layer, is simply carried out.

Effect of the Invention

The nonvolatile storage device according to the fourth exemplary embodiment has the following effect.
(1) Since charge accumulates in not only the charge accumulating layer located adjacent drain region 6 but also the charge accumulating layer located adjacent source region 5, the area per bit can be reduced.
(2) Since the charge accumulating layer extends from between gate electrode 1 and the semiconductor substrate onto the side surfaces (i.e., the surfaces lying on the first impurity diffusion region side and on the second impurity diffusion region side) of the gate electrode, the writing efficiency of accumulated charge is high.
(3) Since the end portions (i.e., the uppermost ends of film stack 18 provided on the surfaces of the gate electrode lying on the first impurity diffusion region side and on the second impurity diffusion region side) of film stack 18, which are easily damaged by an etching process, are away from portions at which hot electrons are injected, charge is not accumulated in those portions. For this reason, leakage current and leakage of retained charge caused by defects can be suppressed.
(4) Since the portions of film stack 18 extended onto the side surfaces of the gate electrode are positioned vertically to the semiconductor substrate, the area occupied by the device on the semiconductor substrate can be limited to a small area.

Method for Manufacturing a Nonvolatile Storage Device

Figure 18:
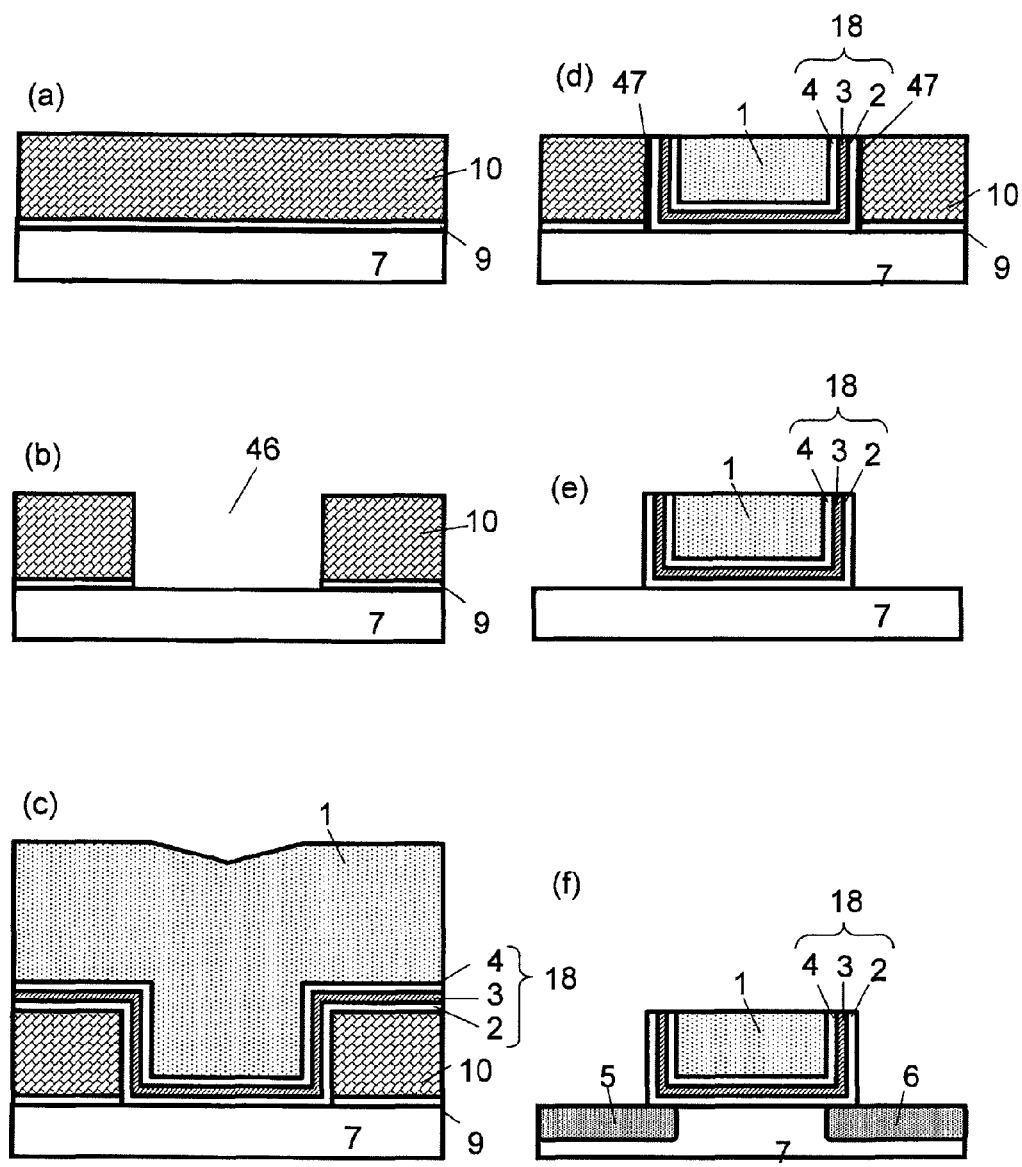
FIG. 18 includes top views illustrating one exemplary method for manufacturing the nonvolatile storage device illustrated in FIGS. 16 and 17.

Brief description will be made of a method for manufacturing the trap type memory according to the present exemplary embodiment. FIG. 18 is an illustration of the trap type memory manufacturing method according to the fourth exemplary embodiment, in sectional views corresponding to the sectional view taken along line I-I' of FIG. 16.

Initially, as shown in FIG. 18(a), pad oxide film (i.e., sacrificed oxidation film) 9 was formed by oxidizing the surface of p-type silicon substrate 7 in an oxygen atmosphere diluted with nitrogen. Thereafter, dummy film 10 was formed over pad oxide film 9. Here, a low-density CVD (Chemical Vapor Deposition) nitride film was used as the dummy film.

Provided that an ion implantation profile to be obtained by a later ion implantation step for forming source/drain regions conforms to a normal distribution described by central depth Rp and variance σ, it is desirable that the height of film stack 18 on each side surface of gate electrode 1 be at least (Rp+3σ) in order to avoid damage to a region around the charge accumulating layer. The height of film stack 18 on each side surface of gate electrode 1 is determined by the sum total of the thicknesses of pad oxide film 9 and dummy film 10 and the amount of retrogradation of the upper end portion of film stack 18 formed on each side surface of gate electrode 1 caused by an etching process. Therefore, the total thickness of pad oxide film 9 and dummy film 10 is preferably preset to a value of not less than (Rp+3σ).

Thereafter, as shown in FIG. 18(*b*), a reflection preventive film and a resist film (not shown either) were deposited over dummy film 10 and then patterned by exposure and development. Thereafter, dummy film 10 and pad oxide film 9 were subjected to etching using a dry etcher to form opening portion 46 exposing a predetermined portion of the substrate. Thereafter, the reflection preventive film and the resist film were removed by a wet process.

Subsequently, as shown in FIG. 18(*c*), oxide film (i.e., tunnel insulating film material) 2 and nitride film (i.e., charge accumulating layer material) 3 were sequentially deposited over the entire wafer surface by using a CVD process. Further, oxide film (i.e., insulating film B material) 4 was formed by oxidizing an upper portion of nitride film 7 by ISSG (In Situ Steam Generation). Subsequently, phosphorus-doped silicon film (i.e., gate electrode material) 1 was deposited over oxide film 4 by using a CVD process. The thickness of phosphorus-doped silicon film 1 thus deposited was made larger than the total thickness of dummy film 10 and pad oxide film 9.

Subsequently, as shown in FIG. 18(*d*), upper portions of respective of phosphorus-doped silicon film 1, oxide film 4, nitride film 3 and oxide film 2 were removed by polishing using CMP (Chemical Mechanical Polishing) until a surface of dummy film 10 became exposed. By so doing, a structure comprising gate electrode 1, oxide film 4, nitride film 3 and oxide film 2 was formed on each of sidewalls (i.e., opposite side surfaces of opening portion 46 depicted by wide line 47) of dummy film 10. Thereafter, as shown in FIG. 18(*e*), dummy film 10 and pad oxide film 9 were selectively removed by using a high selective ratio etching condition. Subsequently, as shown in FIG. 18(*f*), n-type impurities were vertically ion-implanted into an exposed portion of the semiconductor substrate in a manner self-aligned with gate electrode 1. Thereafter, an activation process was carried out to activate source region 5 and drain region 6 which partially overlapped (i.e., which were partially in contact with) gate electrode 1.

The manufacturing method according to the present exemplary embodiment has the following effect.
(1) Since film stack 18 on the side surfaces (i.e., the surfaces lying on the first impurity diffusion region side and on the second impurity diffusion region side) of gate electrode 1 functions as a spacer during ion implantation, it is possible to simplify the process. (2) Since the step of oxidizing a sidewall for spacer, which has been conventionally required, can be eliminated, it is possible to avoid the bird's beak phenomenon which occurs at a gate electrode edge, thereby to prevent the yield from lowering due to an increase in defect density in a region around the gate electrode edge.
(3) Ion implantation damage occurs only to upper portions of film stack 18 exposed on the side surfaces of gate electrode 1 and does not occur to the portions of the charge accumulating layer each located adjacent a respective one of drain region 6 and source region 5 and therearound. For this reason, it is possible to effectively obviate the effect of detects in the film stack caused by the ion implantation step for forming the source region and the drain region.

In the manner described above, the nonvolatile storage device according to the fourth exemplary embodiment can be manufactured.

Fifth Exemplary Embodiment

Figure 19:
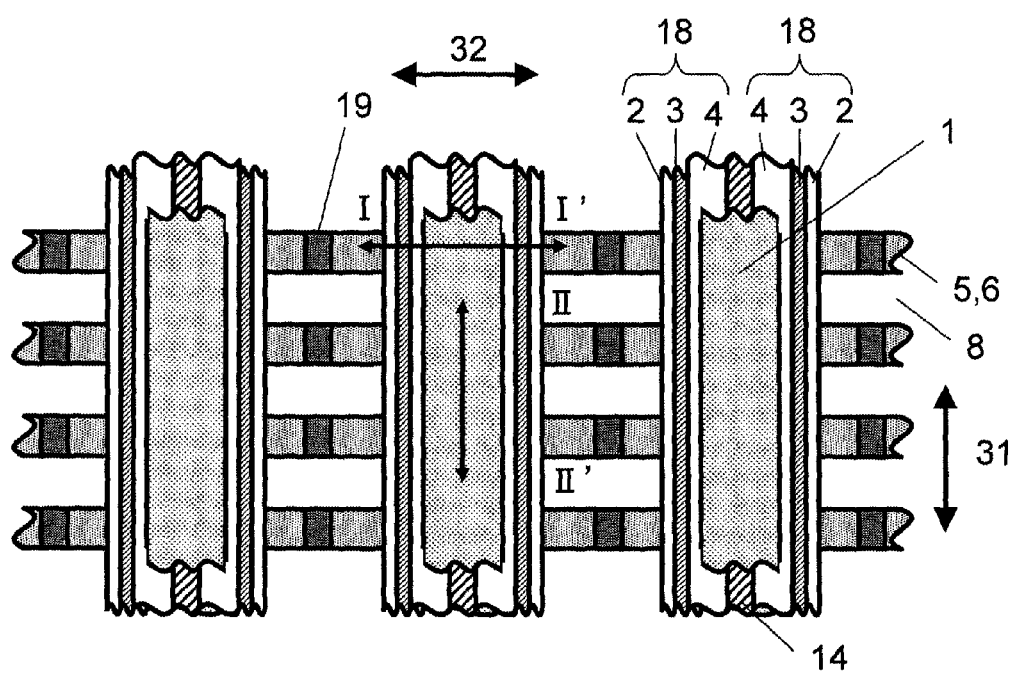
FIG. 19 is a top view illustrating one exemplary nonvolatile storage device according to the present invention.
Figure 20:
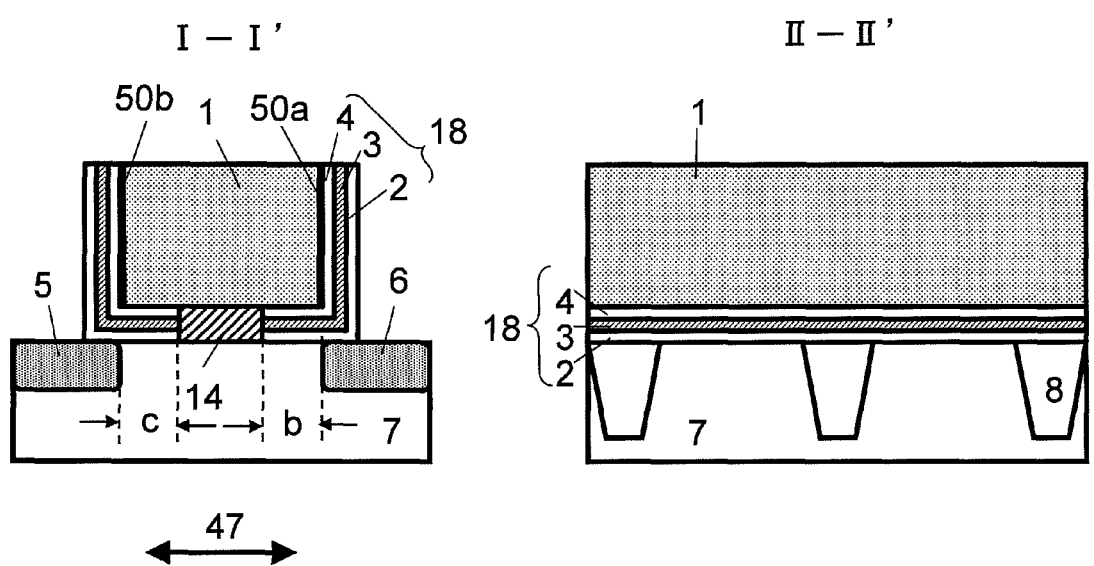
FIG. 20 is an illustration including a I-I' sectional view and a II-II' sectional view of the nonvolatile storage device illustrated in FIG. 19.

FIGS. 19 and 20 illustrate trap type memory (i.e., nonvolatile storage device) according to a fifth exemplary embodiment. FIG. 19 is a top view of the trap type memory according to the fifth exemplary embodiment, and FIG. 20 includes sectional views of the trap type memory according to the present exemplary embodiment taken along line I-I' and line II-II' of FIG. 19.

As shown in FIGS. 19 and 20, a plurality of line electrodes extending in predetermined direction 31 are provided on silicon substrate 7 provided with isolation regions 8. Drain region 6 and source region 5 are provided in silicon substrate 7 so as to be opposed to each other in direction 32 perpendicular to direction 31 in which the line electrodes extend. Drain region 6 and source region 5 are formed so as to partially overlap film stack 18 (i.e., such that drain region 6 and source region 5 are partially in contact with film stack 18). In the present exemplary embodiment, for convenience's sake, drain region 6 and source region 5 form the first impurity diffusion region and the second impurity diffusion region, respectively. (The present exemplary embodiment is configured to allow charge to be injected into either of the portions of the charge accumulating layer each located adjacent a respective one of the drain region or the source region by application of positive voltage between the gate electrode and the drain region or between the gate electrode and a source electrode. For this reason, drain region 6 and source region 5 may form the second impurity diffusion region and the first impurity diffusion region, respectively.)

A portion of each line electrode which is sandwiched between drain region 6 and source region 5 forms a gate electrode including two side surfaces extending vertically to the plane direction of semiconductor substrate 7. Film stack 18 is formed so as to extend from surface 50*a* (i.e., the surface depicted by wide line 50*a* of FIG. 20) of the gate electrode lying on the first impurity diffusion region side, through between the gate electrode and the semiconductor substrate, to surface 50*b* (i.e., the surface depicted by wide line 50*b* of FIG. 20) of the gate electrode lying on the second impurity diffusion region side. That is, film stack 18 is extended along the side surfaces of gate electrode 1 at gate electrode 1 edges each located adjacent a respective one of drain region 6 and source region 5 formed in the silicon substrate and is terminated at locations vertically spaced apart from silicon substrate 7.

A portion of film stack 18 which is present at a location immediately above each of drain region 6 and source region 5 and therearound includes second insulating film (i.e., insulating film B) 4, charge accumulating layer 3 and first insulating film (i.e., tunnel insulating film) 2 sequentially from the gate electrode side. A portion of film stack 18 spaced apart from the portions each located adjacent a respective one of drain region 6 and source region 5 comprises insulating film (i.e., insulating film A) 14 having a lower charge surface trap density than the portion of charge accumulating layer 3 which is present immediately above each of drain region 6 and source region 5 or containing absolutely no charge trap. That is, insulating film 14 has fewer charge traps per unit volume than the portions of the charge accumulating layer present on the surfaces lying on the first impurity diffusion region side and on the second impurity diffusion region side or fails to function as a charge accumulating layer. Insulating film 14 is formed so as to be present throughout the entire thickness of the portion of the film stack sandwiched between the gate electrode and the semiconductor substrate and to fail to come into contact with the first and second impurity diffusion regions (i.e., fail to be present on the first and second impurity diffusion regions).

Preferably, insulating film 14 is absent in a region immediately above drain region 6 and therearound and a region immediately above source region 5 and therearound, which accumulate charge by hot electron injection. Specifically, each of the spacing (i.e., spacing b in FIG. 20) between an edge portion of drain region 6 and insulating film 14 and the spacing (i.e., spacing c in FIG. 20) between an edge portion of source region 5 and insulating film 14 in the direction (i.e., the direction indicated by arrow 47 of FIG. 6) in which the source/drain regions are opposed to each other, is preferably not less than 30 nm, more preferably not less than 35 nm, further preferably not less than 40 nm. From the viewpoint of device miniaturization, each of spaces b and c is preferably not more than 60 nm, more preferably not more than 55 nm, further preferably not more than 50 nm. Insulating film 14 is joined to the three layers: second insulating film (i.e., insulating film B) 4, charge accumulating layer 3 and first insulating film (i.e., tunnel insulating film) 3, at intermediate points on the channel region of the semiconductor substrate.

Method of Operation

In the present exemplary embodiment, when accumulating charge in the portion of the charge accumulating layer located adjacent drain region 6, hot electrons are generated by application of positive voltage to gate electrode 1 and drain region 6 to accumulate charge in the portion of the charge accumulating layer located adjacent drain region 6. Likewise, when accumulating charge in the portion of the charge accumulating layer located adjacent source region 5, positive voltage is applied to gate electrode 1 and source region 5 to accumulate charge in the portion of the charge accumulating layer located adjacent source region 5.

Reading whether or not charge is accumulated in the portion of the charge accumulating layer located adjacent drain region 6 can be achieved by monitoring the value of a source current obtained when positive voltage is applied to source region 5 and gate electrode 1. Likewise, reading whether or not charge is accumulated in the portion of the charge accumulating layer located adjacent source region 5 can be achieved by monitoring the value of a drain current obtained when positive voltage is applied to drain region 6 and gate electrode 1.

In a condition in which electrons are accumulated in the portions of the charge accumulating layer each located adjacent a respective one of drain region 6 and source region 5, a flat-band of a charge accumulating region shifts toward the positive side, which makes it difficult for current to pass as compared with a condition in which electrons are not accumulated in the portions of the charge accumulating layer each located adjacent a respective one of drain region 6 and source region 5. Storage of information becomes possible by binarizing the condition in which passage of current is difficult and the condition in which passage of current is easy. In order to erase stored information, either process (a) including applying negative voltage to the gate electrode to remove electrons from the charge accumulating layer by utilizing a Fowler-Nordheim (FN) type tunnel current or process (b) including applying negative voltage to the gate electrode and positive voltage to the drain and source regions to inject holes generated by interband tunneling in the substrate into the charge accumulating layer, thereby neutralizing electrons present in the charge accumulating layer, is simply carried out.

Effect of the Invention

The nonvolatile storage device according to the fifth exemplary embodiment has the following effect.
(1) Since charge accumulates in not only the charge accumulating layer located adjacent drain region 6 but also the charge accumulating layer located adjacent source region 5, the area per bit can be reduced.
(2) Insulating film 14 blocks diffusion of charge from one of the portions of the charge accumulating layer each located adjacent a respective one of drain region 6 and source region 5 to the other portion. For this reason, the charge retention properties can be improved.
(3) The charge accumulating layer extends from between gate electrode 1 and the semiconductor substrate onto the both side surfaces (i.e., the surfaces lying on the first impurity diffusion region side and on the second impurity diffusion region side) of the gate electrode. For this reason, the writing efficiency of accumulated charge is high.
(4) Since the end portions (i.e., the uppermost ends of film stack 18 provided on the surfaces of the gate electrode lying on the first impurity diffusion region side and on the second impurity diffusion region side) of film stack 18, which are easily damaged by an etching process, are away from portions at which hot electrons are injected, charge is not accumulated in those portions. For this reason, leakage current and leakage of retained charge caused by defects can be suppressed.
(5) Since the portions of film stack 18 extended onto the side surfaces (i.e., the surfaces of the gate electrode lying on the first impurity diffusion region side and on the second impurity diffusion region side) of the gate electrode are positioned vertically to the semiconductor substrate, the area occupied by the device on the semiconductor substrate can be limited to a small area.

Method for Manufacturing a Nonvolatile Storage Device

Figure 21:
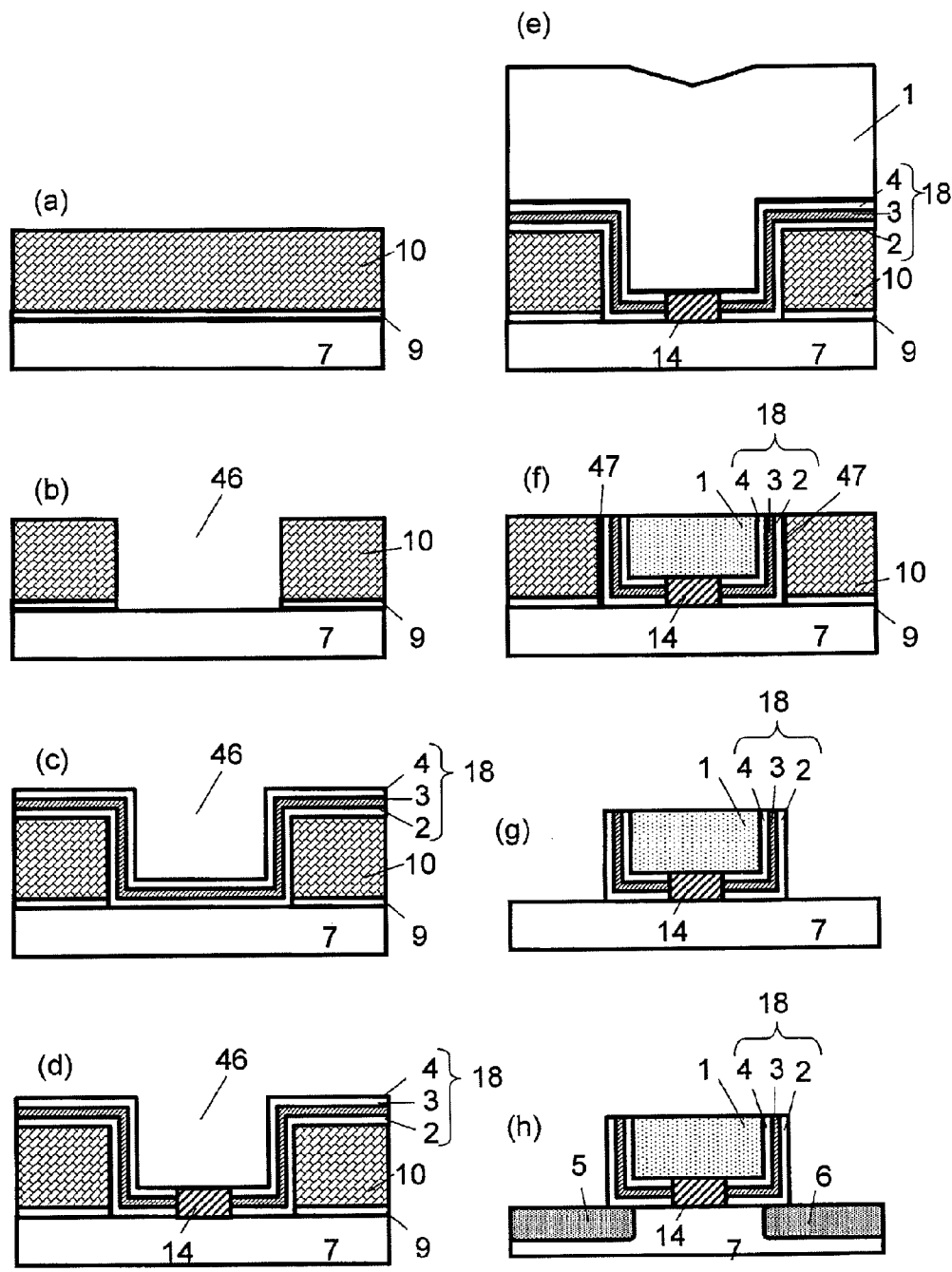
FIG. 21 includes top views illustrating one exemplary method for manufacturing the nonvolatile storage device illustrated in FIGS. 19 and 20.

Brief description will be made of a method for manufacturing the trap type memory according to the present exemplary embodiment. FIG. 21 is an illustration of the trap type memory manufacturing method according to the fifth exemplary embodiment, in sectional views corresponding to the sectional view taken along line I-I' of FIG. 20.

Initially, as shown in FIG. 21(a), pad oxide film (i.e., sacrificed oxidation film) 9 was formed by oxidizing the surface of p-type silicon substrate 7 in an oxygen atmosphere diluted with nitrogen. Thereafter, dummy film 10 was formed over pad oxide film 9. Here, a low-density CVD (Chemical Vapor Deposition) nitride film was used as the dummy film.

Provided that an ion implantation profile to be obtained by a later ion implantation step for forming source/drain regions conforms to a normal distribution described by central depth Rp and variance $\sigma$, it is desirable that the height of film stack 18 on each side surface of gate electrode 1 be at least (Rp+3$\sigma$) in order to avoid damage to a region around the charge accumulating layer. The height of film stack 18 on each side surface of gate electrode 1 is determined by the sum total of the thicknesses of pad oxide film 9 and dummy film 10 and the amount of retrogradation of the upper end portion of film stack 18 formed on each side surface of gate electrode 1 caused by an etching process. Therefore, the total thickness of pad oxide film 9 and dummy film 10 is preferably preset to a value of not less than (Rp+3σ).

Thereafter, as shown in FIG. 21(b), a reflection preventive film and a resist film (not shown either) were deposited over dummy film 10 and then patterned by exposure and development. Thereafter, dummy film 10 and pad oxide film 9 were subjected to etching using a dry etcher to form opening portion 46 exposing a predetermined portion of the substrate. Thereafter, the reflection preventive film and the resist film were removed by a wet process.

Subsequently, as shown in FIG. 21(c), oxide film (i.e., tunnel insulating film material) 2 and nitride film (i.e., charge accumulating layer material) 3 were sequentially deposited over the entire wafer surface by using a CVD process. Further, oxide film (insulating film B material) 4 was formed by oxidizing an upper portion of nitride film 3 by ISSG (In Situ Steam Generation). Subsequently, as shown in FIG. 21(d), annealing in an atmosphere containing $O_2$, $H_2O$, NO, $N_2O$ or an oxidizing radical was performed by masking with a patterned nitride film (not shown) leaving a central portion of film stack 18, thereby lowering the charge trap surface density of a portion of film stack 18 around the center of film stack (stacked films) 18.

After the annealing, the patterned mask nitride film was removed by high selectivity etching. Subsequently, as shown in FIG. 21(e), phosphorus-doped silicon film (i.e., gate electrode material) 1 was deposited over oxide film 4 by using a CVD process. The thickness of phosphorus-doped silicon film 1 thus deposited was made larger than the total thickness of dummy film 10 and pad oxide film 9.

Subsequently, as shown in FIG. 21(f), upper portions of respective of phosphorus-doped silicon film 1, oxide film 4, nitride film 3 and oxide film 2 were removed by polishing using CMP (Chemical Mechanical Polishing) until a surface of dummy film 10 became exposed. By so doing, a structure comprising gate electrode 1, oxide film 4, nitride film 3 and oxide film 2 was formed on each of sidewalls (i.e., opposite side surfaces of opening portion 46 depicted by wide lines 47) of dummy film 10.

Thereafter, as shown in FIG. 21(g), dummy film 10 and pad oxide film 9 were selectively removed by using a high selective ratio etching condition. Subsequently, as shown in FIG. 21(h), n-type impurities were vertically ion-implanted into an exposed portion of the substrate in a manner self-aligned with gate electrode 1. Thereafter, an activation process was carried out to activate source region 5 and drain region 6 which partially overlapped (i.e., which were partially in contact with) gate electrode 1.

The manufacturing method according to the present exemplary embodiment has the following effect.
(1) Since film stack 18 on the side surfaces of gate electrode 1 functions as a spacer during ion implantation, it is possible to simplify the process.
(2) Since the step of oxidizing a sidewall for spacer, which has been conventionally required, can be eliminated, it is possible to avoid the bird's beak phenomenon which occurs at a gate electrode edge, thereby to prevent the yield from lowering due to an increase in defect density in a region around the gate electrode edge.
(3) Ion implantation damage occurs only to upper portions of film stack 18 exposed on the side surfaces (i.e., the surfaces lying on the first impurity diffusion region side and on the second impurity diffusion region side) of gate electrode 1 and does not occur to the portions of the charge accumulating layer each located adjacent a respective one of drain region 6 and source region 5 and therearound. For this reason, it is possible to effectively obviate the effect of detects in the film stack caused by the ion implantation step for forming the source region and the drain region.

In the manner described above, the nonvolatile storage device according to the fifth exemplary embodiment can be manufactured.

Sixth Exemplary Embodiment

Nonvolatile Storage Device

Figure 22:
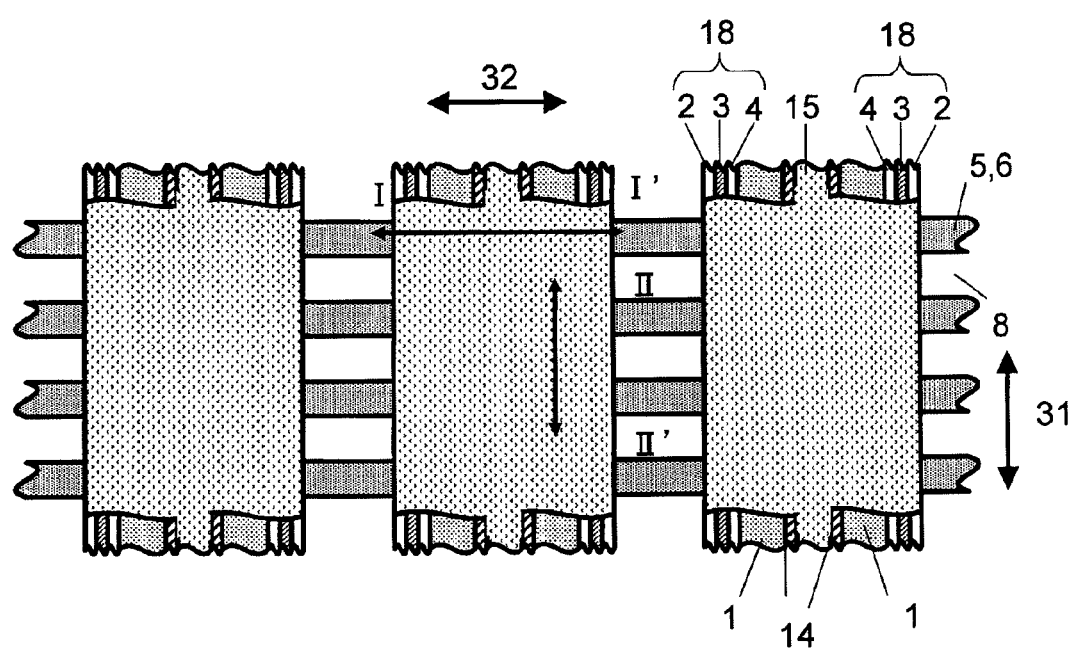
FIG. 22 is a top view illustrating one exemplary nonvolatile storage device according to the present invention.
Figure 23:
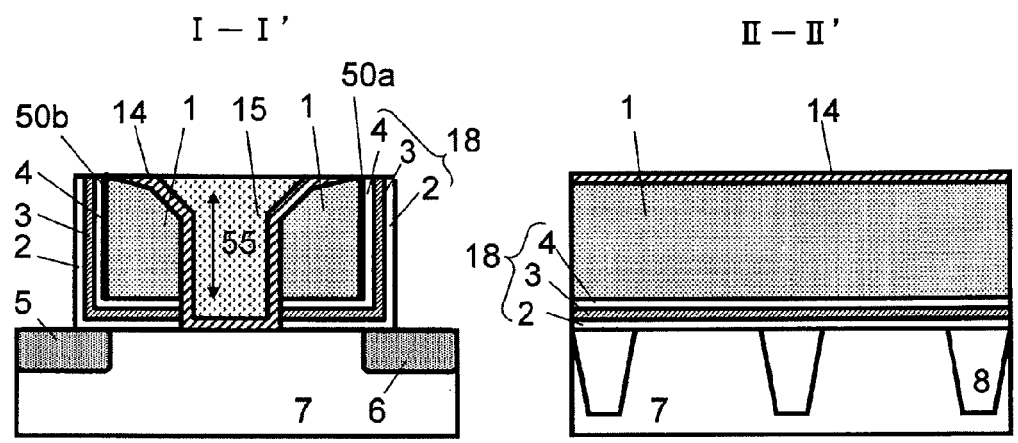
FIG. 23 is an illustration including a I-I' sectional view and a II-II' sectional view of the nonvolatile storage device illustrated in FIG. 22.

FIGS. 22 and 23 illustrate trap type memory (i.e., nonvolatile storage device) according to a sixth exemplary embodiment. FIG. 22 is a top view of the nonvolatile storage device, and FIG. 23 includes sectional views of the trap type memory taken along line I-I' and line II-II' of FIG. 22.

As shown in FIGS. 22 and 23, a plurality of line electrodes extending in predetermined direction 31 are provided on silicon substrate 7 provided with isolation regions 8. Drain region 6 and source region 5 are provided in silicon substrate 7 so as to be opposed to each other in direction 32 perpendicular to direction 31 in which the line electrodes extend. Drain region 6 and source region 5 are formed so as to partially overlap film stack 18 (i.e., such that drain region 6 and source region 5 are partially in contact with film stack 18). In the present exemplary embodiment, for convenience's sake, drain region 6 and source region 5 form the first impurity diffusion region and the second impurity diffusion region, respectively. (The present exemplary embodiment is configured to allow charge to be injected into either of the portions of the charge accumulating layer each located adjacent a respective one of the drain region or the source region by application of positive voltage between the gate electrode and the drain region or between the gate electrode and a source electrode. For this reason, drain region 6 and source region 5 may form the second impurity diffusion region and the first impurity diffusion region, respectively.)

A portion of each line electrode which is sandwiched between drain region 6 and source region 5 forms a gate electrode including two side surfaces extending vertically to the plane direction of semiconductor substrate 7. Film stack (i.e., stacked films) 18 is formed so as to extend from a first side surface (i.e., the surface lying on the first impurity diffusion region side; the surface depicted by wide line 50a of FIG. 23) of the line electrode, through between the line electrode and the semiconductor substrate, to a second side surface (i.e., the surface lying on the second impurity diffusion region side; the surface depicted by wide line 50b of FIG. 23) of the line electrode. That is, film stack 18 is extended along the side surfaces of gate electrode 1 at gate electrode 1 edges each located adjacent a respective one of drain region 6 and source region 5 formed in the silicon substrate and is terminated at locations vertically spaced apart from silicon substrate 7.

A portion of film stack 18 at a location immediately above each of drain region 6 and source region 5 and therearound includes second insulating film (i.e., insulating film B) 4, charge accumulating layer 3 and first insulating film (i.e., tunnel insulating film) 2 sequentially from the gate electrode side. Word gate 15 is provided on a central portion of a channel region so as to divide gate electrode 1 in direction 55 of the normal to the substrate. Insulating film 14 is provided between word gate 15 and gate electrode. Insulating film 14 includes fewer charge traps per unit volume than a portion of the charge accumulating layer present on the surface lying on the first impurity diffusion region side or fails to function as a charge accumulating layer.

In achieving effect of the present exemplary embodiment, the insulating films formed on the bottom surface and on the side surfaces of word gate 15 need not necessarily be the same. Different insulating films may be formed on the bottom surface and on the side surfaces of word gate 15.

Method of Operation

In the present exemplary embodiment, when accumulating charge in the portion of the charge accumulating layer located adjacent drain region 6, hot electrons are generated by application of positive voltage to word gate 15, gate electrode 1 and drain region 6 to accumulate charge in the portion of the charge accumulating layer located adjacent drain region 6. Likewise, when accumulating charge in the portion of the charge accumulating layer located adjacent source region 5, positive voltage is applied to word gate 15, gate electrode 1 and source region 5 to accumulate charge in the portion of the charge accumulating layer located adjacent source region 5.

Reading whether or not charge is accumulated in the portion of the charge accumulating layer located adjacent drain region 6 can be achieved by monitoring the value of a source current obtained when positive voltage is applied to source region 5, gate electrode 1 and word gate 15. Likewise, reading whether or not charge is accumulated in the portion of the charge accumulating layer located adjacent source region 5 can be achieved by monitoring the value of a drain current obtained when positive voltage is applied to drain region 6, gate electrode 1 and word gate 15.

In a condition in which electrons are accumulated in the portions of the charge accumulating layer each located adjacent a respective one of drain region 6 and source region 5, a flat-band of a charge accumulating region shifts toward the positive side, which makes it difficult for current to pass as compared with a condition in which electrons are not accumulated in the portions of the charge accumulating layer each located adjacent a respective one of drain region 6 and source region 5. Storage of information becomes possible by binarizing the condition in which passage of current is difficult and the condition in which passage of current is easy. In order to erase stored information, either process (a) including applying negative voltage to the gate electrode to remove electrons from the charge accumulating layer by utilizing a Fowler-Nordheim (FN) type tunnel current or process (b) including applying negative voltage to the gate electrode and positive voltage to the drain and source regions to inject holes generated by interband tunneling in the substrate into the charge accumulating layer, thereby neutralizing electrons present in the charge accumulating layer, is simply carried out.

Effect of the Invention

The nonvolatile storage device according to the sixth exemplary embodiment has the following effect.
(1) Since charge accumulates in not only the charge accumulating layer located adjacent drain region 6 but also the charge accumulating layer located adjacent source region 5, the area per bit can be reduced.
(2) Insulating film 14 including a low charge trap surface density or containing absolutely no charge trap blocks diffusion of charge from the portion of the charge accumulating layer located adjacent one of source/drain regions to the portion of the charge accumulating layer located adjacent the other. For this reason, the charge retention properties can be improved.
(3) In the reading operation, voltage is applied to the word gate to lower the channel resistance of a channel portion under the word gate, thereby making it possible to increase the reading current.
(4) Since the charge accumulating layer extends from between gate electrode 1 and the semiconductor substrate onto the side surfaces (i.e., the surfaces lying on the first impurity diffusion region side and on the second impurity diffusion region side) of the gate electrode, the writing efficiency of accumulated charge is high.
(5) Since the end portions (i.e., the uppermost ends of film stack 18 provided on the side surfaces of the gate electrode) of film stack 18, which are easily damaged by an etching process, are away from portions at which hot electrons are injected, charge is not accumulated in those portions. For this reason, leakage current and leakage of retained charge caused by defects can be suppressed.
(6) Since the portions of film stack 18 extended onto the side surfaces (i.e., the surfaces lying on the first impurity diffusion region side and on the second impurity diffusion region side) of the gate electrode are positioned vertically to the semiconductor substrate, the area occupied by the device on the semiconductor substrate can be limited to a small area.

Method for Manufacturing a Nonvolatile Storage Device

Figure 24:
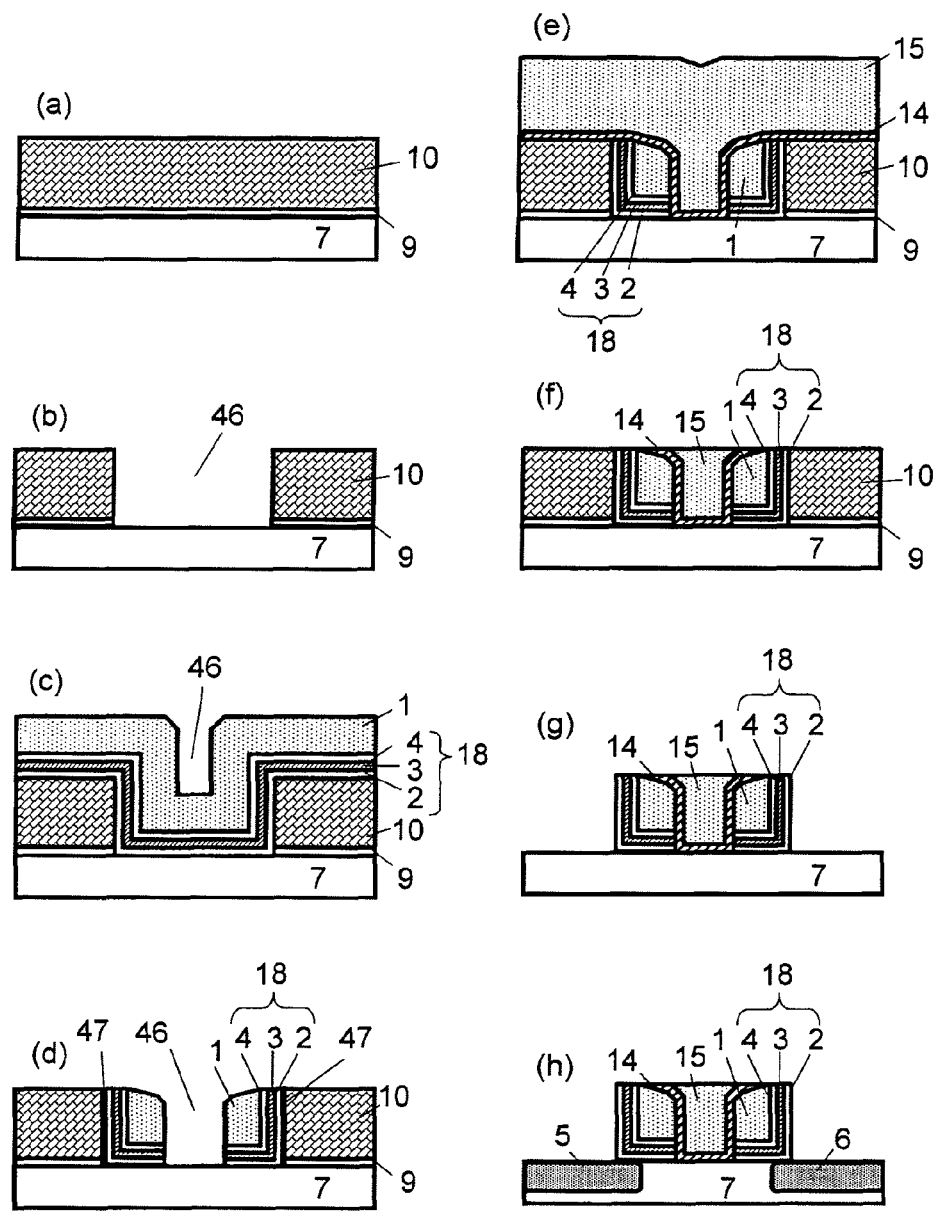
FIG. 24 includes top views illustrating one exemplary method for manufacturing the nonvolatile storage device illustrated in FIGS. 22 and 23.
Figure 25:
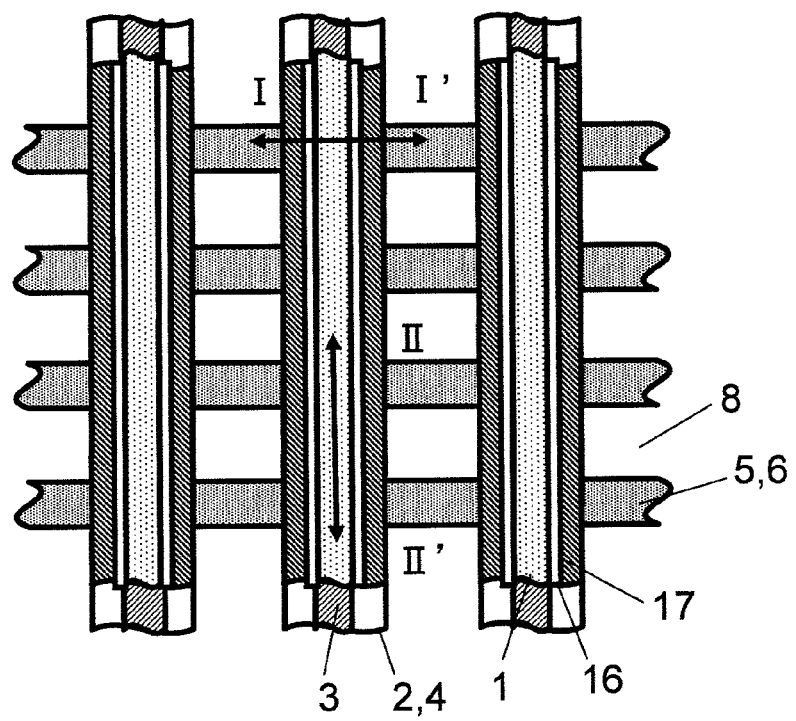
FIG. 25 is a top view illustrating one exemplary related nonvolatile storage device.
Figure 26:
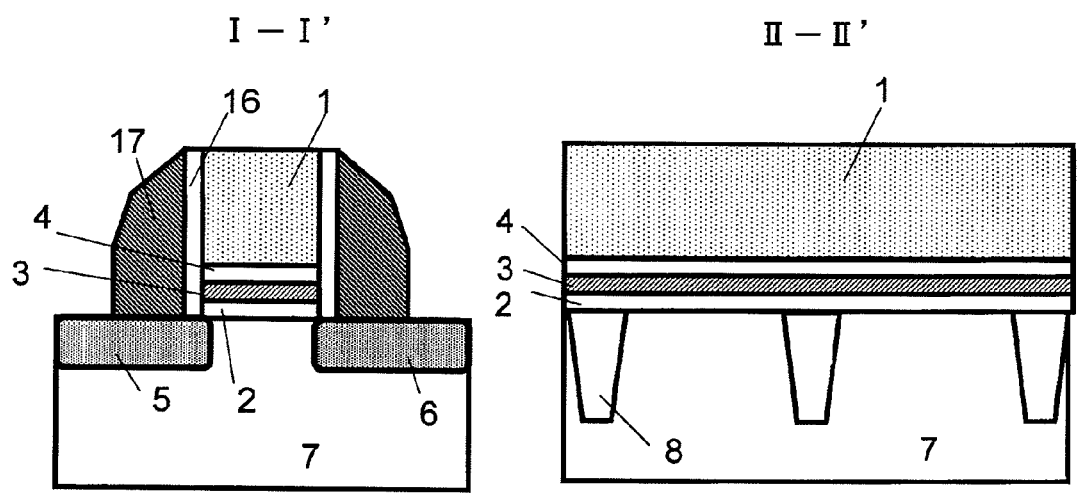
FIG. 26 is an illustration including a I-I' sectional view and a II-II' sectional view of the nonvolatile storage device illustrated in FIG. 25.
Figure 27:
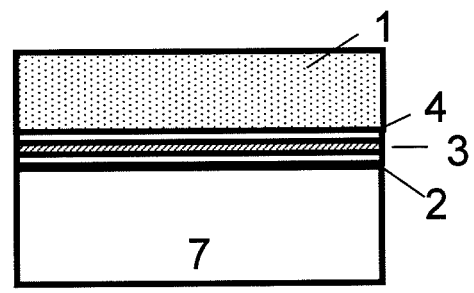
FIG. 27 includes top views illustrating one exemplary method for manufacturing the nonvolatile storage device illustrated in FIGS. 25 and 26.
Figure 27:
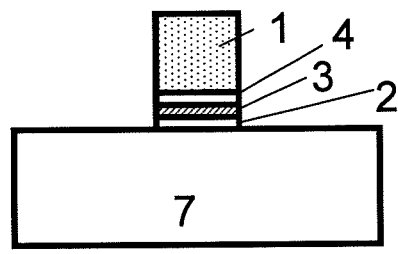
Figure 27:
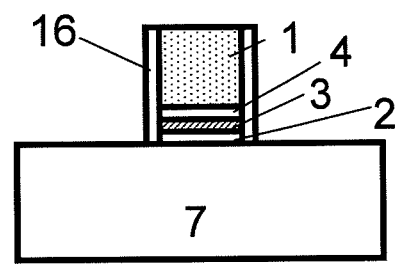
Figure 27:
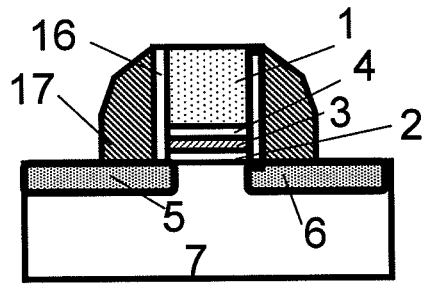
Figure 28:
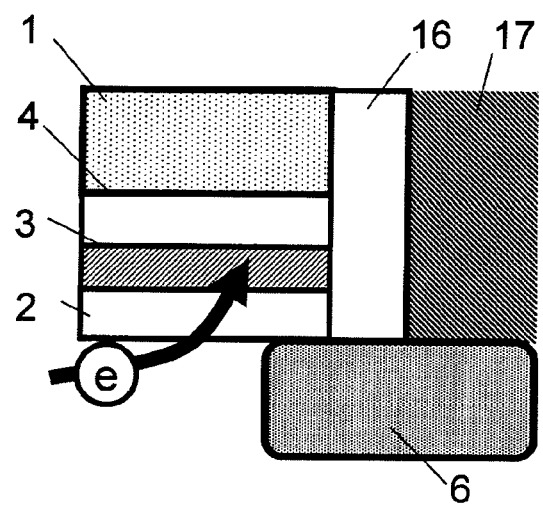
FIG. 28 is an illustration of a charge distribution in a charge accumulating layer of a related nonvolatile storage device.
Figure 28:
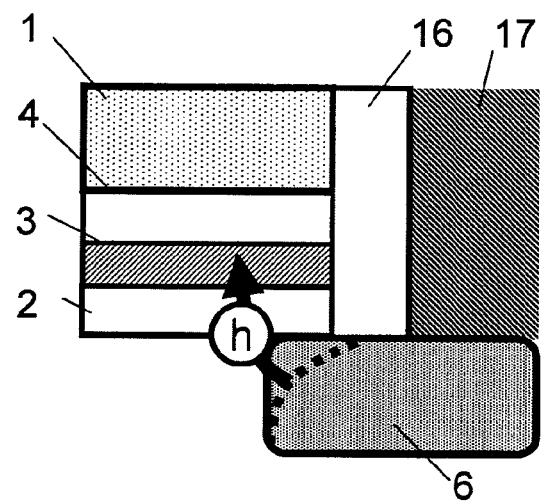
Figure 28:
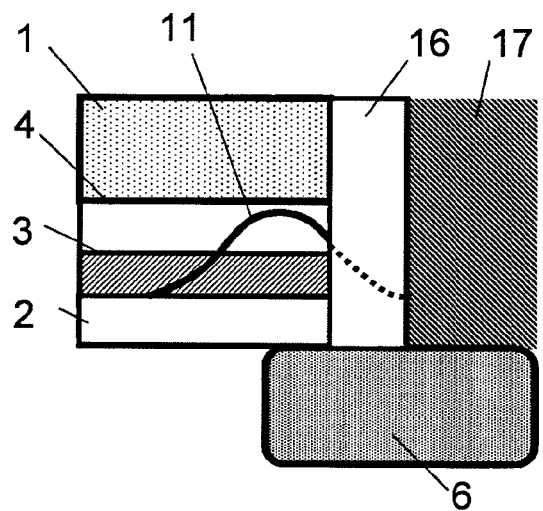
Figure 29:
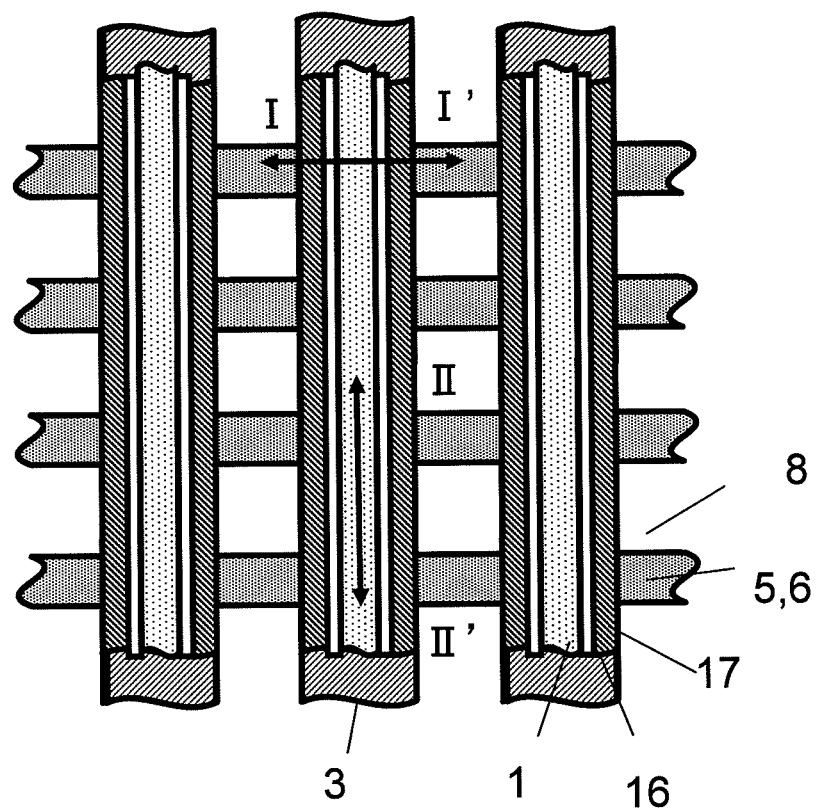
FIG. 29 is a top view illustrating one exemplary related nonvolatile storage device.
Figure 30:
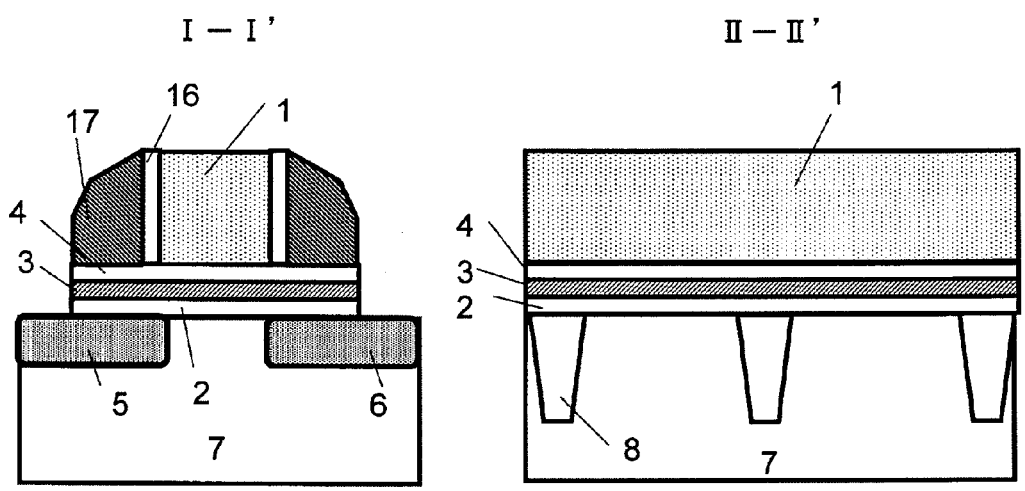
FIG. 30 is an illustration including a I-I' sectional view and a II-II' sectional view of the nonvolatile storage device illustrated in FIG. 29.
Figure 31:
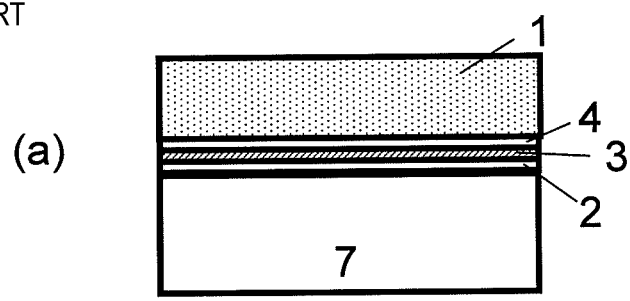
FIG. 31 includes top views illustrating one exemplary method for manufacturing the nonvolatile storage device illustrated in FIGS. 29 and 30.
Figure 31:
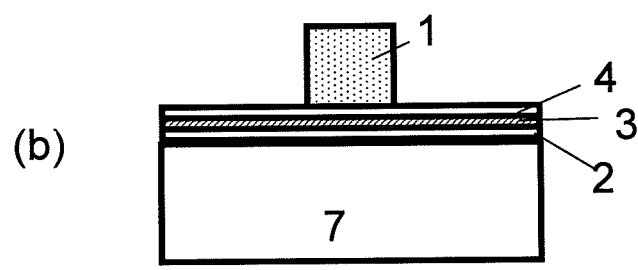
Figure 31:
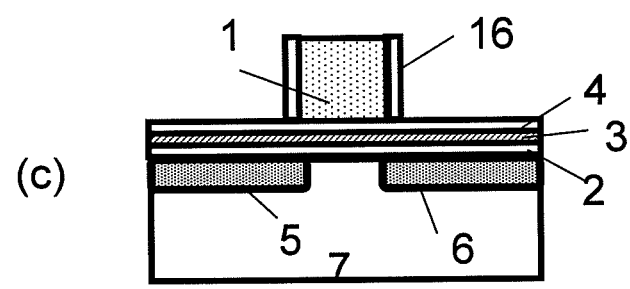
Figure 31:
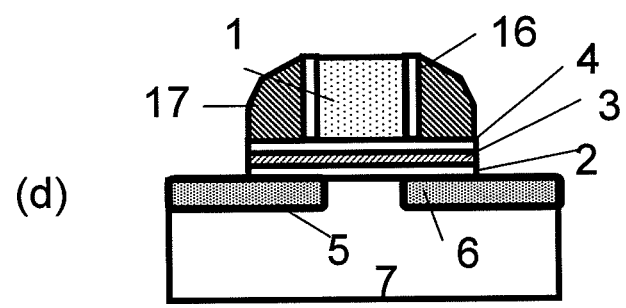
Figure 32:
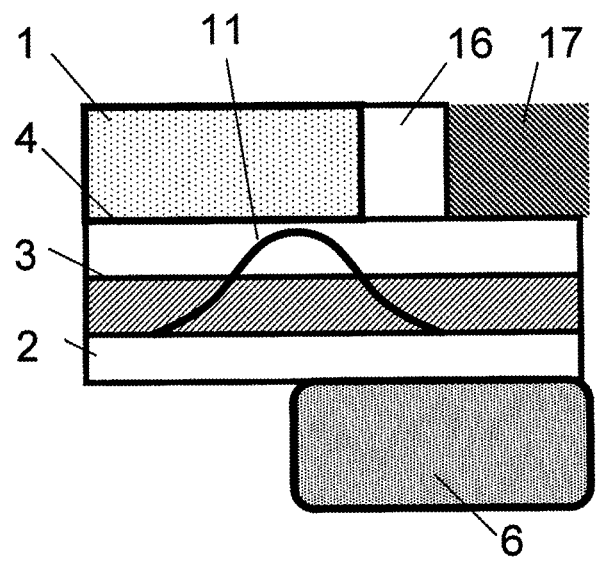
FIG. 32 is an illustration of a charge distribution in a charge accumulating layer of a related nonvolatile storage device.

Brief description will be made of a method for manufacturing the trap type memory according to the present exemplary embodiment. FIG. 24 is an illustration of the trap type memory manufacturing method according to the sixth exemplary embodiment, in sectional views corresponding to the sectional view taken along line I-I' of FIG. 23.

Initially, as shown in FIG. 24(*a*), pad oxide film (i.e., sacrificed oxidation film) 9 was formed by oxidizing the surface of p-type silicon substrate 7 in an oxygen atmosphere diluted with nitrogen. Thereafter, dummy film 10 was formed over pad oxide film 9. Here, a low-density CVD (Chemical Vapor Deposition) nitride film was used as the dummy film.

Provided that an ion implantation profile to be obtained by a later ion implantation step for forming source/drain regions conforms to a normal distribution described by central depth Rp and variance σ, it is desirable that the height of film stack 18 on each side surface of gate electrode 1 be at least (Rp+3σ) in order to avoid damage to a region around the charge accumulating layer. The height of film stack 18 on each side surface of gate electrode is determined by the sum total of the thicknesses of pad oxide film 9 and dummy film 10 and the amount of retrogradation of the upper end portion of film stack 18 formed on each side surface of gate electrode 1 caused by an etching process. Therefore, the total thickness of pad oxide film 9 and dummy film 10 is preferably preset to a value of not less than (Rp+3σ).

Thereafter, as shown in FIG. 24(*b*), a reflection preventive film and a resist film (not shown either) were deposited over dummy film 10 and then patterned by exposure and development. Thereafter, dummy film 10 and pad oxide film 9 were subjected to etching using a dry etcher to form opening portion 46 exposing a predetermined portion of the substrate. Thereafter, the reflection preventive film and the resist film were removed by a wet process.

Subsequently, as shown in FIG. 24(*c*), oxide film (i.e., tunnel insulating film material) 2 and nitride film (i.e., charge accumulating layer material) 3 were sequentially deposited over the entire wafer surface by using a CVD process. Further, oxide film (i.e., insulating film B material) 4 was formed by oxidizing an upper portion of nitride film 7 by ISSG (In Situ Steam Generation). Subsequently, phosphorus-doped silicon film (i.e., gate electrode material) 1 was deposited over oxide film 4 by using a CVD process.

Subsequently, as shown in FIG. 24(*d*), phosphorus-doped silicon film 1, oxide film 4, nitride film 3 and oxide film 2 were etched back by dry etching to form a structure comprising gate electrode 1, oxide film 4, nitride film 3 and oxide film 2 on each of sidewalls (i.e., opposite side surfaces of opening portion 46 depicted by wide lines 47) of dummy film 10. Subsequently, as shown in FIG. 24(e), oxide film (i.e., insulating film material) 14 and phosphorus-doped silicon film (i.e., word gate material) 15 were sequentially deposited over the entire wafer surface by using a CVD process. The thickness of phosphorus-doped silicon film 1 thus deposited was made larger than the total thickness of dummy film 10 and pad oxide film 9.

Subsequently, as shown in FIG. 21(f), upper portions of respective of phosphorus-doped silicon film 1, oxide film 4, nitride film 3 and oxide film 2 were removed by polishing using CMP (Chemical Mechanical Polishing) until a surface of dummy film 10 became exposed. Thereafter, as shown in FIG. 24(g), dummy film 10 and pad oxide film 9 were selectively removed by using a high selective ratio etching condition. Subsequently, as shown in FIG. 24(h), n-type impurities were vertically ion-implanted into an exposed portion of the semiconductor substrate in a manner self-aligned with gate electrode 1. Thereafter, an activation process was carried out to activate source region 5 and drain region 6 which partially overlapped (i.e., which were partially in contact with) gate electrode 1.

The manufacturing method according to the present exemplary embodiment has the following effect.
(1) Since film stack 18 on the side surfaces of gate electrode 1 functions as a spacer during ion implantation, it is possible to simplify the process.
(2) Since the step of oxidizing a sidewall for spacer, which has been conventionally required, can be eliminated, it is possible to avoid the bird's beak phenomenon which occurs at a gate electrode edge, thereby to prevent the yield from lowering due to an increase in defect density in a region around the gate electrode edge.
(3) Ion implantation damage occurs only to upper portions of film stack 18 exposed on gate electrode 1 and does not occur to the portions of the charge accumulating layer each located adjacent a respective one of drain region 6 and source region 5 and therearound. For this reason, it is possible to effectively obviate the effect of detects in the film stack caused by the ion implantation step for forming the source region and the drain region.

In the manner described above, it was possible to manufacture the nonvolatile storage device according to the sixth exemplary embodiment.

The invention claimed is:
1. A method for manufacturing a nonvolatile storage device including:
a gate electrode provided on a semiconductor substrate; and
a film stack extending from between the semiconductor substrate and the gate electrode onto at least a surface of the gate electrode lying on a first impurity diffusion region side and being in contact with a first impurity diffusion region, the film stack including a charge accumulating layer and a tunnel insulating film,
the method comprising:
(1) preparing the semiconductor substrate;
(2) forming a sacrificed oxidation film and a dummy film on the semiconductor substrate;
(3) partially removing the sacrificed oxidation film and the dummy film to form an opening portion reaching the semiconductor substrate and then to expose the semiconductor substrate in a lower portion of the opening portion;
(4) depositing a tunnel insulating film material and a charge accumulating layer material sequentially over an entire surface of the semiconductor substrate;
(5) depositing a gate electrode material over an entire surface of the charge accumulating layer material;
(6) etching back the tunnel insulating film material, the charge accumulating layer material and the gate electrode material, to leave the tunnel insulating film material, the charge accumulating layer material and the gate electrode material on each of side surfaces of the opening portion opposed to each other, thereby forming the gate electrode, and the film stack extending from between the gate electrode and the semiconductor substrate into between a side surface of the gate electrode and one of the side surfaces of the opening portion and including the tunnel insulating film and the charge accumulating layer;
(7) removing the sacrificed oxidation film and the dummy film; and
(8) forming the first impurity diffusion region in the semiconductor substrate on a side of the side surface of the gate electrode formed with the film stack thereon in such manner that the first impurity diffusion region comes into contact with a portion of the film stack, and forming a second impurity diffusion region in the semiconductor substrate on a side opposed to the first impurity diffusion region and sandwiching the gate electrode;
wherein between the steps (6) and (7), the method further comprises:
(9) depositing an insulating film material having a lower charge trap surface density than the charge accumulating layer material and a word gate material sequentially over an entire surface of the semiconductor substrate; and
(10) etching back the insulating film material and the word gate material, to leave the insulating film material and the word gate material on a side surface A of the gate electrode opposite to the side surface of the gate electrode provided with the film stack thereon, thereby forming a word gate on the side surface A and an insulating film extending from between the word gate and the semiconductor substrate into between a side surface of the word gate and the side surface A of the gate electrode,
wherein in the step (8), the first and second impurity diffusion regions are formed in the semiconductor substrate so as to sandwich the gate electrode and the word gate therebetween.

2. A method for manufacturing a nonvolatile storage device including:
a gate electrode provided on a semiconductor substrate; and
a film stack extending from between the semiconductor substrate and the gate electrode onto at least a surface of the gate electrode lying on a first impurity diffusion region side and being in contact with a first impurity diffusion region the film stack including a charge accumulating layer and a tunnel insulating film,
the method comprising:
(1) preparing the semiconductor substrate;
(2) forming a sacrificed oxidation film and a dummy film on the semiconductor substrate;
(3) partially removing the sacrificed oxidation film and the dummy film to form an opening portion reaching the semiconductor substrate and then to expose the semiconductor substrate in a lower portion of the opening portion;

(4) depositing a tunnel insulating film material and a charge accumulating layer material sequentially over an entire surface of the semiconductor substrate;
(5) depositing a gate electrode material over an entire surface of the charge accumulating layer material;
(6) etching back the tunnel insulating film material, the charge accumulating layer material and the gate electrode material, to leave the tunnel insulating film material, the charge accumulating layer material and the gate electrode material on each of side surfaces of the opening portion opposed to each other, thereby forming the gate electrode, and the film stack extending from between the gate electrode and the semiconductor substrate into between a side surface of the gate electrode and one of the side surfaces of the opening portion and including the tunnel insulating film and the charge accumulating layer;
(7) removing the sacrificed oxidation film and the dummy film; and
(8) forming the first impurity diffusion region in the semiconductor substrate on a side of the side surface of the gate electrode formed with the film stack thereon in such manner that the first impurity diffusion region comes into contact with a portion of the film stack, and forming a second impurity diffusion region in the semiconductor substrate on a side opposed to the first impurity diffusion region and sandwiching the gate electrode;
wherein between the steps (4) and (5), the method further comprises:
turning a portion of the tunnel insulating film material and a portion of the charge accumulating layer material formed on a bottom surface of the opening portion into an insulating film A by lowering a charge trap surface density thereof throughout in a thickness direction thereof,
wherein in the step (6), the insulating film A is etched back, together with etching back of the tunnel insulating film material, the charge accumulating layer material and the gate electrode material in such manner as to leave at least a portion of the insulating film A on the bottom surface of the opening portion.

3. A method for manufacturing a nonvolatile storage device including:
a gate electrode provided on a semiconductor substrate; and
a film stack extending from between the semiconductor substrate and the gate electrode onto at least a surface of the gate electrode lying on a first impurity diffusion region side and being in contact with a first impurity diffusion region, the film stack including a charge accumulating layer and a tunnel insulating film,
the method comprising:
(1) preparing the semiconductor substrate;
(2) forming a sacrificed oxidation film and a dummy film on the semiconductor substrate;
(3) partially removing the sacrificed oxidation film and the dummy film to form an opening portion reaching the semiconductor substrate and then to expose the semiconductor substrate in a lower portion of the opening portion;
(4) depositing a tunnel insulating film material and a charge accumulating layer material sequentially over an entire surface of the semiconductor substrate;
(5) depositing a gate electrode material over an entire surface of the charge accumulating layer material;
(6) etching back the tunnel insulating film material, the charge accumulating layer material and the gate electrode material, to leave the tunnel insulating film material, the charge accumulating layer material and the gate electrode material on each of side surfaces of the opening portion opposed to each other, thereby forming the gate electrode, and the film stack extending from between the gate electrode and the semiconductor substrate into between a side surface of the gate electrode and one of the side surfaces of the opening portion and including the tunnel insulating film and the charge accumulating layer;
(7) removing the sacrificed oxidation film and the dummy film; and
(8) forming the first impurity diffusion region in the semiconductor substrate on a side of the side surface of the gate electrode formed with the film stack thereon in such manner that the first impurity diffusion region comes into contact with a portion of the film stack, and forming a second impurity diffusion region in the semiconductor substrate on a side opposed to the first impurity diffusion region and sandwiching the gate electrode, wherein between the steps (6) and (7), the method further comprises:
(9) depositing an insulating film material having a lower charge trap surface density than the charge accumulating layer material and a word gate material sequentially over an entire surface of the semiconductor substrate; and
(10) etching back the insulating film material and the word gate material, to leave the insulating film material and the word gate material on a side surface A of the gate electrode opposite to the side surface of the gate electrode provided with the film stack thereon, thereby forming a word gate on the side surface A and an insulating film extending from between the word gate and the semiconductor substrate into between a side surface of the word gate and the side surface A of the gate electrode,
wherein in the step (8), the first and second impurity diffusion regions are formed in the semiconductor substrate so as to sandwich the gate electrode and the word gate therebetween,
and wherein between the steps (4) and (5), the method further comprises:
turning a portion of the tunnel insulating film material and a portion of the charge accumulating layer material formed on a bottom surface of the opening portion into an insulating film A by lowering a charge trap surface density thereof throughout in a thickness direction thereof,
wherein in the step (6), the insulating film A is etched back, together with etching back of the tunnel insulating film material, the charge accumulating layer material and the gate electrode material in such a manner as to leave at least a portion of the insulating film A on the bottom surface of the opening portion.

* * * * *